(12) United States Patent
Zaloom

(10) Patent No.: US 9,506,281 B1
(45) Date of Patent: *Nov. 29, 2016

(54) COMPACT BIPOSITIONAL LATERAL EDGE LOCKING LOAD BEARING ROTATION LOCK MECHANISM

(71) Applicant: Joseph Zaloom, Falls Church, VA (US)

(72) Inventor: Joseph Zaloom, Falls Church, VA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/874,713

(22) Filed: Oct. 5, 2015

Related U.S. Application Data

(63) Continuation-in-part of application No. 14/488,054, filed on Sep. 16, 2014, which is a continuation-in-part of application No. 14/255,711, filed on Apr. 17, 2014.

(60) Provisional application No. 62/064,216, filed on Oct.

(Continued)

(51) Int. Cl.
*E05D 11/10* (2006.01)
*E05D 3/02* (2006.01)
*H05K 5/02* (2006.01)

(52) U.S. Cl.
CPC ......... *E05D 11/1028* (2013.01); *E05D 3/022* (2013.01); *E05D 11/1007* (2013.01); *H05K 5/0226* (2013.01); *H05K 5/0234* (2013.01); *E05D 2011/1035* (2013.01)

(58) Field of Classification Search
CPC ............... E05D 11/1007; E05D 11/1078; E05D 11/1028; E05D 3/02; Y10T 16/540247; Y10T 16/540254; Y10T 16/540255; G06F 1/1616; G06F 1/1681; H05K 5/0226
See application file for complete search history.

(56) References Cited

U.S. PATENT DOCUMENTS

| 104,294 A | * | 6/1870 | Fischer et al. ...... E05D 11/1007 16/353 |
| 872,650 A | * | 12/1907 | Gilroy ................. E05D 11/1007 16/330 |

(Continued)

FOREIGN PATENT DOCUMENTS

KR WO 2011065624 A1 * 6/2011 ......... E05D 11/1007

OTHER PUBLICATIONS

"Computer Components & Imaging Supplies", Crimson Imaging Supplies, Mar. 15, 2013, two pages.

(Continued)

*Primary Examiner* — Victor Batson
*Assistant Examiner* — Matthew Sullivan
(74) *Attorney, Agent, or Firm* — Nixon & Vanderhye P.C.

(57) ABSTRACT

A load bearing rotation lock mechanism including disks or cylinders with teeth or a combination of both that interlock radially between their inner and outer surface areas, or frontal areas, or both, where one of the disks or cylinders is attached to a fixed surface area and the other disk or cylinder is attached to a pivoting arm, plate, or other kind of load bearing support element, and where one of the disks or cylinders is able to mesh (lock) and un-mesh (unlock) from the other disk or cylinder by protruding, retracting, or sliding laterally over a common, continuous or divided axis, shaft, or channel thereby freezing the angular position of the pivoting arm, plate, or other kind of load bearing support element with respect to the fixed surface area at the time the disks, cylinders, or a combination of both, mesh (lock) with each other and unfreezing the pivoting arm, plate, or other kind of load bearing support element to pivot freely with respect to the fixed surface area when the disks, cylinders, or combination of both un-mesh (unlock) from one another.

7 Claims, 76 Drawing Sheets

Related U.S. Application Data 15, 2014, provisional application No. 62/060,353, filed on Oct. 6, 2014, provisional application No. 62/211,085, filed on Aug. 28, 2015, provisional application No. 61/906,878, filed on Nov. 20, 2013, provisional application No. 61/878,491, filed on Sep. 16, 2013, provisional application No. 61/813,893, filed on Apr. 19, 2013.

(56) References Cited

U.S. PATENT DOCUMENTS

| | | | |
|---|---|---|---|
| 1,166,702 A * | 1/1916 | Mardon et al. | E05D 11/1078 16/329 |
| 2,101,500 A | 12/1937 | Jagus | |
| 3,744,085 A | 7/1973 | Griego | |
| 4,436,271 A | 3/1984 | Manso | |
| 5,020,763 A | 6/1991 | Hegarty | |
| 5,058,848 A | 10/1991 | Ferraro | |
| 5,060,904 A | 10/1991 | Hegarty | |
| 5,074,164 A | 12/1991 | Sheu | |
| 5,100,098 A | 3/1992 | Hawkins | |
| 5,168,601 A | 12/1992 | Liu | |
| 5,933,996 A | 8/1999 | Chang | |
| 6,367,760 B1 | 4/2002 | Pagano | |
| 6,983,514 B2 | 1/2006 | Lu et al. | |
| 7,083,155 B1 | 8/2006 | Smartt | |
| 7,188,818 B2 | 3/2007 | Chang | |
| 7,546,996 B2 | 6/2009 | Somji | |
| 7,568,915 B1 | 8/2009 | Lavoie | |
| 7,581,290 B2 | 9/2009 | Chang | |
| 7,591,604 B2 | 9/2009 | Roberts | |
| 7,611,117 B1 | 11/2009 | Lang, Jr. | |
| 7,712,719 B2 | 5/2010 | Derry et al. | |
| 7,770,862 B2 | 8/2010 | Chen | |
| 7,836,623 B2 | 11/2010 | Wang et al. | |
| 8,038,116 B2 | 10/2011 | Lee et al. | |
| 8,118,274 B2 | 2/2012 | McClure et al. | |
| D672,783 S | 12/2012 | Robinson | |
| 8,382,059 B2 | 2/2013 | LeGette et al. | |
| 8,387,930 B2 | 3/2013 | Drew et al. | |
| 8,833,716 B2 | 9/2014 | Funk et al. | |
| 9,273,503 B2 * | 3/2016 | Van Gennep | E05D 11/1007 |
| 2004/0007649 A1 | 1/2004 | Vettraino | |
| 2005/0155183 A1 | 7/2005 | Lu et al. | |
| 2006/0084585 A1 | 4/2006 | Lin | |
| 2006/0137491 A1 | 6/2006 | Chen | |
| 2006/0175484 A1 | 8/2006 | Wood, III et al. | |
| 2008/0109993 A1 * | 5/2008 | Myeong | G06F 1/1679 16/277 |
| 2008/0156836 A1 | 7/2008 | Wadsworth et al. | |
| 2011/0094058 A1 | 4/2011 | Van Gennep | |
| 2012/0074272 A1 | 3/2012 | Hull | |
| 2012/0111881 A1 | 5/2012 | Gaddis, II et al. | |
| 2012/0126088 A1 | 5/2012 | Whittaker et al. | |
| 2012/0326003 A1 | 12/2012 | Solow et al. | |
| 2013/0092805 A1 | 4/2013 | Funk et al. | |
| 2013/0092811 A1 | 4/2013 | Funk et al. | |
| 2013/0233984 A1 | 9/2013 | Huang | |
| 2013/0256478 A1 | 10/2013 | Reda et al. | |
| 2013/0277520 A1 | 10/2013 | Funk et al. | |
| 2014/0054426 A1 | 2/2014 | Burns | |
| 2014/0063750 A1 | 3/2014 | Mau et al. | |
| 2014/0116230 A1 | 5/2014 | Nakata et al. | |
| 2014/0259532 A1 * | 9/2014 | Millard | E05D 11/1028 16/326 |
| 2014/0328020 A1 | 11/2014 | Galant | |
| 2014/0346311 A1 | 11/2014 | Derman | |

OTHER PUBLICATIONS

"Ipad/Tablet Holding Products—Galaxy Tab Stand, Ipad Leg Strap, Nook Holder @ Hand e Holder", www.handholder.com, Mar. 15, 2013, four pages.

"HandyShell for iPad, iPad Cases & Covers/SpeckProducts", Mar. 15, 2013, two pages.

Detachable Metal Stand for iPad, Cell Phone, Smartphone, Tablet Accessories/iKross, Mar. 15, 2013, two pages.

"Life-Phorm All-in-One Positioning Device for iPad 3, iPad 4, Tablets, Smartphones and Cameras (000LIF)", Amazon.com: Life-Phorm All-in-One Positioning Device for iPad 3, iPad 4, Tablets, Smartphones and Cameras (000LIF): Computers & Accessories, Apr. 18, 2013, four pages.

"Stabile Coil PRO—Flexible Gooseneck Coil Based Pivoting iPad Stand—iPad 4g, 3g, iPad 2 and 1g", Stabile Coil PRO Flexible Gooseneck Coil Pivoting iPad 4g, 3g, iPad 2 and iPad Stand Holder, Apr. 18, 2013, four pages.

"Buzz / ZeroChromaZeroChroma", Mar. 15, 2013, twelve pages.

* cited by examiner

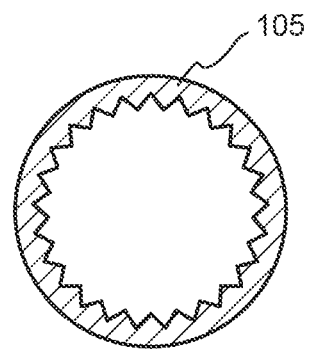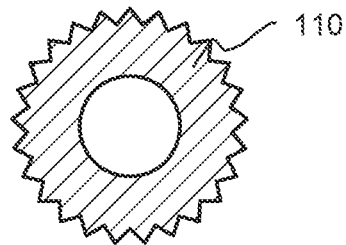
FIG. 1A    FIG. 1B
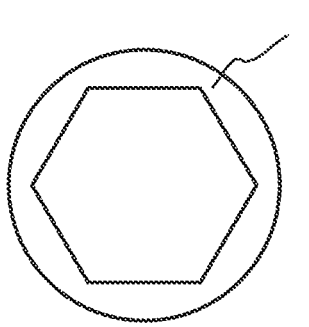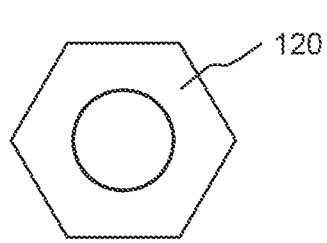
FIG. 2A    FIG. 2B

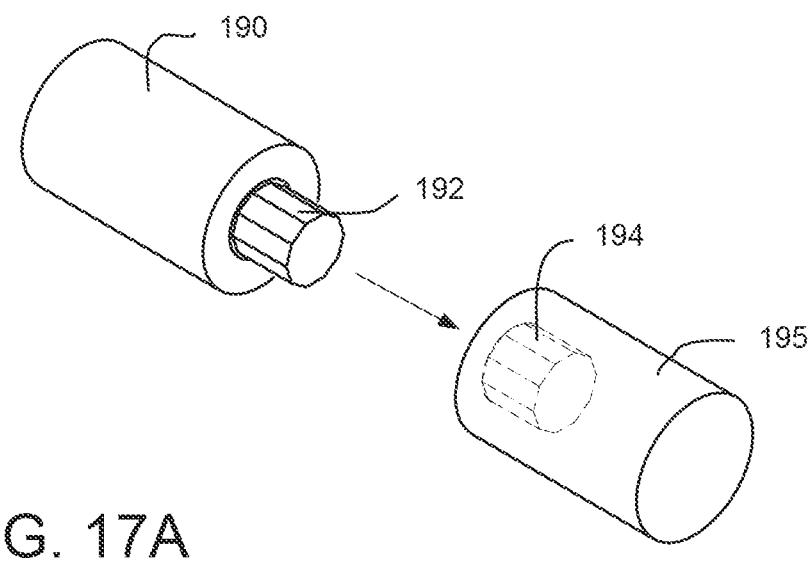
FIG. 17A
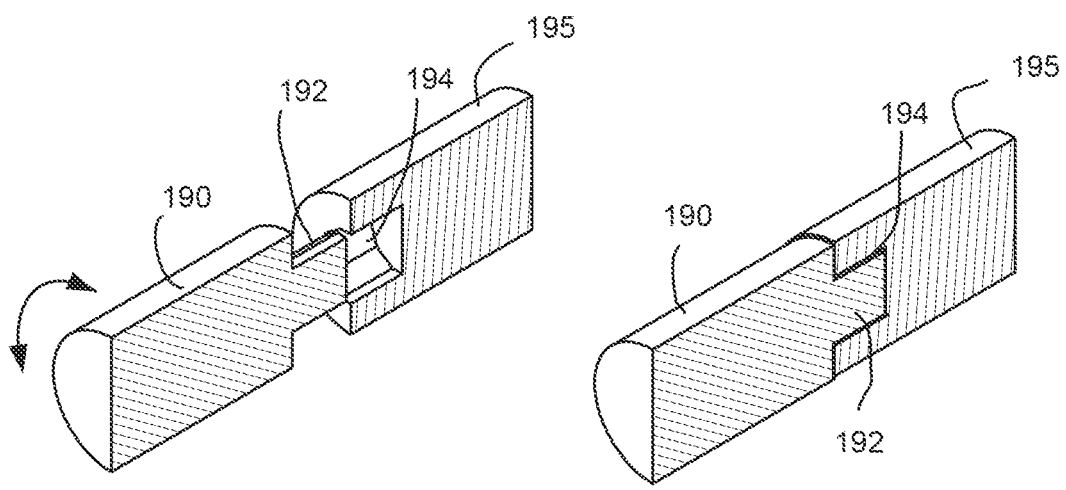
FIG. 17B
FIG. 17C

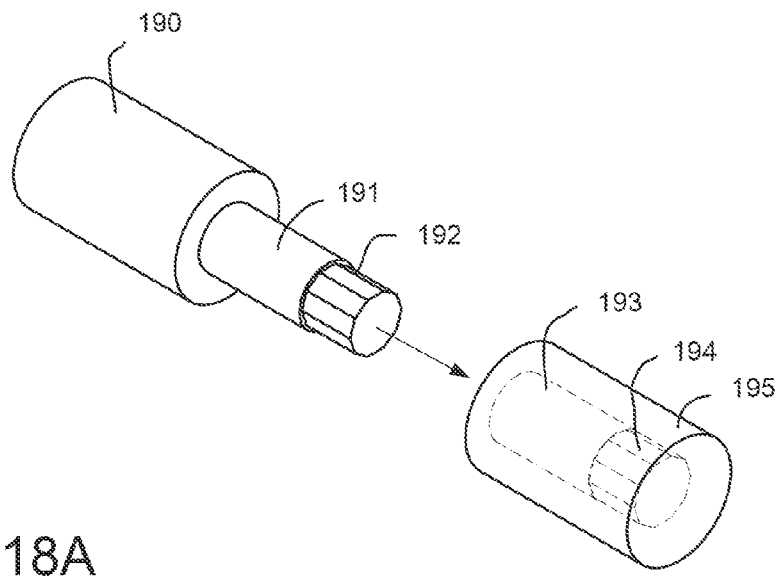
FIG. 18A
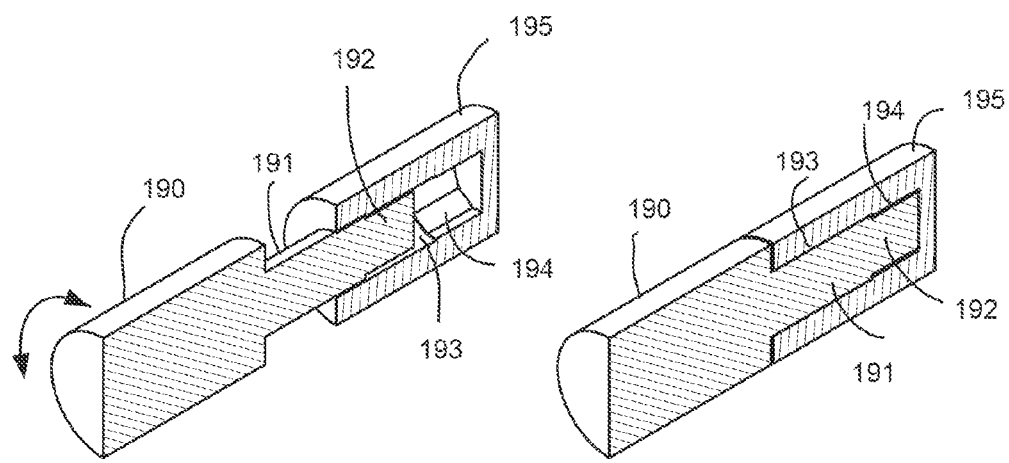
FIG. 18B
FIG. 18C

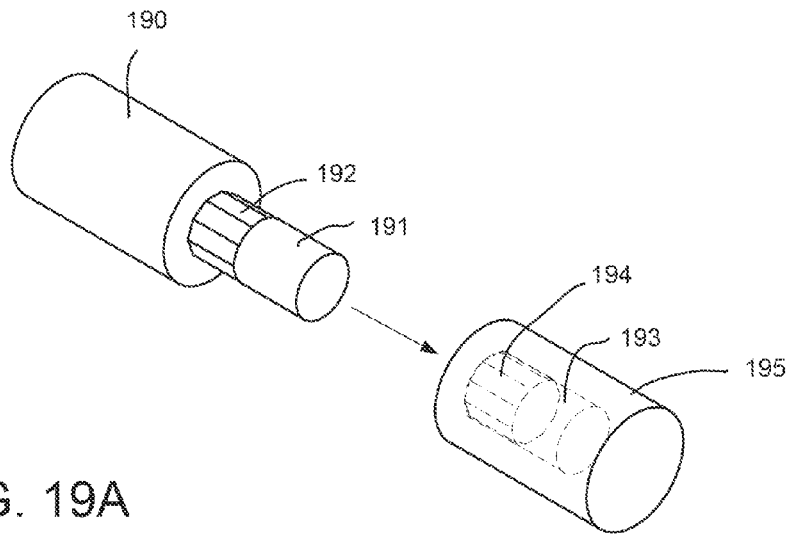
FIG. 19A
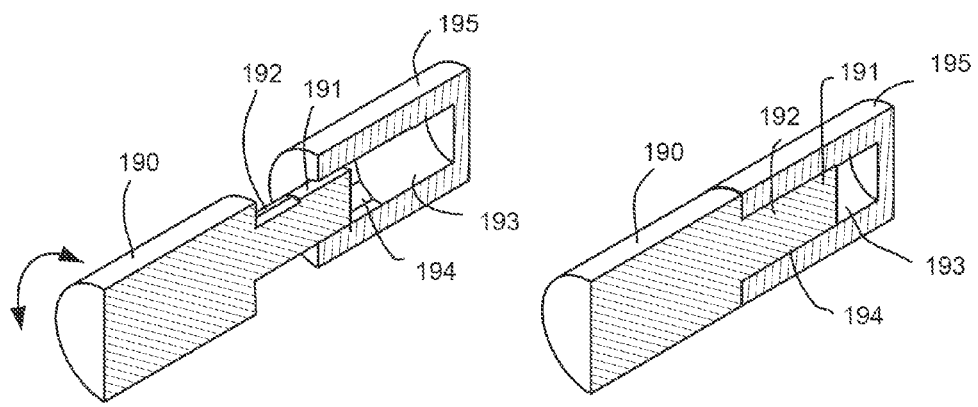
FIG. 19B
FIG. 19C

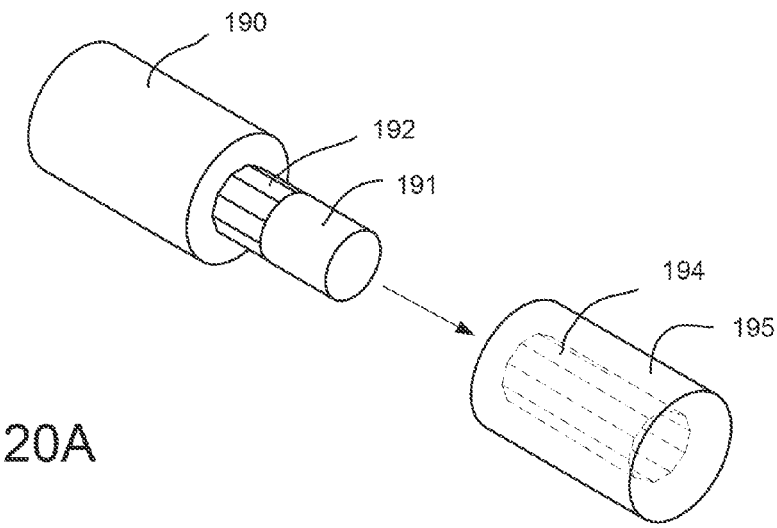
FIG. 20A
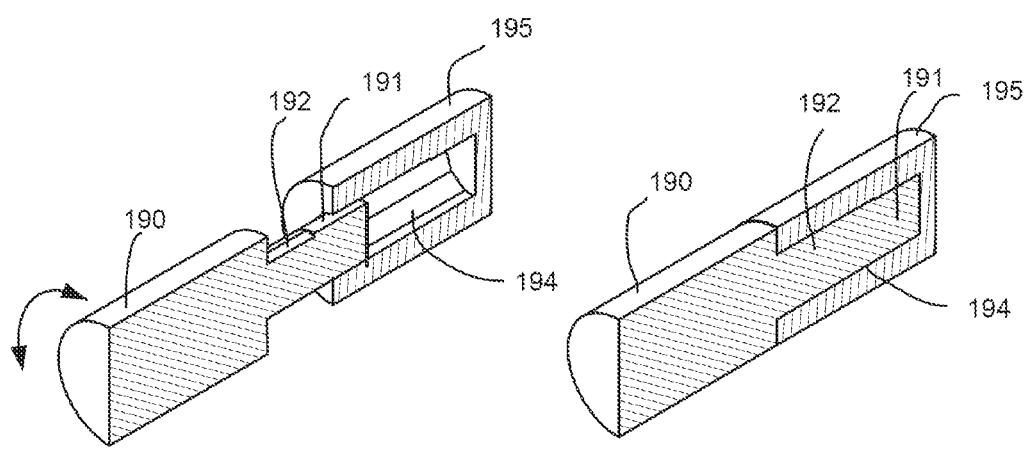
FIG. 20B
FIG. 20C

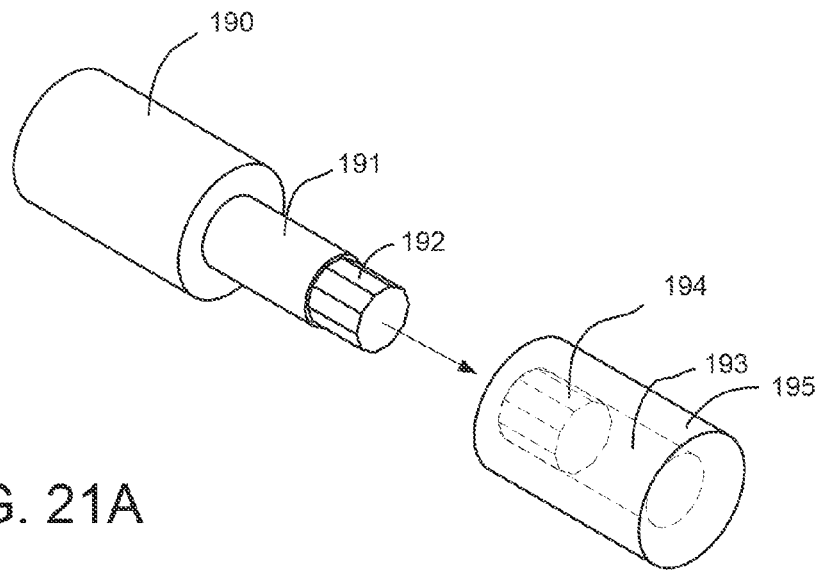
FIG. 21A
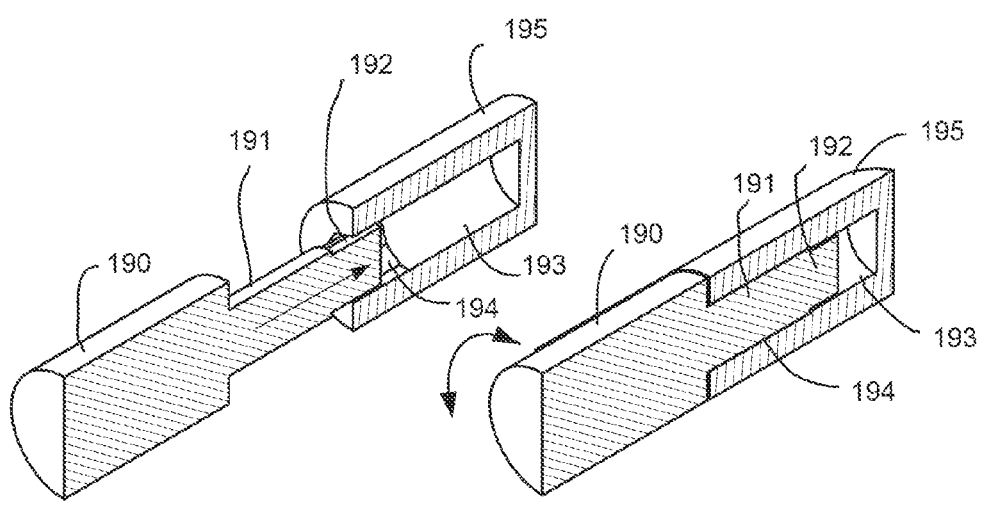
FIG. 21B
FIG. 21C

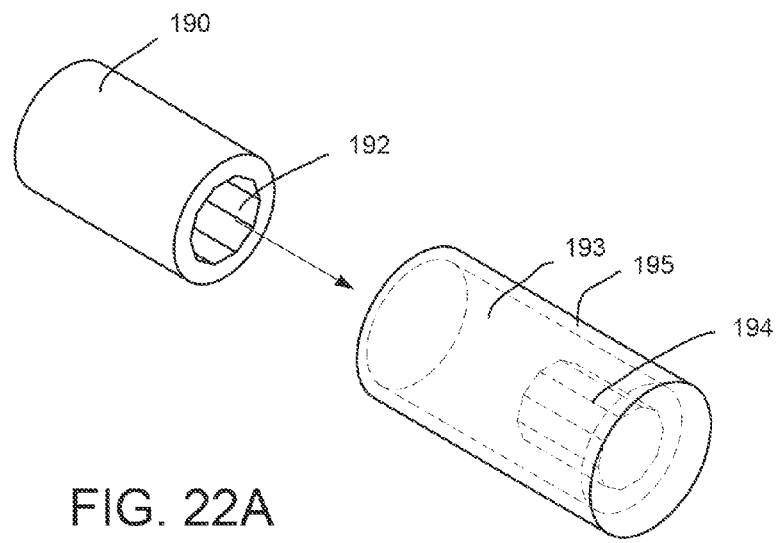
FIG. 22A
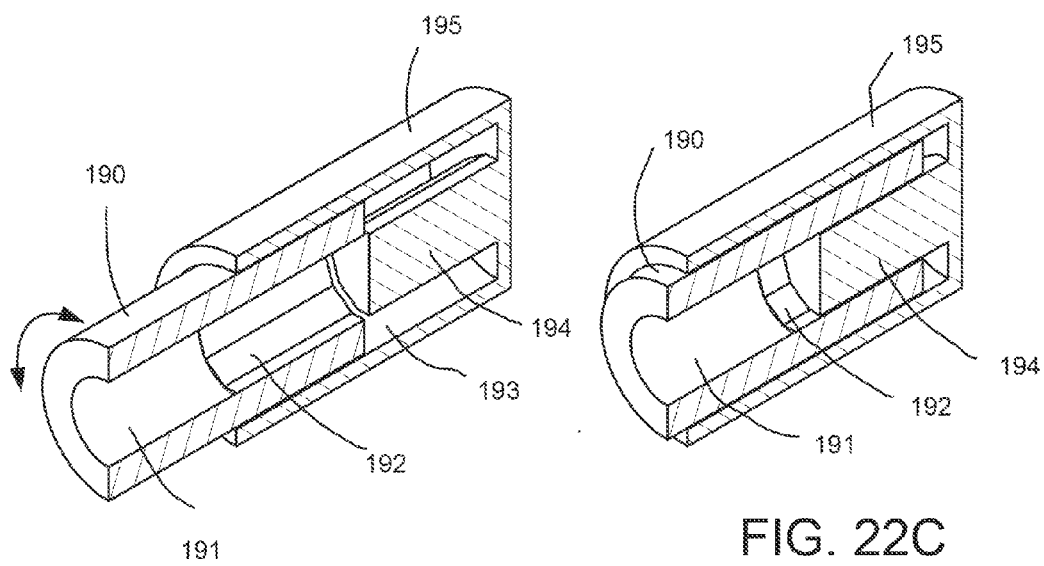
FIG. 22B
FIG. 22C

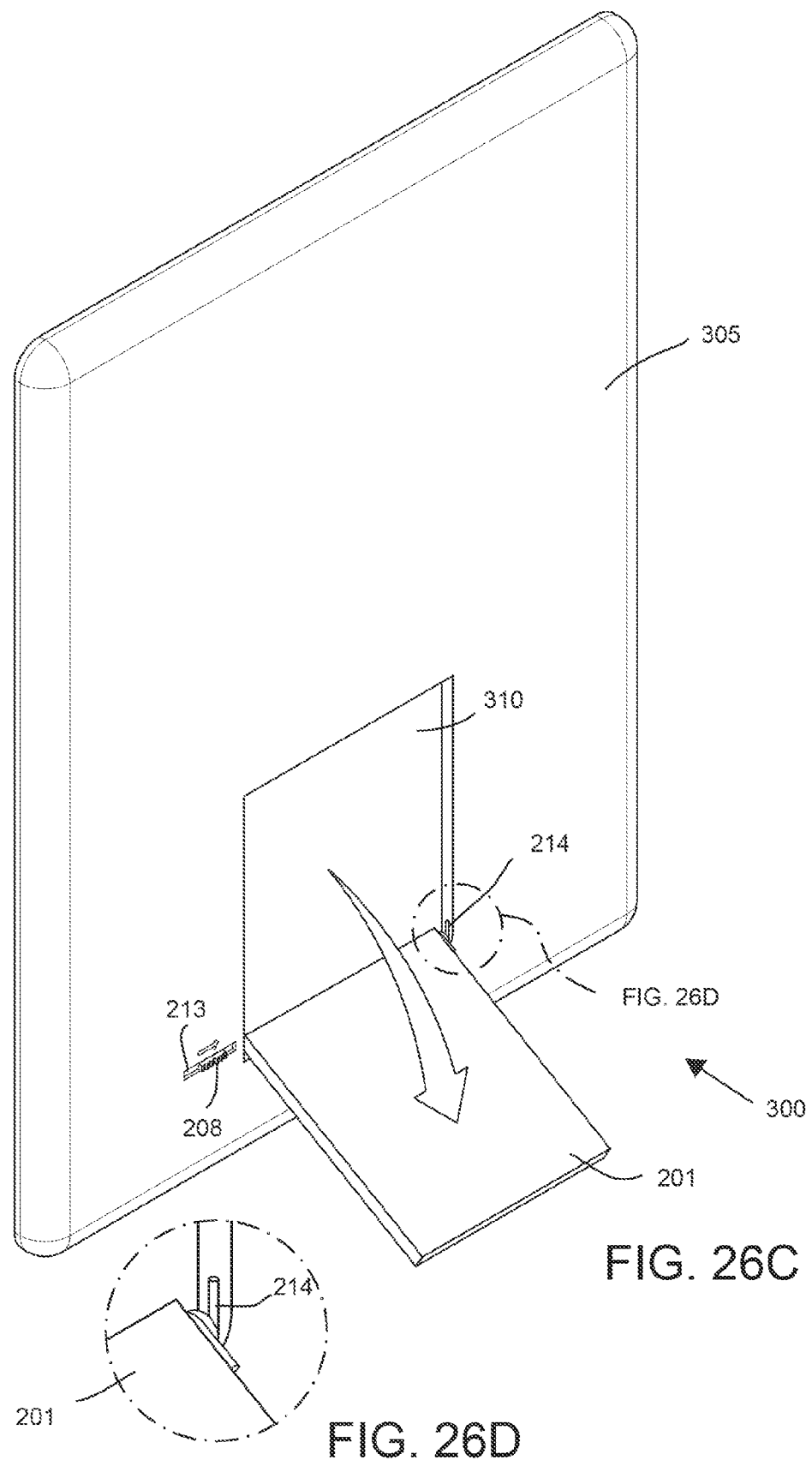

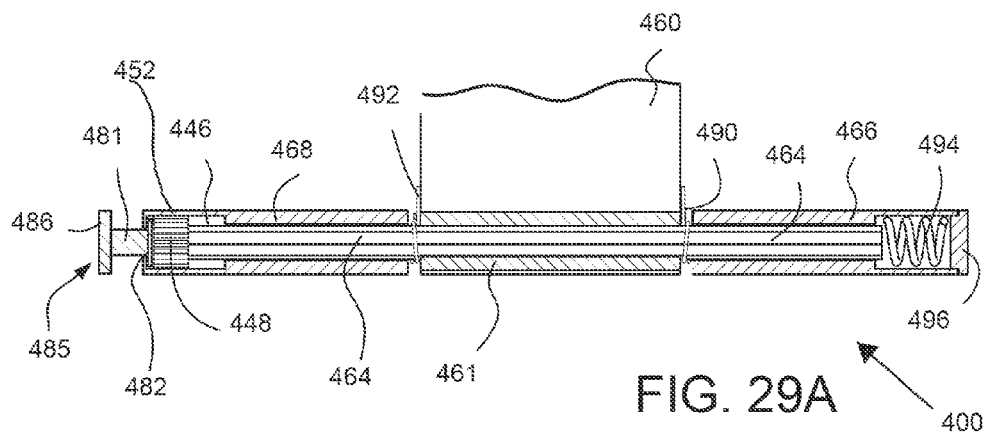
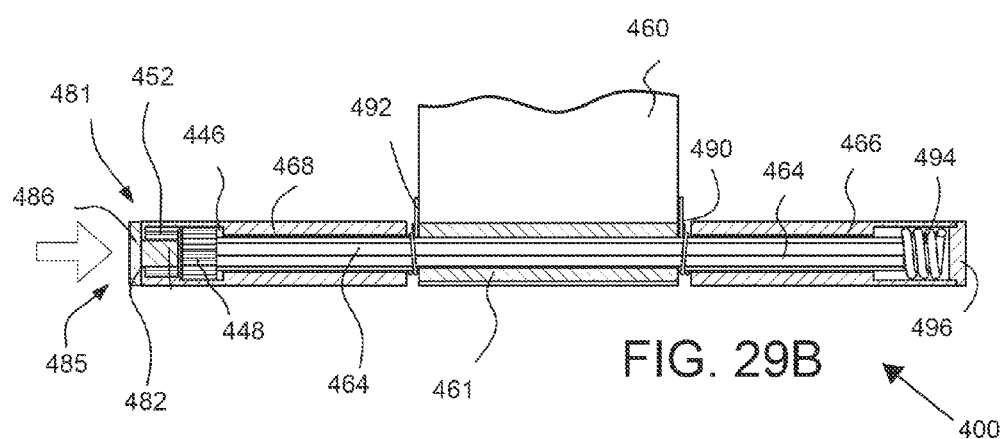
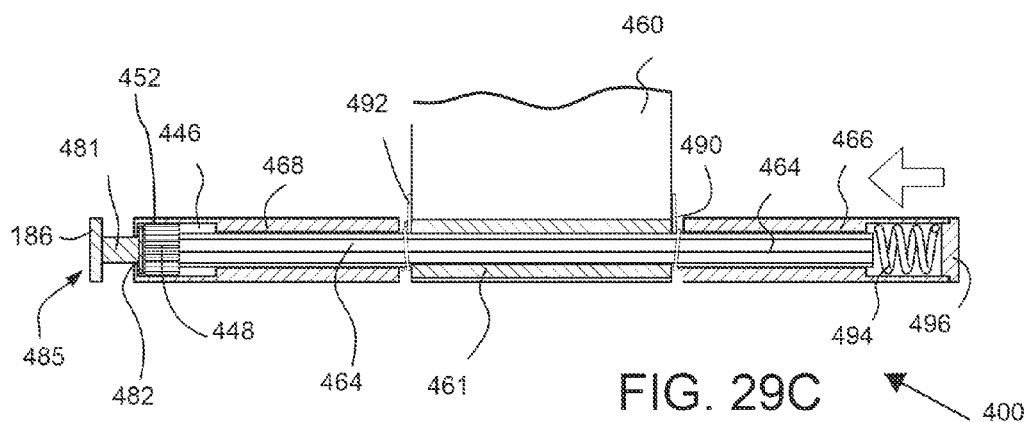

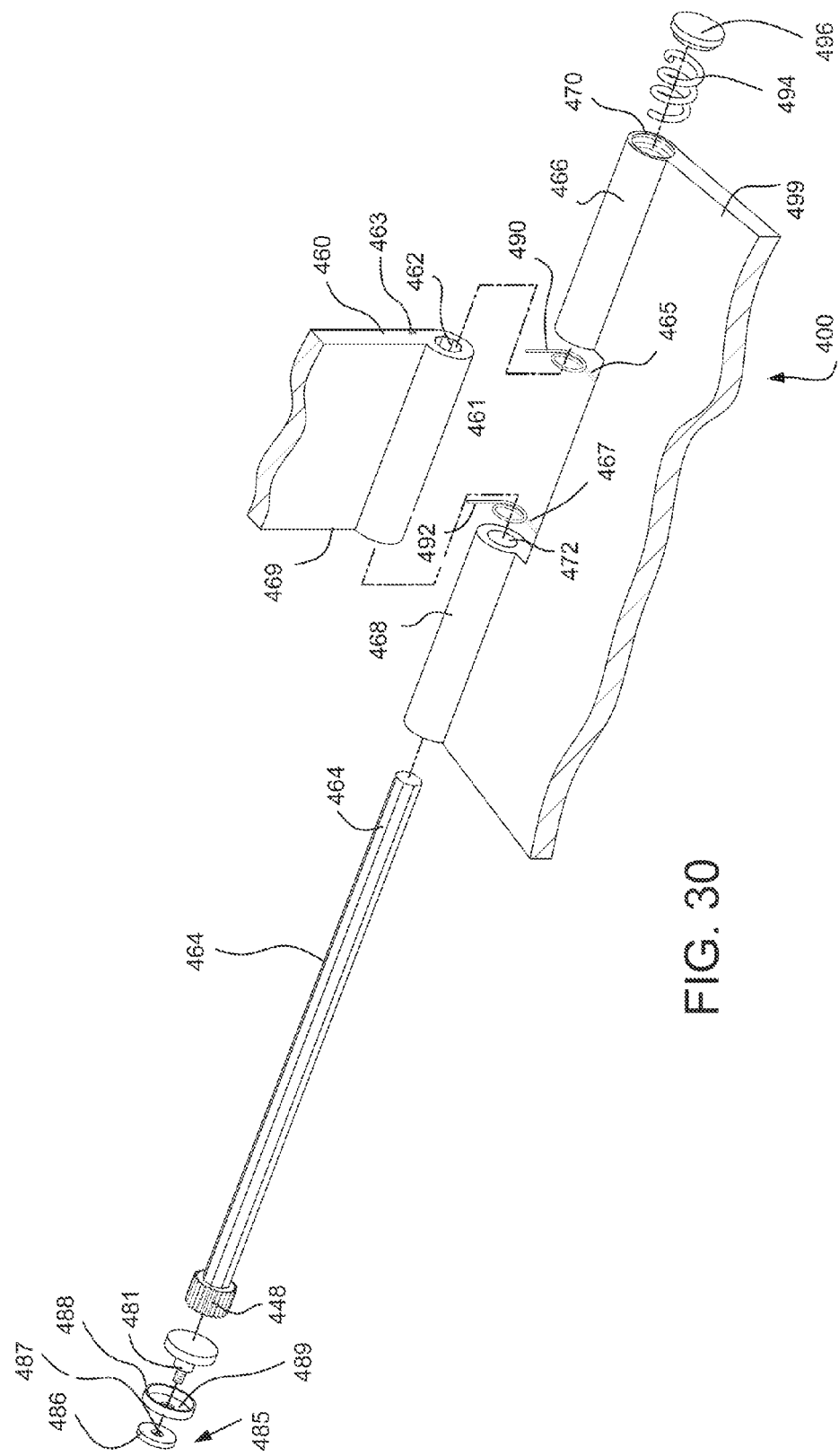

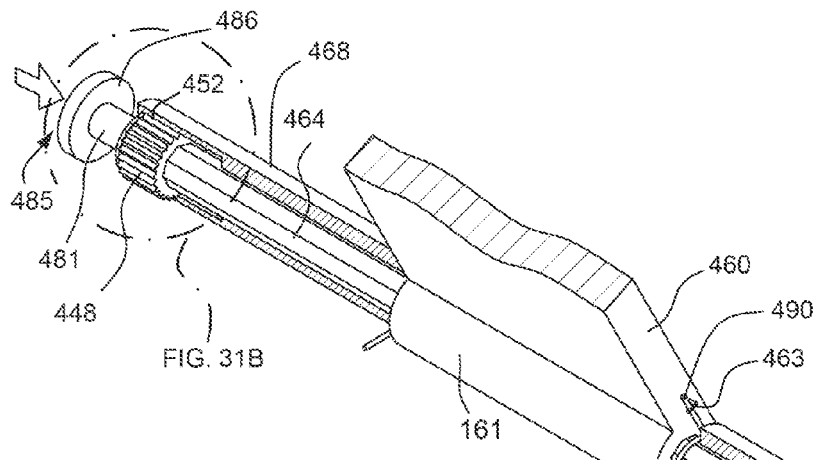
FIG. 32A
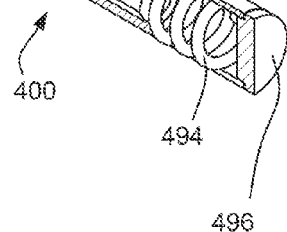
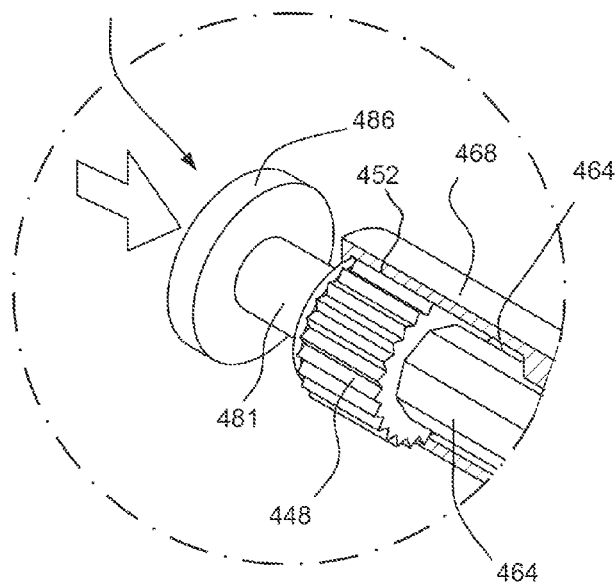
FIG. 32B
(Push Button In)

(Push Button In)

(Push Button In)

(Push Button In)

(Rotate)

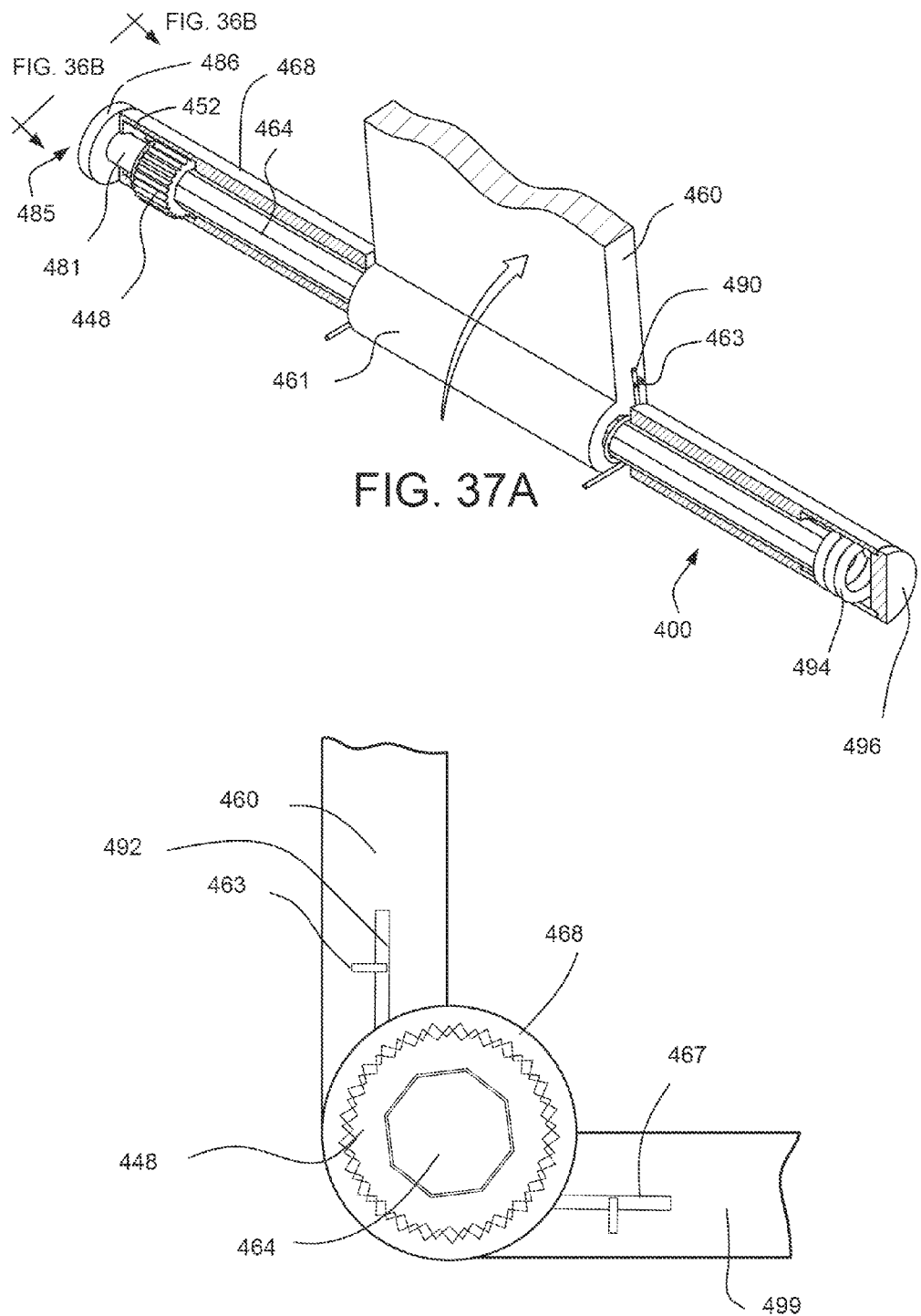

(Rotate More)

(Rotate)

(Release Button)

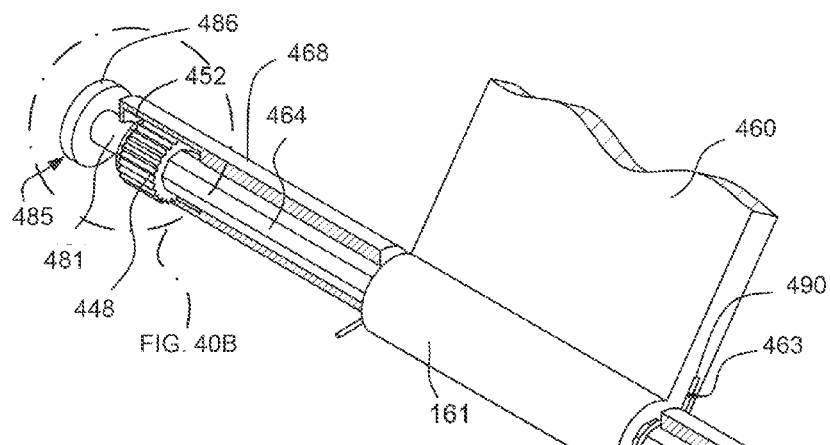
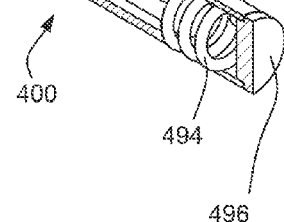
FIG. 41A
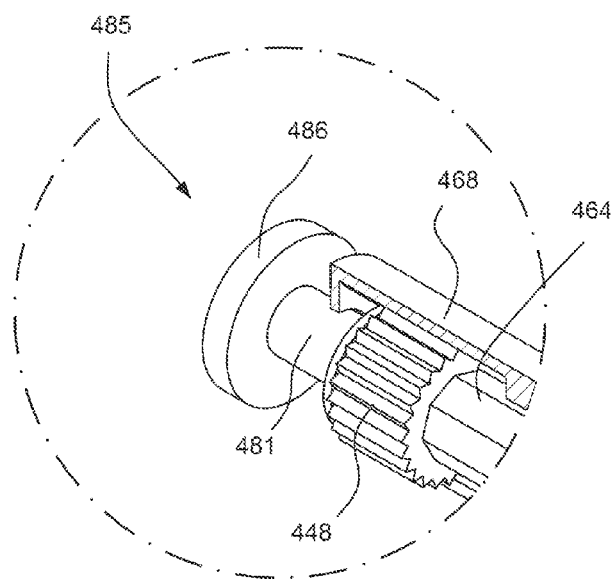
FIG. 41B
(Release Button)

(Release Button)

(Release Button)

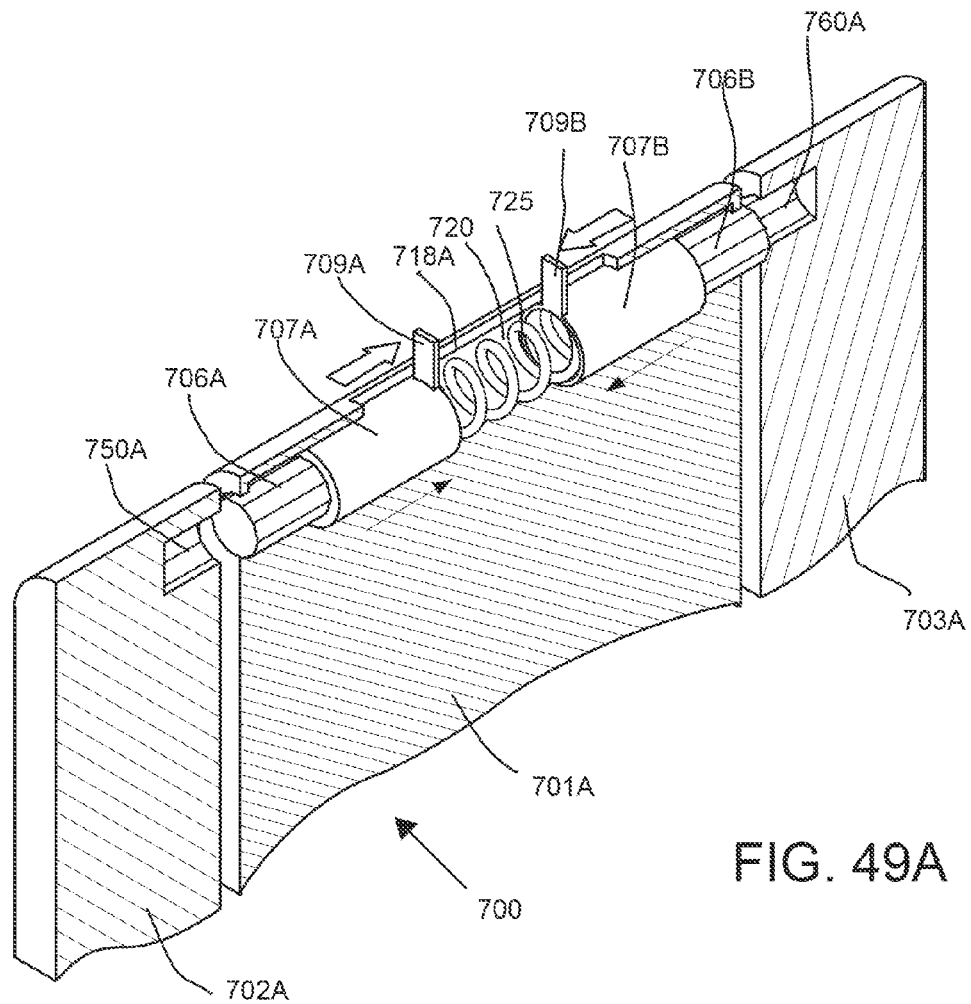
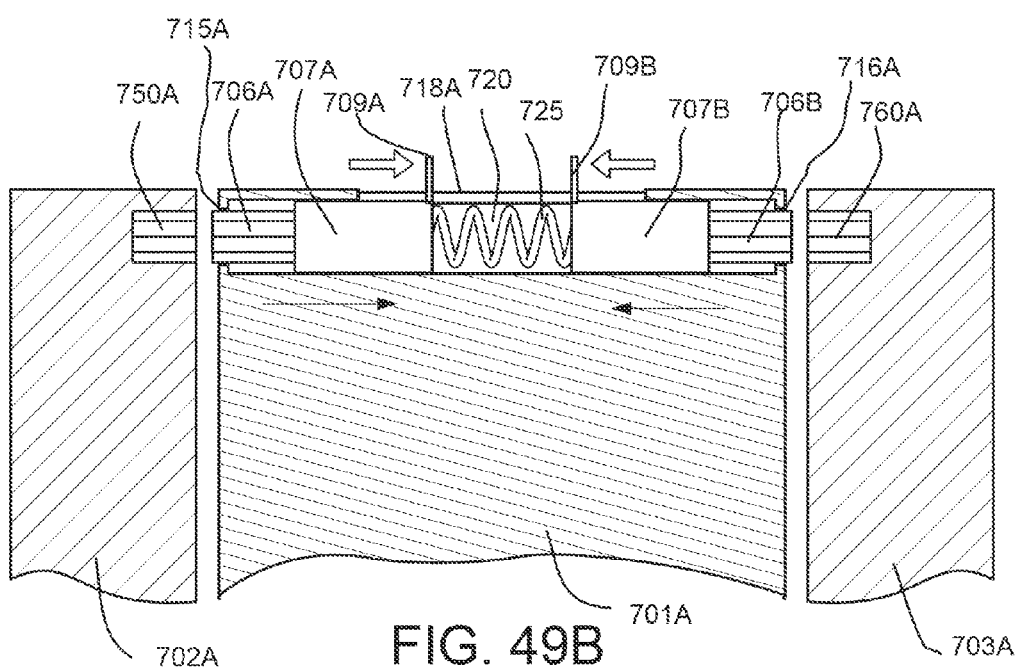

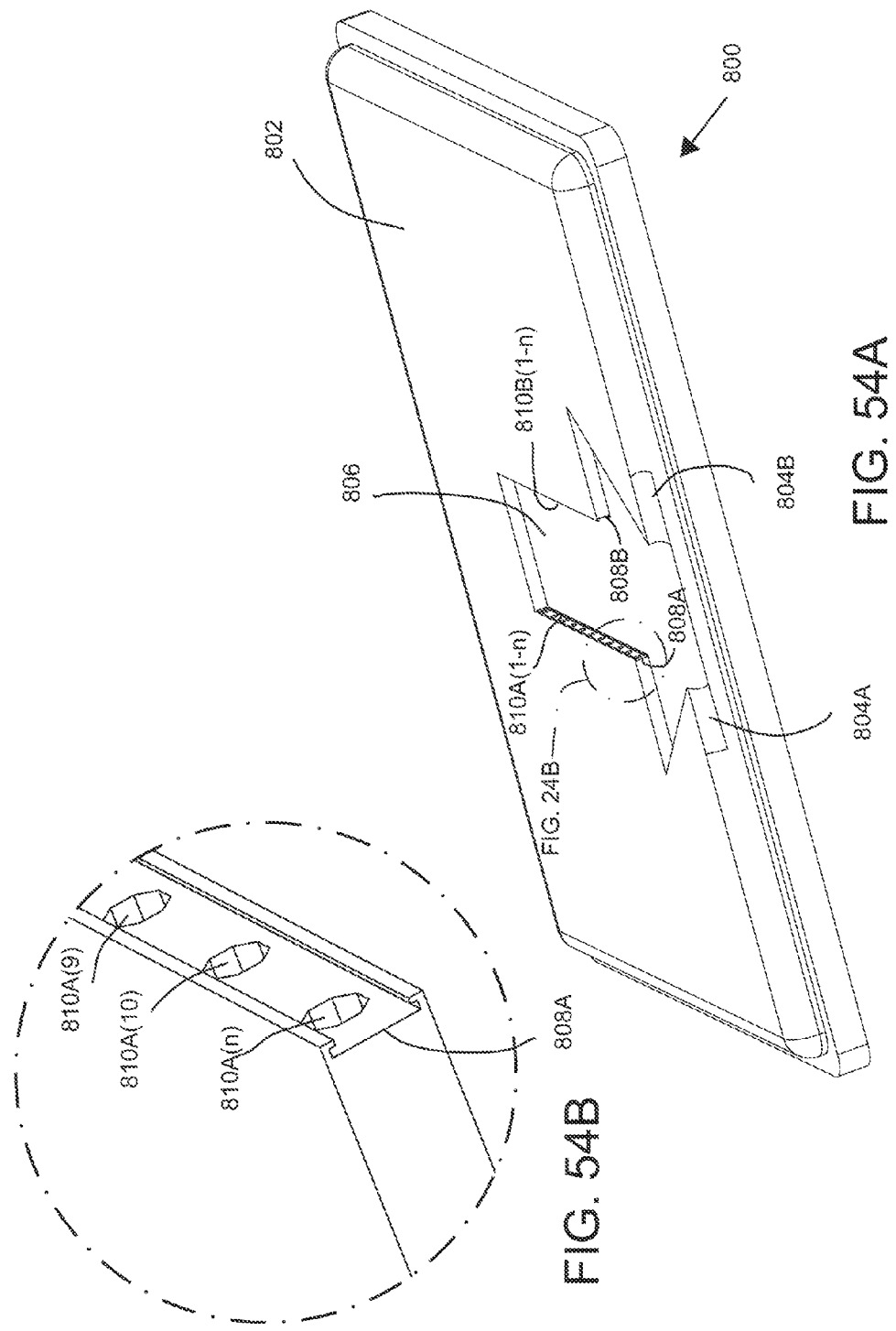

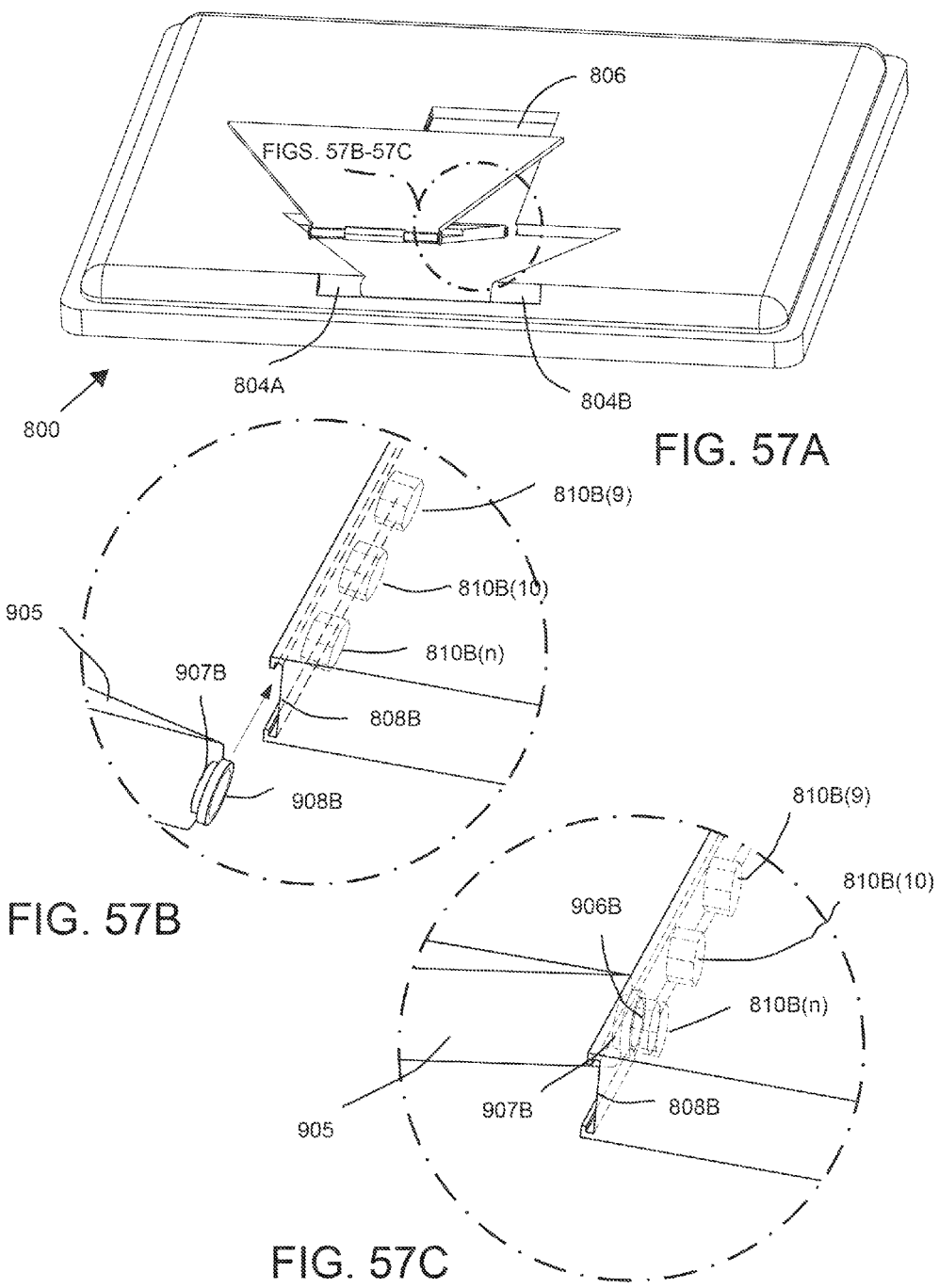

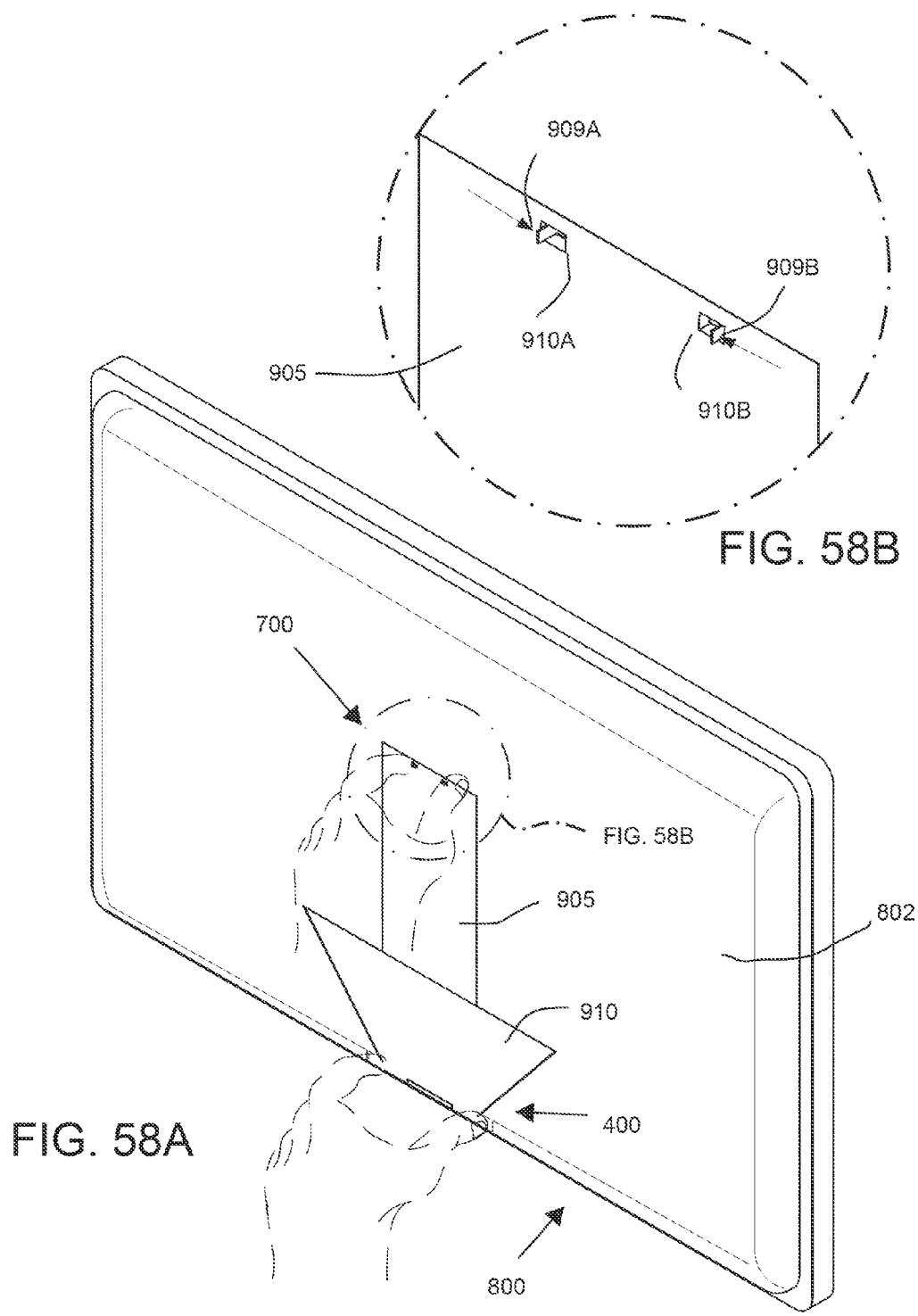

COMPACT BIPOSITIONAL LATERAL EDGE LOCKING LOAD BEARING ROTATION LOCK MECHANISM

CROSS-REFERENCES TO RELATED APPLICATIONS

This application is a continuation-in-part (CIP) of U.S. patent application Ser. No. 14/488,054, filed Sep. 16, 2014, and claims the benefit of U.S. patent application Ser. No. 14/255,711, filed Apr. 17, 2014, and claims the benefit of U.S. Provisional Application 62/064,216 filed Oct. 15, 2014, and U.S. Provisional Application 62/060,353 filed Oct. 6, 2014, and U.S. Provisional Application 61/906,878 filed Nov. 20, 2013, and U.S. Provisional Application 61/878,491 filed Sep. 16, 2013, all of which applications are incorporated by reference in their entireties.

FIELD

This technology relates to simple and compact mechanisms for locking and unlocking the rotation of load bearing hinges at multiple specific angles. More particularly, the technology herein relates to the specific angular positioning of personal information display and input devices among other applications.

BACKGROUND OF THE INVENTION

Since the introduction of the Apple iPhone in June 2007, and the Apple iPad in April 2010, the number of computing devices known as smart phones and tablets has vastly increased. These devices typically consist of a touch screen that fronts a highly sophisticated, versatile, thin, and lightweight computer that among other things, serves as a point-and-shoot camera, a video camera, and a face-to-face wireless communications device. In certain embodiments, the line between a smart phone and a tablet is blurring as smart phones continue to increase in size and assume most functions of a "tablet" as they narrow in thickness. In fact a new moniker has been established to refer to such devices; they are called "phablets"; a class of mobile wireless devices designed to combine or straddle the functions of a smartphone and a tablet. The latest incarnation of these devices is the iPhone 6s and 6s Plus and the Samsung Galaxy S6 and S6 edge, with thicknesses in the neighborhood of 7.1 mm.

While such devices represent marvels of modern communication, voice recording, photography, videography, gaming and the consumption and documentation of information; they all share a major deficiency that limits their usability; the ability to be positioned to various angles and orientations with respect to a base (a resting surface) in order eliminate glare, steady a camera shot, position the video camera at an optimum angle for recording a scene, for communicating wirelessly with another person over an extended period of time without tiring one's hand, as well as for consuming information while freeing both hands to eat, or to perform other tasks concurrently.

Moreover, with the advent of the Samsung Galaxy Note tablets and phablets, the Microsoft Surface tablets, and recently, the 12.9 inch iPad Pro—which incorporate a stylus—the display may not only need to be positioned to various angles and orientations, with respect to the base, but it may also need to support the load and the pressure of a human hand pressing a stylus against the display surface of the tablet or phablet at multiple viewing and writing angles, both for ergonomic reasons and to eliminate distracting reflections or glare.

The multitude of offerings from several manufacturers of smart phones, tablets and tablet accessories reveals that the great majority of current tablets, tablet stands, folios, and covers provide either fixed or limited adjustability; typically resulting in either one or two display angles (with respect to a resting surface or base).

A company that currently offers a display stand or a tablet accessory with several display angles is ZeroChroma, LLC (http://www.zerochroma.com) through their "VarioProtect" and "VarioEdge" and "Vortex" covers for the iPhone and iPad. While the ZeroChroma, LLC designs provide multiple viewing angles that can effectively eliminate glare and provide an ergonomic viewing experience, their designs are relatively complex, add substantial weight to the device they enclose, and only provide for a single load bearing viewing angle that can support hand-writing with a stylus without potentially sliding the display during hand-writing.

An analysis of existing display stands, kick stands, and other rotation lock technologies related to electronic display panels revealed that most current rotation lock technologies do not incorporate a rotation locking mechanism at the hinge (rotation joint) but rather rely mostly on notches and grooves that are parallel to the hinge's axis to stop the rotation of a pivoting display panel, as in the case of most tablet covers and stands. Nevertheless, a few companies have recently began to use different approaches for positioning a display tablet to various angles and orientations with respect to a base; for example ZeroChroma uses a series of flexible "bumps" that are transverse to the axis of rotation of the pivoting support element or stand to fix the rotation of the stand, while Microsoft appears to use a combination of cams and springs to prop the angular positioning of their Surface computers' kick stands, and Lenovo has recently introduced a new kickstand hinge with their new 12-inch ideapad Miix 700 that uses a watchband like hinge technology that enables their tablet computers to assume a vast amount of usage positions. However, none of these technologies provide for a load bearing rotation lock mechanism that would enable electronic display devices to support the load and the pressure of a human hand pressing a stylus against the display surface of a tablet at multiple viewing and writing angles, both for ergonomic reasons and to eliminate distracting reflections or glare. Therefore a need exists for a compact technology that not only can support a large number of adjustable viewing angles for a display stand, but also that can support the load and the pressure of a human hand pressing a stylus against the display surface of a tablet at multiple viewing and writing angles in order to vastly enhance the functionality, ergonomics, and enjoyment of electronic tablets and transform them from devices that are primarily used for the consumption of information, to devices that can be highly effective as writing, drawing, and painting instruments.

SUMMARY OF THE INVENTION

I invented and disclose herein a load bearing rotation lock mechanism including disks or cylinders with teeth or a combination of both that interlock radially between their inner and outer surface areas, or frontal areas, or both, where one of the disks or cylinders is attached to a fixed surface area and the other disk or cylinder is attached to a pivoting arm, plate, or other kind of load bearing support element, and where one of the disks or cylinders is able to mesh (lock)

and un-mesh (unlock) from the other disk or cylinder by protruding, retracting, or sliding laterally over a common, continuous or divided axis, shaft, or channel thereby freezing the angular position of the pivoting arm, plate, or other kind of load bearing support element with respect to the fixed surface area at the time the disks, cylinders, or a combination of both, mesh (lock) with each other and unfreezing the pivoting arm, plate, or other kind of load bearing support element to pivot freely with respect to the fixed surface area when the disks, cylinders, or combination of both un-mesh (unlock) from one another.

Whereas the unlocking is achieved over a divided axis, shaft, or channel, the un-meshing (or unlocking) of the disks and cylinders will result in a complete detachment (disconnect) of the pivoting load bearing support element from the fixed surface area that is attached to the opposing disk or cylinder.

As stated above and provided in this disclosure, the load bearing rotation lock mechanism disclosed herein may be embodied in various designs that enhance the functionality, ergonomic, and enjoyment of electronic displays, input devices, and other devices such as lamps, clamps, and other mechanisms that could benefit from discrete load bearing rotation locking mechanisms.

BRIEF DESCRIPTION OF THE DRAWINGS

These and other features and advantages will be better and more completely understood by referring to the following description of exemplary non-limiting illustrative embodiments in conjunction with the drawings of which:

FIGS. 1A and 1B show in cross section an internal chamber (FIG. 1A) to house a disk with teeth (FIG. 1B).

FIGS. 2A and 2B show another example of an internal chamber (FIG. 2A) to house a disc with teeth (FIG. 2B).

FIG. 17A illustrates a three dimensional perspective view of a multi-sided cylinder that is fastened to a pivoting support element and a hollow cylinder or socket that can receive the multi-sided cylinder that is fastened to a pivoting support element, wherein the multi-sided cylinder is about to enter the hollow cylinder or socket FIG. 17B illustrates a cross section perspective view of a multi-sided cylinder that can be fastened to a pivoting support element and an inverse hollow cylinder or socket that can receive the multi-sided cylinder that is fastened to a pivoting support element, wherein the multi-sided cylinder is about to enter the inverse hollow cylinder or socket.

FIG. 17C illustrates a cross section perspective view of a multi-sided cylinder that can be fastened to a pivoting support element and a hollow cylinder or socket that can receive the multi-sided cylinder that is fastened to a pivoting support element, wherein the multi-sided cylinder is fully inserted and interlocked with the inverse hollow cylinder.

FIGS. 18A, 19A, 20A, 21A and 22A illustrate a three dimensional perspective view of multiple permutations of a multi-sided cylinder and shaft that are fastened to a pivoting support element and a double chambered hollow cylinder or socket that can receive the multi-sided cylinder and shaft that are fastened to a pivoting support element, wherein either the multi-sided cylinder or the shaft is about to enter the double chambered hollow cylinder or socket.

FIGS. 18B, 19B, 20B, 21B and 22B illustrate a three dimensional perspective view of multiple permutations of a multi-sided cylinder and shaft that are fastened to a pivoting support element and a double chambered hollow cylinder or socket that can receive the multi-sided cylinder and shaft that are fastened to a pivoting support element, wherein either the multi-sided cylinder or the shaft is positioned in the first receptacle of the double chambered hollow cylinder or socket.

FIGS. 18C, 19C, 20C, 21C and 22C illustrate a three dimensional perspective view of multiple permutations of a multi-sided cylinder and shaft that are fastened to a pivoting support element and a double chambered hollow cylinder or socket that can receive the multi-sided cylinder and shaft that are fastened to a pivoting support element, wherein either the multi-sided cylinder or the shaft is positioned in the second receptacle of the double chambered hollow cylinder or socket.

FIG. 26C illustrates the use of a non-limiting example of a sliding cylinder load-bearing rotation lock mechanism situated in the back of a tablet, "phablet", or smart phone, wherein the supporting element is disposed in a position extending from the body of the tablet in order to provide orientation and support for the tablet.

FIG. 26D is a close up of an optional spring at one edge of the support element that sets a default angular position for the support element where the sliding button had been pulled and the multi-sided or multi-toothed sliding cylinder had been disengaged from the cavity of the pivoting support element.

FIG. 29A shows a cross-sectional view of an example non-limiting sliding shaft rotation lock mechanism with the button extended/protruding in a default "locked" position.

FIG. 29B is a cross-sectional view of an example non-limiting sliding shaft rotation lock mechanism in the "unlocked" position after the button had been pushed in.

FIG. 29C shows a cross-section of the FIG. 29B sliding shaft rotation lock mechanism back in the default "locked" position after the button is released and a spring, on the right side, has pushed a multi-sided cylinder or gear back into an inverse hollow cylinder or internal gear.

FIG. 30 is a three-dimensional perspective exploded view of an example non-limiting sliding shaft rotation lock mechanism showing how the individual components fit together to make the device work.

FIGS. 32A to 43A and 32B to 43B together are a sequence of drawings that when displayed one after another provide a flip chart animation showing how the example non-limiting sliding shaft rotation lock mechanism can be unlocked, rotated and relocked.

FIGS. 48B to 51B together represent a sequence partial cross sectional two-dimensional representation drawings of an example non-limiting retracting cylinders rotation lock mechanism that when displayed one after another provide a flip chart animation showing how a pair of stepped multi-sided retracting cylinders that are inversely aligned at either side of a biasing spring inside a channel can be protruded and retracted from a pivoting support panel and into inverse multi-sided sockets attached to adjacent surface areas to lock the angular rotation of a pivoting support element to a fixed surface area.

FIGS. 54A and 54B illustrates a three dimensional perspective view of a non-limiting exemplary embodiment of a back panel for a retracting cylinders rotation lock mechanism that can prop a display panel to various heights and angular positions and a corresponding close-up view of a railing mechanism that can glidingly attach a retracting cylinders rotation lock mechanism to the back panel of an exemplary personal information display and input panel.

FIGS. 57A, 57B and 57C provide three dimensional perspective views of how an unfolding exemplary embodiment of a foldable detachable retracting cylinders rotation lock mechanism stand can glidingly attach to the back panel of a personal information display and input device.

FIG. 58A illustrates a three dimensional perspective view of a non-limiting exemplary embodiment of a foldable detachable retracting cylinders rotation lock mechanism stand stowed neatly in the flush position in the back panel of a personal information display and input device.

FIG. 58B illustrates a close up of the retracting handles in the back of the exemplary foldable detachable retracting cylinders rotation lock mechanism stand.

DETAILED DESCRIPTION

FIG. 1A represents a cross-sectional embodiment of an internal gear 105, and FIG. 1B represents a cross-sectional embodiment of a spur gear 110. Generally speaking, spur gears or straight-cut gears are a simple type of gear consisting of a cylinder or disk with the teeth projecting radially, where the edge of each tooth is straight and aligned parallel to the axis of rotation. These gears can be meshed together correctly if they are fitted to a common axis, shaft, or channel. These illustrations are used to illuminate the essence of this invention which is that of two disks or cylinders with teeth or a combination of both that can interlock radially between their inner and outer surface areas, or frontal areas, or both, where one of the disks or cylinders is attached to a fixed surface area and the other disk or cylinder is attached to a pivoting arm, plate, or other kind of load bearing support element, and where one of the disks or cylinders is able to mesh (lock) and un-mesh (unlock) from the other disk or cylinder by protruding, retracting, or sliding laterally over a common, continuous or divided axis, shaft, or channel thereby freezing the angular position of the pivoting arm, plate, or other kind of load bearing support element with respect to the fixed surface area at the time the disks, cylinders, or a combination of both, mesh (lock) with each other and unfreezing the pivoting arm, plate, or other kind of load bearing support element to pivot freely with respect to the fixed surface area when the disks, cylinders, or combination of both un-mesh (unlock) from one another.

Whereas the unlocking is achieved over a divided axis, shaft, or channel, the un-meshing (or unlocking) of the disks and cylinders will result in a complete detachment (disconnect) of the pivoting support element from the fixed surface area that is attached to the opposing disk or cylinder.

FIG. 2A represents a cross-sectional embodiment of a hex socket 115, and FIG. 2B represents a cross-sectional embodiment of a hex key 120. The hex key 120 can be meshed together correctly with a similarly sized hex socket 115 if they are fitted to a common axis. These illustrations are used to highlight the fact that angular meshing of cylinders and gears can be achieved through various means, such as the interlocking of radially connected concentric segments as can be achieved by the interlocking of hex keys and sockets or the interlocking of spur gears and internal gears.

Figure 3A:
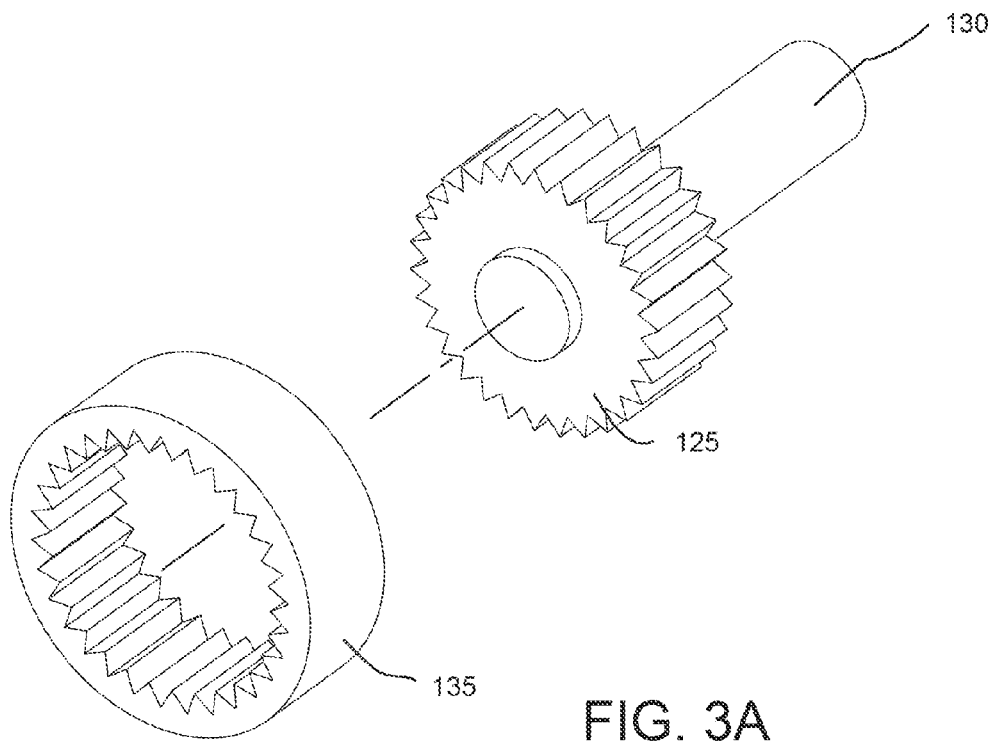
FIG. 3A illustrates a three-dimensional perspective of an exploded view representation of how the outer surface of a disk with teeth, or cylinder, mounted on an axis or a cylindrical shaft can interlock with the inner surface of an enveloping tube or cylinder.

FIG. 3A is a three-dimensional perspective of an exploded view representation of how an example non limiting spur gear 125 connected to a rotating cylindrical shaft 130 can mesh with a fixed or stationary internal gear 135 to lock the angular position of the rotating shaft.

Figure 3B:
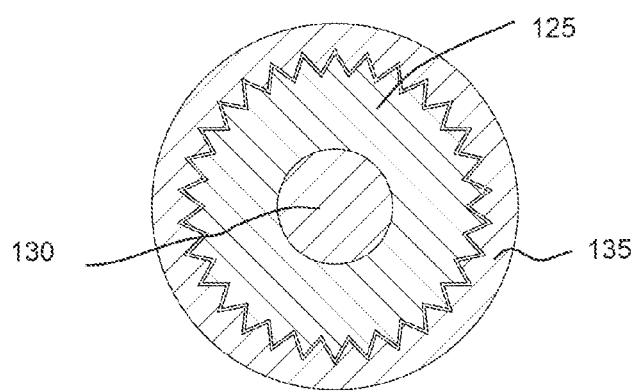
FIG. 3B illustrates a cross-sectional two-dimensional representation of how an example non-limiting disk with teeth, or cylinder, mounted on an axis or a cylindrical shaft can mesh with the inner surface of an enveloping tube or cylinder to fix the angular/rotational position of the axis or shaft.

FIG. 3B illustrates a cross-sectional two-dimensional representation of how an example non-limiting spur gear 125 connected to a cylindrical shaft 130 can mesh with an internal gear 135 to fix the angular/rotational position of the shaft.

Figure 4:
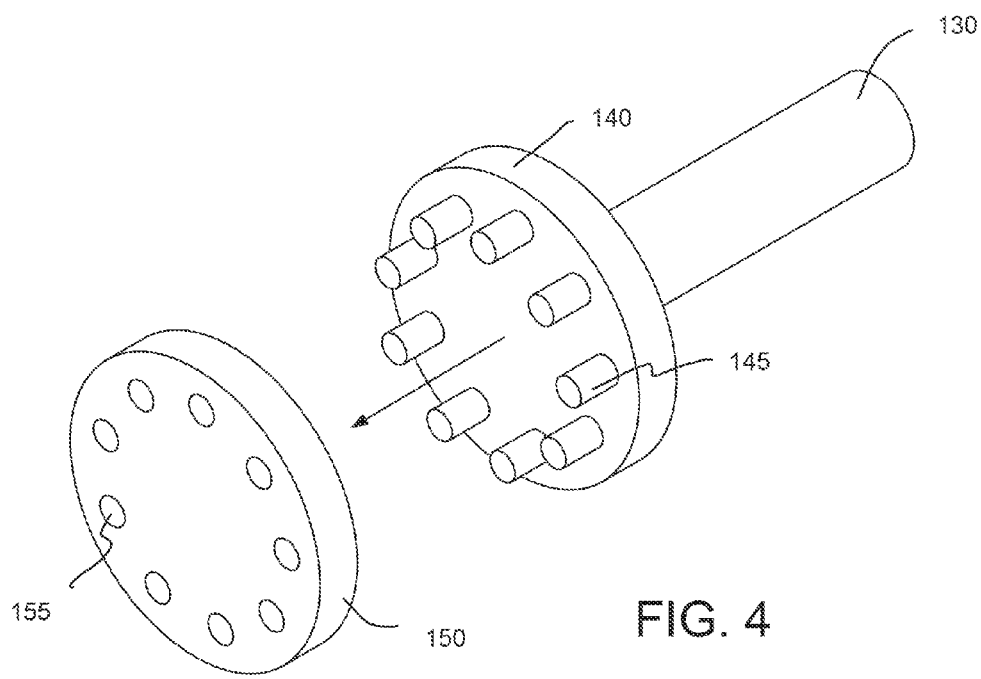
FIG. 4 illustrates a three-dimensional perspective view of an example non-limiting frontal angular locking between two disks.

FIG. 4 is a perspective view of an exemplary embodiment of a frontal locking rotation lock mechanism using a pinned disk 140 connected to an exemplary shaft 130 just before being inserted into a disk with holes 150. The disk with holes 150 contains holes 155 into which the pins 145 of disk 140 are inserted. Thus, in one example non-limiting implementation, the shaft 130 can be displaced along its rotational axis relative to the disk with holes to engage or disengage the pins 145 from the holes 155. In this way, the user can rotate the pinned disk's shaft (or a structure attached to the pinned disk's shaft) to any desired angle or orientation. When the user has rotated the pinned disk's shaft 130 to a desired position, the user may then insert or reinsert the pinned disk 140 into the disk with holes 150, thereby rotationally locking the pinned disk 140 (and thus shaft 130, and any structure attached to the pinned disk shaft 130) relative to the disk with holes 150.

Figure 5:
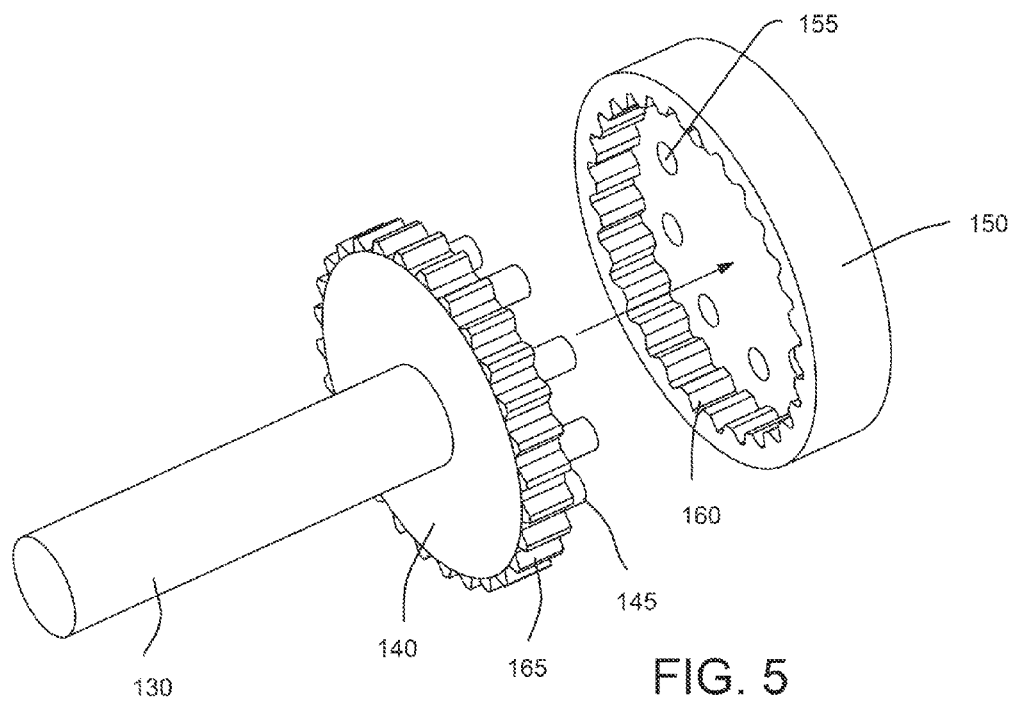
FIG. 5 illustrates a three-dimensional perspective view of an example non-limiting frontal and side angular locking between a disk and cylinder.

FIG. 5 illustrates a perspective view of an exemplary embodiment of a frontal and side locking rotation lock mechanism using a pinned and ribbed disk 140 connected to an exemplary shaft 130 just before being inserted into an internally ridged cylinder with holes 150. The internally ridged cylinder with holes 150 contains holes 155 and ridges 160 into which the pins 145 and ribs 165 of disk 140 are inserted. Thus, in one example non-limiting implementation, the shaft 130 can be displaced along its rotational axis relative to the ridged cylinder with holes to engage or disengage the pins 145 and the ribs 165 from holes 155 and ridges 160 of the ridged cylinder with holes. In this way, the user can rotate the pinned and ribbed disk's shaft (or a structure attached to the pinned and ribbed disk's shaft) to any desired angle or orientation. When the user has rotated the pinned and ribbed disk's shaft 130 to a desired position, the user may then insert or reinsert the pinned and ribbed disk 140 into the internally ridged cylinder with holes 150, thereby rotationally locking the pinned and ribbed disk 140

(and thus shaft 130, and any structure attached to the pinned and ribbed disk's shaft 130) relative to the internally ridged cylinder with holes 150.

Figure 6A:
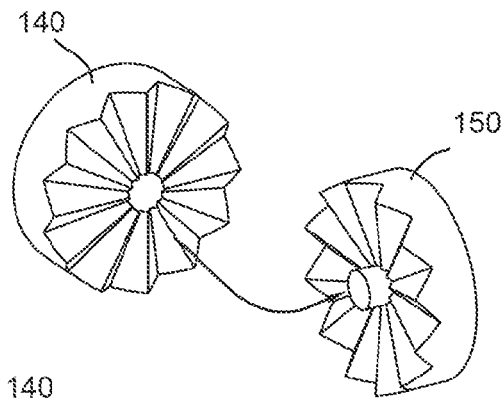
FIGS. 6A to 6D illustrate a three-dimensional perspective view of several example non-limiting notched, grooved, and pinned plates and cylinders made up of diametrically inverse grooves, notches, and holes that may be meshed together to fix the rotational position of a shaft.
Figure 6B:
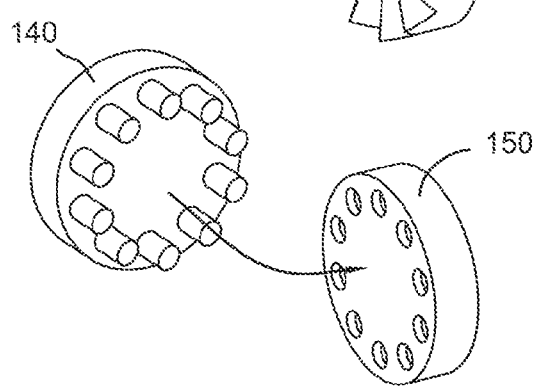
Figure 6C:
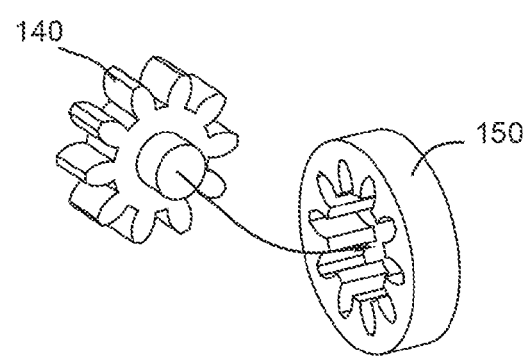
Figure 6D:
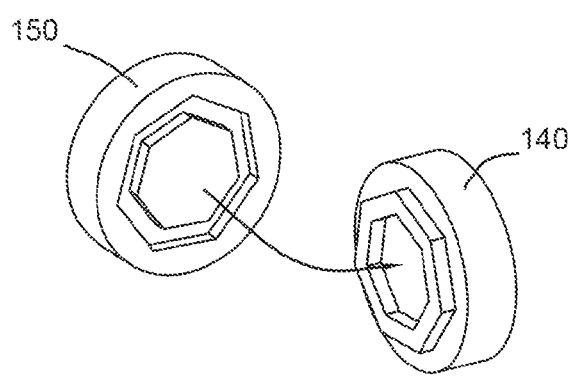

FIGS. 6A to 6D illustrate non-limiting exemplary embodiments of frontal locking of disks with teeth and receptacles for the disks that may be meshed together to fix the rotational position of a shaft, wherein FIGS. 6A, 6B and 6D show a disk with teeth 140 extending axially from a front face of the disk and a front face of the receptacle 150 has recesses for the teeth, FIG. 6C shows a disc with teeth 140 extending radially outward from the disc and the receptacle 150 include radially extending recesses to receive the teeth.

Figure 7:
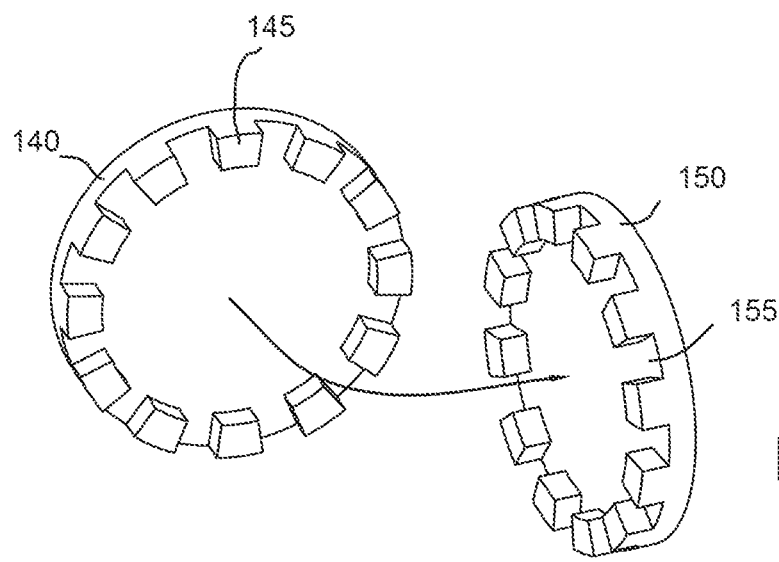
FIG. 7 illustrates a non-limiting exemplary embodiment of meshed disks that can fix the rotational position of a shaft where the meshing combines both frontal and side locking.

FIG. 7 illustrates a non-limiting exemplary embodiment of meshed disks that can fix the rotational position of a shaft where the meshing combines both frontal and side locking. Thus, in this one example non-limiting implementation, the disk with teeth 140 has teeth 145 that extend axially from the edge of the front face of the disk 140 and the edge of the front face of the receptacle 150 has diametrically inverse recesses 155 that may be meshed together with teeth 145 of the disk with teeth 140 to fix the rotational position of an attached shaft.

Figure 8:
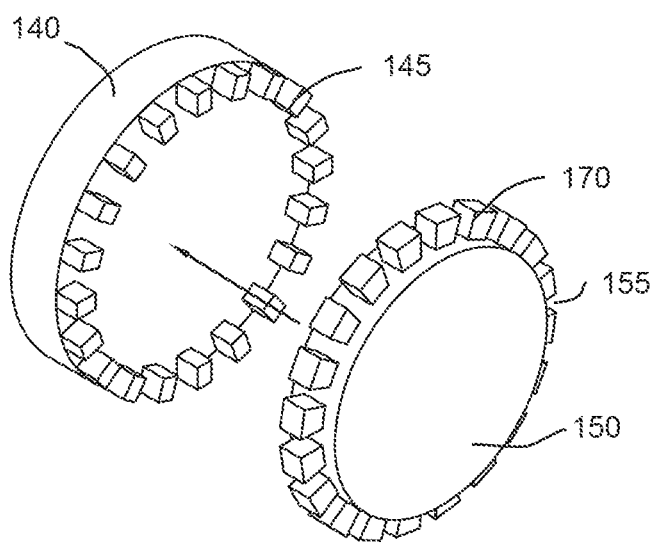
FIGS. 8 and 9 illustrate a non-limiting exemplary embodiment of meshed disks that can fix the rotational position of a shaft where the meshing combines both frontal and side locking, but where the meshing teeth may not necessarily be made up of diametrically inverse structures in order to generate diametrically inverse recesses.
Figure 9:
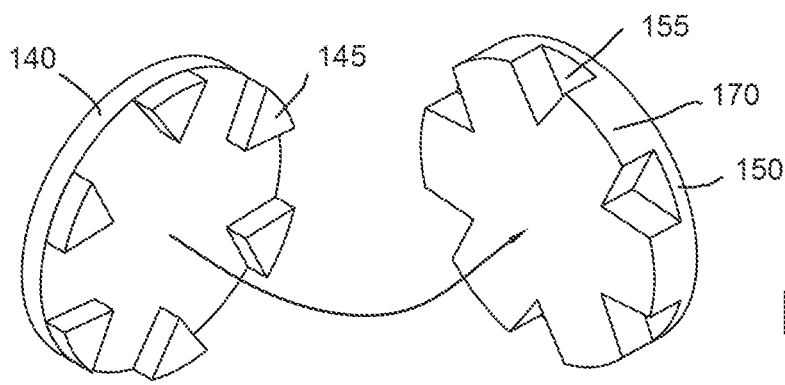

FIGS. 8 and 9 illustrate a non-limiting exemplary embodiment of meshed disks that can fix the rotational position of a shaft where the meshing combines both frontal and side locking, but where the meshing teeth may not necessarily be made up of diametrically inverse structures in order to generate diametrically inverse recesses. Thus, in these two example non-limiting implementations, the disk with teeth 140 has teeth 145 that extend axially from the edge of the front face of the disk 140 and the edge of the front face of the receptacle 150 has dissimilarly shaped structures 170 that generate diametrically inverse recesses 155 to the teeth 145 of the disk with teeth 140 that may be meshed together to fix the rotational position of an attached shaft.

Figure 10:
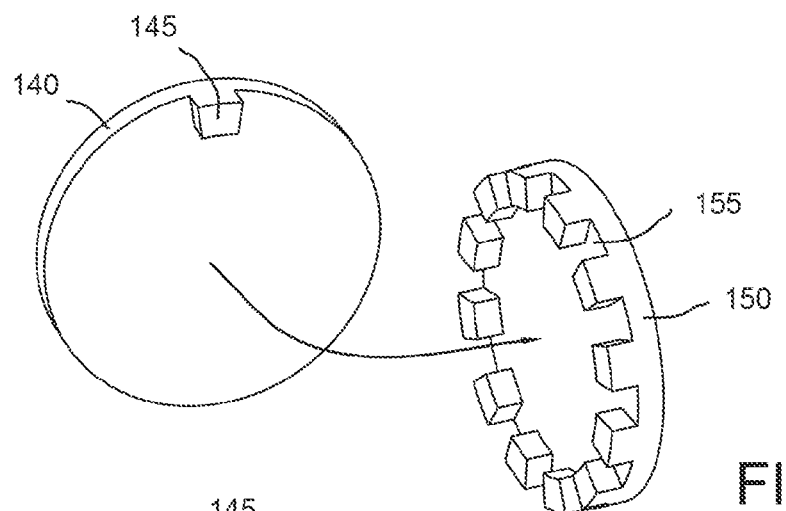
FIG. 10 illustrates a non-limiting exemplary embodiment of meshed disks that can fix the rotational position of a shaft where the meshing combines both frontal and side locking, but where the meshing teeth may not necessarily be made of an equal number of diametrically inverse structures in order to generate diametrically inverse recesses.

FIG. 10 illustrates a non-limiting exemplary embodiment of meshed disks that can fix the rotational position of a shaft where the meshing combines both frontal and side locking, but where the meshing teeth may not necessarily be made of an equal number of diametrically inverse structures in order to generate multiple radially locking angular positions. Thus, in this example non-limiting implementations, the disk with teeth 140 has a single tooth 145 that extend axially from the edge of the front face of the disk 140 and the edge of the front face of the receptacle 150 has several diametrically inverse recesses 155 that may be meshed together with tooth 145 of the disk with teeth 140 to fix the rotational position of an attached shaft.

Figure 11:
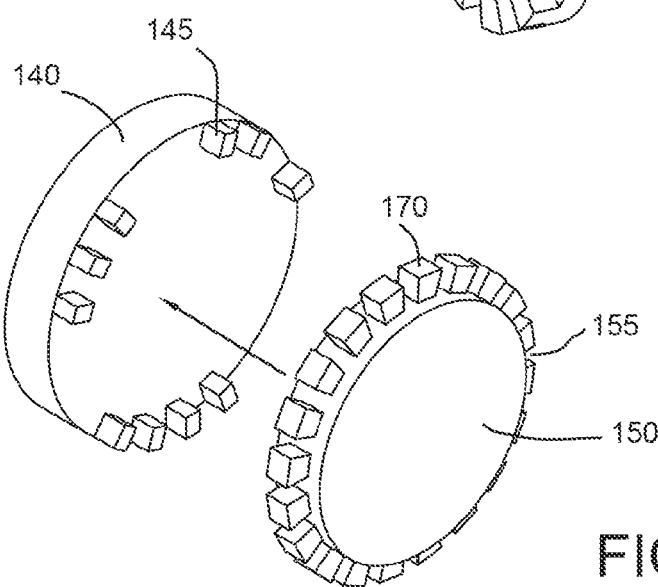
FIG. 11 illustrates a non-limiting exemplary embodiment of meshed disks that can fix the rotational position of a shaft where the meshing combines both frontal and side locking, but where the meshing structures may not necessarily be made of an equal number of evenly spaced elements in order to generate multiple radially locking angular positions.

FIG. 11 illustrates a non-limiting exemplary embodiment of meshed disks that can fix the rotational position of a shaft where the meshing combines both frontal and side locking, but where the meshing structures may not necessarily be made of an equal number of evenly spaced elements in order to generate multiple radially locking angular positions. Thus, in this example non-limiting implementation, the disk with teeth 140 has multiple randomly positioned radial teeth 145 that extend axially from the edge of the front face of the disk 140 and the edge of the front face of the receptacle 150 has several diametrically inverse recesses 155 that may be meshed together with teeth 145 of the disk with teeth 140 to fix the rotational position of an attached shaft.

Figure 12:
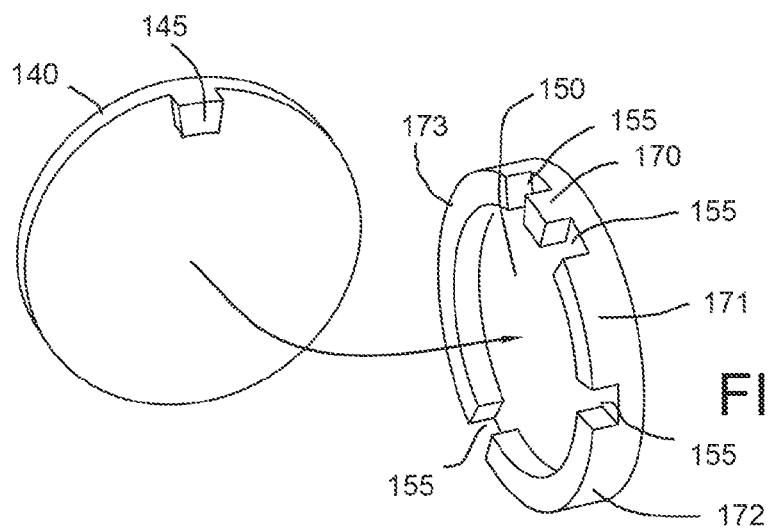
FIG. 12 illustrates a non-limiting exemplary embodiment of meshed disks that can fix the rotational position of a shaft where the meshing combines both frontal and side locking, but where the meshing structures may not necessarily be made of evenly spaced or evenly numbered elements in order to generate multiple radially locking angular positions.

FIG. 12 illustrates a non-limiting exemplary embodiment of meshed disks that can fix the rotational position of a shaft where the meshing combines both frontal and side locking, but where the meshing structures may not necessarily be made of evenly spaced or evenly numbered elements in order to generate multiple radially locking angular positions. Thus, in this example non-limiting implementations, the disk with teeth 140 has a single tooth 145 that extends axially from the edge of the front face of the disk 140 and the edge of the front face of the receptacle 150 has several unequal structures that generate multiple unevenly spaced inverse recesses 155 that may be meshed together with tooth 145 of the disk with teeth 140 to fix the rotational position of an attached shaft.

Figure 13A:
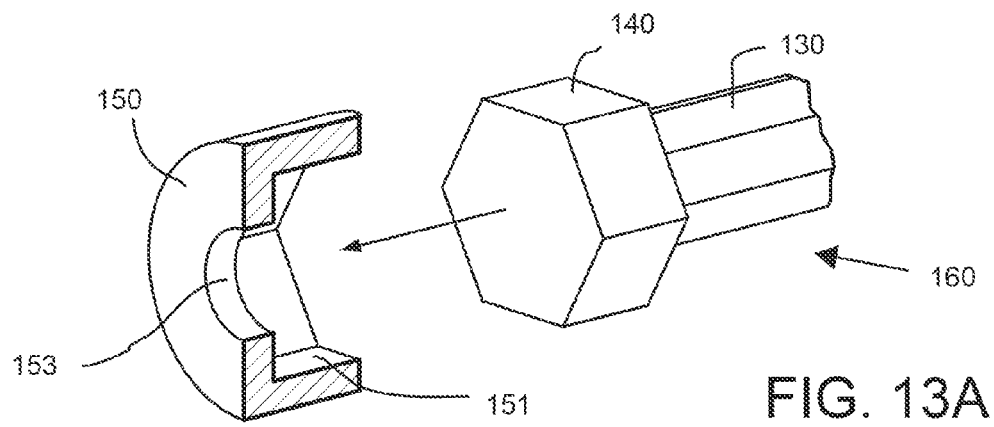
FIG. 13A shows in partial cross section an octagonal shaft connected to a hex key just before being inserted into a cylindrical chamber housing a hex socket.

FIG. 13A shows a perspective view of an embodiment of a rotation lock mechanism using an exemplary octagonal shaft 130 connected to a hex key 140 just before being inserted into cylindrical chamber 150 housing hex socket 151. The hex socket 151 comprises edges formed within a chamber into which hex key 140 can be selectively inserted. When the hex key 140 is inserted into the chamber, the edges of the hex key 140 mesh and interlock with the edges of the hex socket 151 within the cavity. The figure also shows a circular opening 153 at the edge of the chamber for a push-button that would disengage the hex key 140 out of the hex socket 151. Thus, in one example non-limiting implementation, the hex key shaft 130 can be displaced along its rotational axis relative to the hex socket to unlock or disengage the hex key 140 from the hex socket 151. In this way, the user can rotate the hex key shaft 130 (or a structure attached to the hex key shaft) to any desired angle or orientation. When the user has rotated the hex key shaft 130 to a desired position, the user may then insert or reinsert the hex key 140 into the hex socket 151 cavity, thereby rotationally locking the hex key 140 (and thus shaft 130, and any structure attached to the hex key shaft 130) relative to the hex socket 151.

Figure 13B:
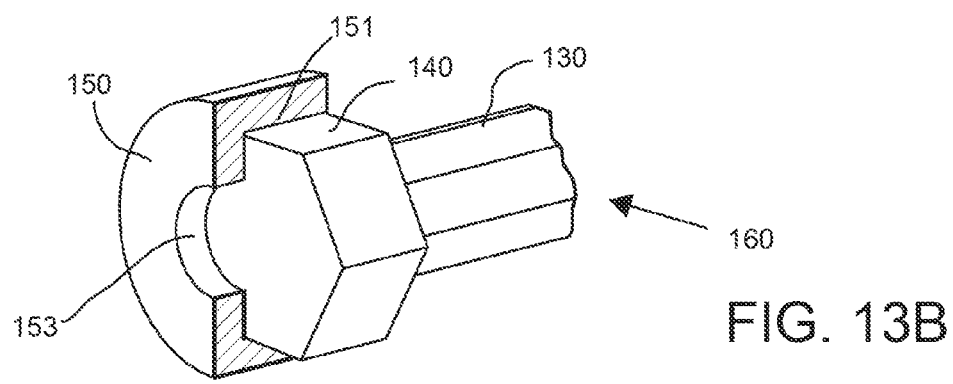
FIG. 13B shows in partial cross section an octagonal shaft connected to a hex key just having been inserted into a cylindrical chamber housing a hex socket.

FIG. 13B shows a 3D exemplary embodiment in cross-section of a rotation lock mechanism using a cylindrical chamber 150 containing a hex key 140 connected to an exemplary octagonal shaft 130 just having been inserted into a hex socket 151. The figure also shows a circular opening 153 at the edge of the chamber into which a structure such as a push-button can be inserted. The pushbutton or other structure can be used to disengage the hex key 140 out of the hex socket 151.

Figure 14A:
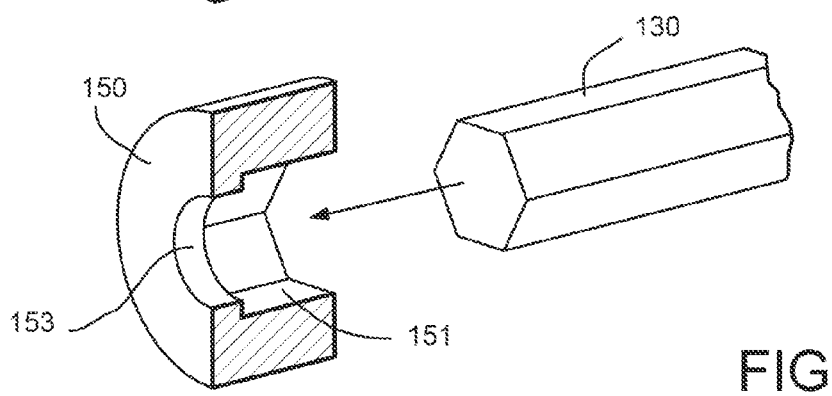
FIG. 14A shows in partial cross section an octagonal shaft just before being inserted into a cylindrical chamber housing a hex socket.

FIG. 14A shows a perspective view of rotation lock mechanism using an exemplary octagonal shaft 130 without any fastened disk, cylinder, or gear, just before being inserted into a cylindrical housing 150 with a reverse octagonal socket 151 that can interlock with octagonal shaft 130, freezing the rotation of the shaft and any structure attached to the shaft 130 relative to the reverse octagonal socket—without the need for a separate internal chamber to hold a fastened disk, cylinder, or gear.

Replacing octagonal shaft 130 with a shaft consisting of more facets or a larger number of lateral teeth will enable the rotation lock mechanism to assume a larger number of discreet angular positions, corresponding to the individual number of facets or teeth positioned around the perimeter of the shaft. The figure also shows a circular opening 153 at the edge of the hollowed cylindrical housing for a push-button that would disengage the exemplary octagonal shaft 130 out of the reverse octagonal socket 151.

This embodiment may be useful for a rotation lock mechanism integrated into very thin modern computing devices such as the new iPhone 6S and similar personal computing devices.

Figure 14B:
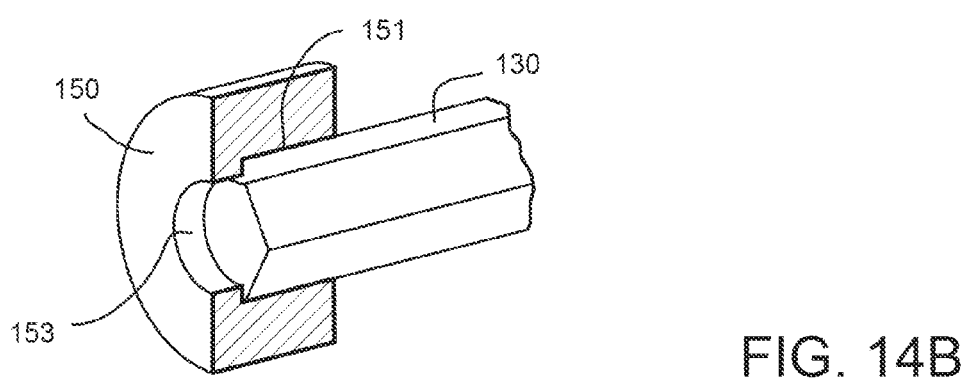
FIG. 14B shows in partial cross section an octagonal shaft just having been inserted into a cylindrical chamber housing a hex socket.

FIG. 14B shows a perspective view of a rotation lock mechanism using a cylindrical housing 150 containing an exemplary octagonal shaft 130 just having been inserted into a reverse octagonal socket 151. The figure also shows a circular opening 153 at the edge of the cylindrical housing into which a structure such as a push-button can be inserted. The pushbutton or other structure can be used to disengage the exemplary octagonal shaft 130 out of the reverse octagonal socket 151 that is located at the edge of the cylindrical housing 150.

Figure 15A:
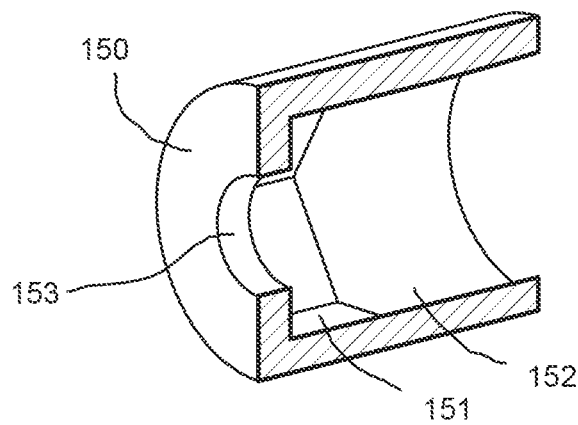
FIG. 15A shows in partial cross section a cylindrical chamber configured to receive a disk with teeth attached to a shaft. The cylindrical chamber is divided into a first chamber and a second chamber.

FIG. 15A shows a perspective view of cross-section of a rotation lock mechanism using a cylindrical chamber 150 configured to receive a disk with teeth attached to a shaft. The cylindrical chamber 150 is divided into a first chamber 151 and a second chamber 152.

The second chamber 152 is positioned at the wide open end of the cylindrical chamber and is round, smooth, and tubular so that when the disk with teeth that is attached to a shaft is positioned in the second chamber 152, a pivoting support element that may be fastened to the shaft that is attached to the disk with teeth is allowed to pivot freely around the axis of the cylindrical chamber 150.

The first chamber 151 that is adjacent to the second chamber is shaped like a socket or aperture that is the inverse of the disk with teeth so that when the ending of the disk with teeth comes in contact with the first chamber they interlock and the pivoting support element that is fastened to the shaft that is attached to the disk with teeth is prevented from pivoting. The figure also shows a circular opening 153 at the edge of the hollowed cylindrical housing into which a structure such as a push-button can be inserted that would disengage the exemplary disk with teeth from the first chamber 151 and into the second chamber 152 where it would be allowed to pivot freely without the need to fully disengage from the cylindrical chamber 150.

Figure 15B:
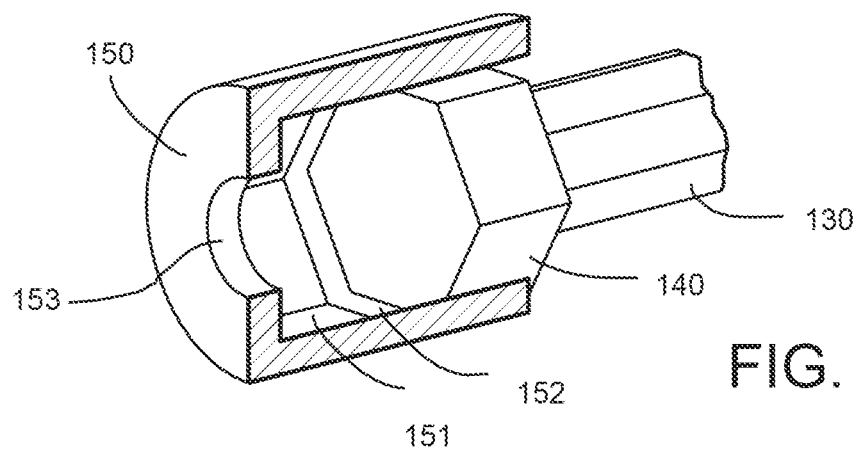
FIG. 15B shows in partial cross section an exemplary embodiment of a rotation lock mechanism using a cylindrical chamber containing a disk with teeth attached to a shaft positioned in a chamber where it would be allowed to pivot freely.

FIG. 15B shows a perspective view of a rotation lock mechanism using a cylindrical chamber 150 containing a disk with teeth 140 attached to a shaft 130 positioned in second chamber 152 where it would be allowed to pivot freely.

Figure 15C:
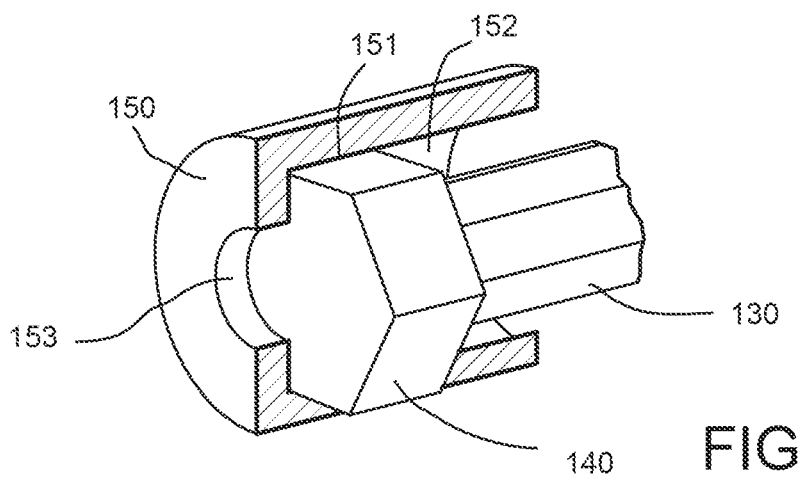
FIG. 15C shows in partial cross section an exemplary embodiment of a rotation lock mechanism using a cylindrical chamber containing a disk with teeth attached to a shaft positioned in a chamber where it would be prevented from pivoting.

FIG. 15C shows a perspective view of a rotation lock mechanism using a cylindrical chamber 150 containing a disk with teeth 140 attached to a shaft 130 just having been inserted into first chamber 151 where it would be prevented from pivoting.

Figure 16A:
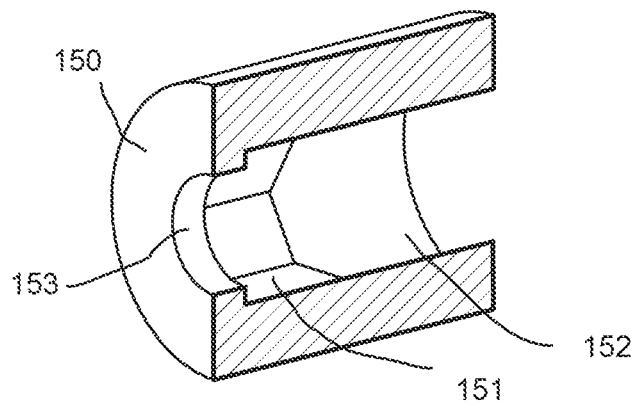
FIG. 16A shows in partial cross section a cylindrical chamber configured to receive a multi-faceted shaft. The cylindrical chamber is divided into a first chamber and a second chamber.

FIG. 16A shows a perspective view of a rotation lock mechanism using a cylindrical chamber 150 configured to receive a multi-sided or toothed cylinder. The cylindrical chamber 150 is divided into a first chamber 151 and a second chamber 152.

The second chamber 152 is positioned at the wide open end of cylindrical chamber 150 and is round, smooth, and tubular so that when the multi-sided or toothed cylinder is positioned in the second chamber 152, a pivoting support element that may be fastened to the multi-sided or toothed cylinder is allowed to pivot freely around the axis of the cylindrical chamber 150.

The first chamber 151 that is adjacent to the second chamber is shaped like a socket or aperture that is the inverse of the multi-sided or toothed cylinder so that when the ending of the multi-sided or toothed cylinder comes in contact with the first chamber they interlock and the pivoting support element that is fastened to the multi-sided or toothed cylinder is prevented from pivoting. The figure also shows a circular opening 153 at the edge of the hollowed cylindrical housing into which a structure such as a push-button can be inserted that would disengage the exemplary multi-sided or toothed cylinder from the first chamber 151 and into the second chamber 152 where it would be allowed to pivot freely without the need to fully disengage from the cylindrical chamber 150.

Figure 16B:
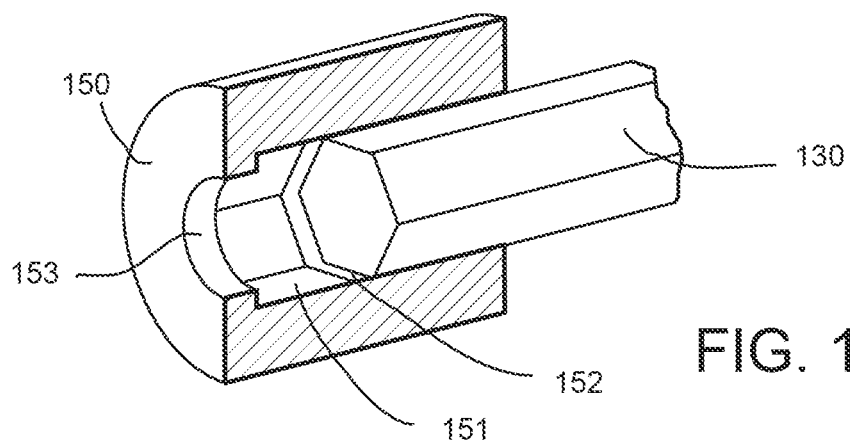
FIG. 16B shows in partial cross section an exemplary embodiment of a rotation lock mechanism using a cylindrical chamber containing a multi-faceted shaft where the shaft is positioned in a chamber where it would be allowed to pivot freely.

FIG. 16B shows a perspective view of a rotation lock mechanism using a cylindrical chamber 150 containing a multi-sided or toothed cylinder 130 positioned in second chamber 152 where it would be allowed to pivot freely.

Figure 16C:
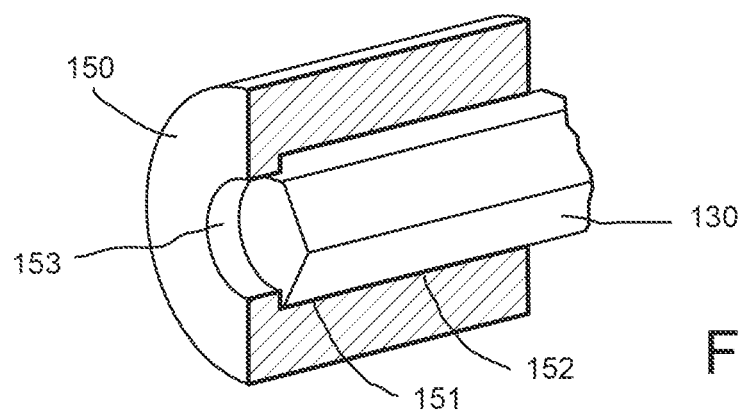
FIG. 16C shows in partial cross section an exemplary embodiment of a rotation lock mechanism using a cylindrical chamber containing a multi-faceted shaft where the shaft is positioned in a chamber where it would be prevented from pivoting.

FIG. 16C shows a perspective view of a rotation lock mechanism using a cylindrical chamber 150 containing a multi-sided or toothed cylinder 130 just having been inserted into first chamber 151 where it would be prevented from pivoting.

Exemplary Concept Manifestations:

FIGS. 17A to 22C illustrate exemplary manifestations of the concept of this invention where two disks or cylinders with teeth or a combination of both that can interlock radially between their inner and outer surface areas, or frontal areas, or both, where one of the disks or cylinders is attached to a fixed surface area and the other disk or cylinder is attached to a pivoting arm, plate, or other kind of load bearing support element, and where one of the disks or cylinders is able to mesh (lock) and un-mesh (unlock) from the other disk or cylinder by protruding, retracting, or sliding laterally over a common, continuous or divided axis, shaft, or channel thereby freezing the angular position of the pivoting arm, plate, or other kind of load bearing support element with respect to the fixed surface area at the time the disks, cylinders, or a combination of both, mesh (lock) with each other and unfreezing the pivoting arm, plate, or other kind of load bearing support element to pivot freely with respect to the fixed surface area when the disks, cylinders, or combination of both un-mesh (unlock) from one another. For the purposes of these non-limiting exemplary manifestations of the concept of this invention, in FIGS. 17A-22C, pivoting element 190 may be assumed to be attached to an arm, plate, or other kind of load bearing support element, and cylindrical chamber 195 may be assumed to be attached to a fixed surface area.

FIG. 17A illustrates an exemplary non-limiting three dimensional perspective view of one manifestation of the concept of this invention. Thus, this example non-limiting manifestation of the concept illustrates a multi-sided cylinder 192 that is fastened to pivoting element 190 which may be attached to an arm, plate, or other kind of load bearing support element, and a cylindrical chamber 195 which may be attached to a fixed surface area and which is configured with a multi-sided hollow cylinder that is shaped like a socket 194 that is the inverse of the multi-sided cylinder 192 so that when multi-sided cylinder 192 is thrust into socket 194, multi-sided cylinder 192 and socket 194 interlock freezing the rotation of pivoting element 190 relative to cylindrical chamber 195.

FIG. 17B illustrates a cross section perspective view of multi-sided cylinder 192 of FIG. 17A wherein multi-sided cylinder 192 is about to enter the inverse multi-sided socket 194 of cylindrical chamber 195.

FIG. 17C illustrates a cross section perspective view of the multi-sided cylinder 192 of FIG. 17A wherein multi-sided cylinder 192 is thrust into cylindrical chamber 195 and is interlocked with the inverse multi-sided socket 194 of cylindrical chamber 195, thereby freezing the rotation of pivoting element 190 relative to cylindrical chamber 195.

FIG. 18A illustrates a non-limiting exemplary three dimensional perspective view of another manifestation of the concept of this invention. Thus, this example non-limiting manifestation illustrates a three dimensional perspective view of a multi-sided cylinder 192 that is fastened to pivoting element 190 through a connecting shaft 191 and a cylindrical chamber 195 that is divided into a first chamber 194 and a second chamber 193. The second chamber 193 is positioned at the wide open end of cylindrical chamber 195 and is round, smooth, and tubular so that when multi-sided cylinder 192 is positioned in the second chamber 193, pivoting element 190 that is fastened to multi-sided cylinder 192 through connecting shaft 191 is allowed to pivot freely around the axis of cylindrical chamber 195. First chamber 194 that is adjacent to second chamber 193 is a hollow cavity that is shaped like a socket that is the inverse of multi-sided cylinder 192 so that when multi-sided cylinder 192 comes in contact with first chamber 194 they interlock and pivoting element 190 that is fastened to multi-sided cylinder 192 through connecting shaft 191 is prevented from pivoting.

FIG. 18B illustrates a cross section perspective view of multi-sided cylinder 192 of FIG. 18A wherein multi-sided cylinder 192 is about to enter the inverse multi-sided socket 194 of cylindrical chamber 195.

FIG. 18C illustrates a cross section perspective view of the multi-sided cylinder 192 of FIG. 18A wherein multi-sided cylinder 192 is thrust into cylindrical chamber 195 and is interlocked with the inverse multi-sided socket 194 of cylindrical chamber 195, thereby freezing the rotation of pivoting element 190 relative to cylindrical chamber 195.

FIG. 19A illustrates yet another manifestation of the concept of this invention. Thus, this example non-limiting implementations illustrates a three dimensional perspective view of a multi-sided cylinder 192 that is fastened to pivoting element 190 on one side and is connected to protruding shaft 191 that is round, smooth, and tubular on the other side, and a cylindrical chamber 195 that is divided into a first chamber 193 and a second chamber 194. The second chamber 194 is a multi-sided hollow cavity that is shaped like a socket and is positioned at the wide open end of cylindrical chamber 195 and is the inverse of multi-sided cylinder 192 so that when multi-sided cylinder 192 comes in contact with first chamber 194 they interlock and pivoting element 190 that is fastened to multi-sided cylinder 192 is prevented from pivoting. However, when protruding shaft 191 first comes in contact with second chamber 194, pivoting element 190 that is fastened to multi-sided cylinder 192 is allowed to continue to pivot freely around the axis of cylindrical chamber 195. First chamber 193 that is adjacent to second chamber 194 is round, smooth, and tabular and is used to accommodate protruding shaft 191 when multi-sided cylinder 192 interlocks with second chamber 194.

FIG. 19B illustrates a cross section perspective view of multi-sided cylinder 192 of FIG. 19A wherein multi-sided cylinder 192 is about to enter the inverse multi-sided socket 194 of cylindrical chamber 195.

FIG. 19C illustrates a cross section perspective view of the multi-sided cylinder 192 of FIG. 19A wherein multi-sided cylinder 192 is thrust into cylindrical chamber 195 and is interlocked with the inverse multi-sided socket 194 of cylindrical chamber 195, thereby freezing the rotation of pivoting element 190 relative to cylindrical chamber 195.

FIG. 20A illustrates yet another manifestation of the concept of this invention. Thus, this example non-limiting implementation illustrates a three dimensional perspective view of a multi-sided cylinder 192 that is fastened to pivoting element 190 on one side and is connected to protruding shaft 191 that is round, smooth, and tubular on the other side, and a cylindrical chamber 195 configured with a multi-sided hollow cavity that is shaped like a socket 194 that is the inverse of the multi-sided cylinder 192 so that when multi-sided cylinder 192 is thrust into the multi-sided socket 194, multi-sided cylinder 192 and cavity 194 interlock freezing the rotation of pivoting element 190 relative to cylindrical chamber 195. However, when protruding shaft 191 that is round, smooth, and tubular first enters the inverse multi-sided socket 194 of cylindrical chamber 195, pivoting element 190 is allowed to continue pivoting freely around the axis of cylindrical chamber 195.

FIG. 20B illustrates a cross section perspective view of multi-sided cylinder 192 of FIG. 20A wherein multi-sided cylinder 192 is about to enter the inverse multi-sided socket 194 of cylindrical chamber 195.

FIG. 20C illustrates a cross section perspective view of the multi-sided cylinder 192 of FIG. 20A wherein multi-sided cylinder 192 is thrust into cylindrical chamber 195 and is interlocked with the inverse multi-sided socket 194 of cylindrical chamber 195, thereby freezing the rotation of pivoting element 190 relative to cylindrical chamber 195.

FIG. 21A illustrates yet another manifestation of the concept of this invention. Thus, this example non-limiting manifestation illustrates a three dimensional perspective view of a multi-sided cylinder 192 that is fastened to pivoting element 190 through a connecting shaft 191 and a cylindrical chamber 195 that is divided into a first chamber 193 and a second chamber 194. The second chamber 194 is positioned at the wide open end of cylindrical chamber 195 and is a hollow cavity that is shaped like a socket that is the inverse of multi-sided cylinder 192 so that when multi-sided cylinder 192 comes in contact with second chamber 194 they interlock and pivoting element 190 that is fastened to multi-sided cylinder 192 through connecting shaft 191 is prevented from pivoting. First Chamber 193 is round, smooth, and tubular so that when multi-sided cylinder 192 is positioned in first chamber 193, pivoting element 190 that is fastened to multi-sided cylinder 192 through connecting shaft 191 is allowed to pivot freely around the axis of cylindrical chamber 195.

FIG. 21B illustrates a cross section perspective view of multi-sided cylinder 192 of FIG. 21A wherein multi-sided cylinder 192 is interlocked with the inverse multi-sided socket 194 of cylindrical chamber 195, thereby freezing the rotation of pivoting element 190 relative to cylindrical chamber 195.

FIG. 21C illustrates a cross section perspective view of the multi-sided cylinder 192 of FIG. 21A wherein multi-sided cylinder 192 has been thrust into first chamber 193 and pivoting element 190 that is fastened to multi-sided cylinder 192 through connecting shaft 191 is allowed to pivot freely around the axis of cylindrical chamber 195.

FIG. 22A illustrates yet another manifestation of the concept of this invention using an alternative locking technique. Thus, this example non-limiting manifestation illustrates a three dimensional perspective view of a pivoting element 190 which includes a hollow shaft that includes a locking area 192 that consists of a hollow multi-sided inner cylinder, and an unlocking area 191 that consists of a hollow round and smooth tubular area, and a wider cylindrical chamber 195 that can envelop the locking and unlocking areas of pivoting element 190 and that is divided into an unlocking area 193 that consist of a hollow round and smooth tubular area and a locking area 194 that consists of a protruding multi-sided locking shaft. The unlocking area 193 is positioned at the wide open end of cylindrical chamber 195 so that when multi-sided locking area 192 is positioned inside cylindrical chamber 195, in the unlocking area 193, pivoting element 190 that is fastened to locking area 192 through unlocking area 191 is allowed to pivot freely around the axis of cylindrical chamber 195, but when multi-sided locking area 192 is thrust further into cylindrical chamber 195, it interlocks with protruding multi-sided locking shaft 194 and pivoting element 190 that is fastened to multi-sided locking area 192 through unlocking area 191 is prevented from pivoting.

FIG. 22B illustrates a cross section perspective view of multi-sided locking area 192 of FIG. 22A wherein multi-sided locking area 192 is about to intersect with the inverse multi-sided locking shaft 194 of cylindrical chamber 195.

FIG. 22C illustrates a cross section perspective view of the multi-sided cylinder 192 of FIG. 22A wherein multi-sided locking area 192 has been thrust further into cylindrical chamber 195 and is interlocked with the inverse multi-sided locking shaft 194 of cylindrical chamber 195, thereby freezing the rotation of pivoting element 190 relative to cylindrical chamber 195.

Exemplary Concept Embodiments:

The following figures illustrate how exemplary mechanisms that embody the concept of this invention can lead to a variety of novel and useful designs and applications that may enhance the functionality, ergonomic, and enjoyment of electronic display and input devices as well as the functionality of other devices such as lamps, clamps, and other mechanisms that could benefit from discrete load bearing rotation locking mechanisms.

The following non-limiting exemplary embodiments of the concept of this invention may look dissimilar, but they all share the same concept whereas two disks or cylinders with teeth or a combination of both that can interlock radially between their inner and outer surface areas, or frontal areas, or both, where one of the disks or cylinders is attached to a fixed surface area and the other disk or cylinder is attached to a pivoting arm, plate, or other kind of load bearing support element, and where one of the disks or cylinders is able to mesh (lock) and un-mesh (unlock) from the other disk or cylinder by protruding, retracting, or sliding laterally over a common, continuous or divided axis, shaft, or channel thereby freezing the angular position of the pivoting arm, plate, or other kind of load bearing support element with respect to the fixed surface area at the time the disks, cylinders, or a combination of both, mesh (lock) with each other and unfreezing the pivoting arm, plate, or other kind of load bearing support element to pivot freely with respect to the fixed surface area when the disks, cylinders, or combination of both un-mesh (unlock) from one another.

What primarily differentiates one exemplary mechanism from another is the kind and structure of the interlocking disks and cylinders, the presence, location, and type of a biasing structure that biases one of the disks or cylinders along their common axis, shaft, or channel, and the type of user-manipulable controls for engaging and disengaging the interlocking disks or cylinders e.g. press or pull and release of a button or other control.

The first non-limiting exemplary embodiment; Sliding Cylinder Rotation Lock Mechanism, is based on the illustrated exemplary concept manifestation of FIGS. 17A-17C but instead of a multi-sided cylinder that is attached to a pivoting element being thrust into an inverse multi-sided cylinder or socket that is attached to a fixed surface, a multi-sided cylinder that is housed in a fixed surface protrudes into an inverse multi-sided cylinder or socket that is attached to a pivoting element in order to interlock and freeze the angular position of the pivoting element at the time the multi-sided cylinder was partially thrust into the socket of the pivoting element.

The second non-limiting exemplary embodiment; Sliding Shaft Rotation Lock Mechanism, is based on the illustrated exemplary concept manifestation of FIGS. 18A-18C where an exemplary multi-sided cylinder or shaft that is keyed into a pivoting element is thrust into a cylindrical chamber or socket that is assumed to be attached to a fixed surface. The socket is divided into a first chamber and a second chamber. The second chamber is positioned at the wide open end of the socket and is round, smooth, and tubular so that when the multi-sided cylinder or shaft that is keyed into the pivoting element is positioned in the second chamber, the pivoting element is allowed to pivot freely around the axis of the socket. The first chamber that is adjacent to second chamber is a hollow multi-sided cylinder that is shaped like the inverse of the multi-sided cylinder or shaft that is keyed into a pivoting element, so that when the multi-sided cylinder or shaft that is keyed into the pivoting element comes in contact with the first chamber of the socket they interlock and freeze the rotational position of the pivoting element with respect to the fixed surface at whatever angular position the pivoting element was in at the time the multi-sided cylinder or shaft that is keyed into the pivoting element was thrust into the first chamber of the socket.

The third non-limiting exemplary embodiment; Retracting Cylinders Rotation Lock Mechanism, is also based on the illustrated exemplary concept manifestation of FIGS. 17A-17C where a multi-sided cylinder that is attached to a pivoting element is thrust into an inverse multi-sided cylinder or socket that is attached to a fixed surface in order to interlock and freeze the rotational position of the pivoting element with respect to the fixed surface at the time the multi-sided cylinder was thrust into the socket—but whereas the exemplary concept manifestations of FIGS. 17A-17C are based on one multi-sided cylinder interlocking with one hollow inverse multi-sided cylinder or socket, the non-limiting exemplary embodiment of the Retracting Cylinders Rotation Lock Mechanism employs a pivoting element that is traversed by a channel that encloses a pair of retractable stepped multi-sided cylinders that are inversely aligned at either side of a biasing spring inside the channel. The spring biases the retractable stepped multi-sided cylinders into protruding outside the channel in order to interlock with a pair of inverse multi-sided cylinders or sockets aligned to a fixed surface on either side of the channel in order to freeze the angular position of the attached pivoting element at the time the stepped multi-sided cylinders are thrust into the opposing sockets attached to the fixed surface. Furthermore, the design of the Retracting Cylinders Rotation Lock Mechanism provides that multiple opposing sockets be aligned vertically along the edges of the pivoting element in order to enable the pivoting element to attach and detach from the fixed surface at multiple locations along the length of the pivoting element in order to enable height adjustment as well as angular adjustment for the pivoting support element.

The fourth non-limiting exemplary embodiment; Interlocking Cylinders Rotation Lock Mechanism, is based on the illustrated exemplary concept manifestation of FIGS. 21A-21C but instead of a multi-sided cylinder that is attached to a pivoting element through a connecting shaft meshing with a hollow cylindrical chamber with two chambers attached to a fixed surface where the interlocking between the multi-sided cylinder and the cylindrical chamber occurs upon first contact between the opposing cylinders and further trust of the pivoting element into the cylindrical chamber results in allowing the pivoting element to rotate freely around the axis of the cylindrical chamber; two radially concentric hollow cylinders that can mesh radially along a narrow portion of their inner and outer surface areas closest to the wide open end of their cylindrical chambers are positioned inversely along a common shaft and separated with a biasing spring that keeps them separated but partially overlapping and interlocked along a narrow portion of their edges. One cylinder is fastened to a fixed surface and a pivoting element is attached to the other. When the cylinder that is attached to the pivoting element is thrust into the cylinder that is fastened into the fixed surface, the interlocking cylinders further overlap and their narrow interlocking edges disengage enabling the pivoting element to rotate freely around their common axis, but as soon as the cylinder that is attached to the pivoting element is released, the biasing spring thrusts the cylinder back to its default locking position and freezes the angular position of the pivoting element with respect to the fixed surface at whatever angular position the pivoting element was in at the time the cylinder that is attached to the pivoting element was released.

The following figures illustrate the mechanics of the example non-limiting load bearing rotation lock mechanisms referenced above and demonstrate the exemplary embodiments of the mechanisms in action. The displayed embodiments are shown for exemplary purposes; the various parts shown in the provided illustrations, such as gears, shafts, hinges, openings, springs, buttons, and plates can have various shapes and sizes to fit the desired form and function of the devise in which they are integrated.

Sliding Cylinder Rotation Lock Mechanism

Figure 23A:
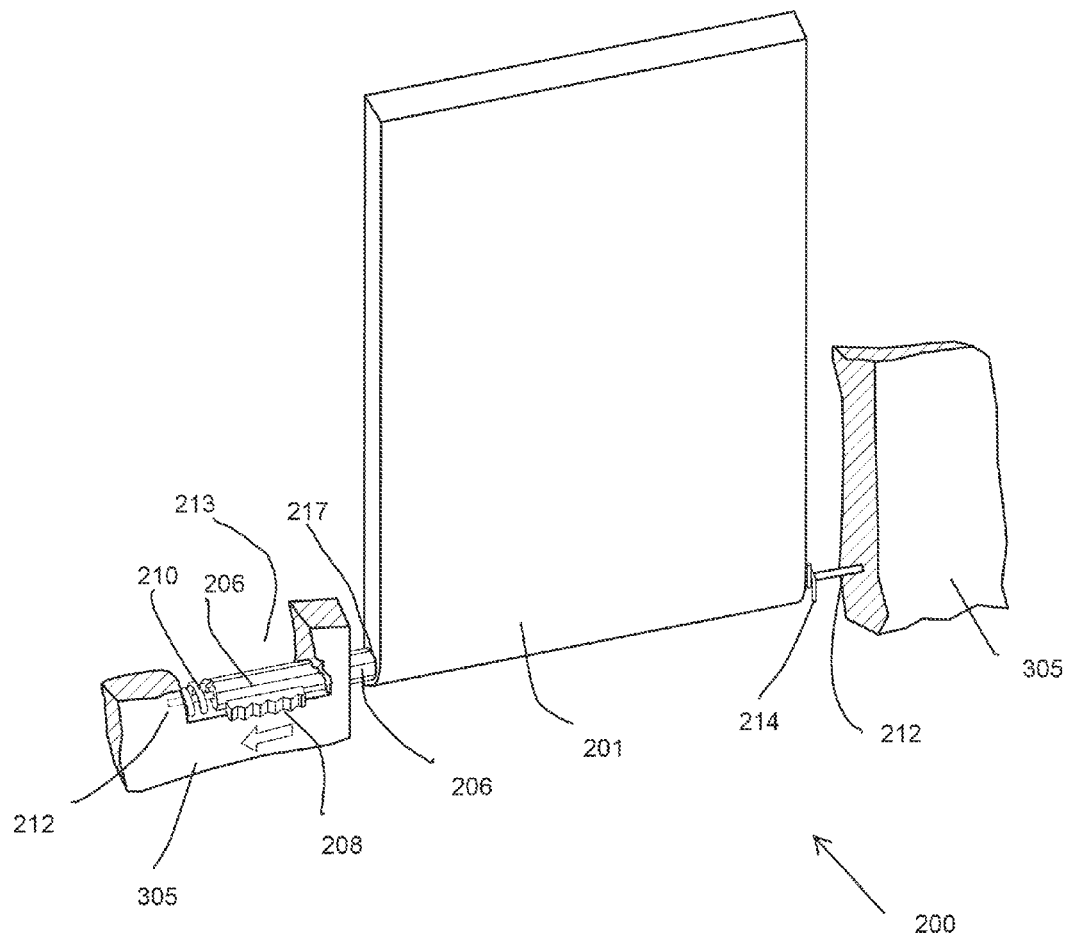
FIGS. 23A to 23E together are a sequence of three-dimensional drawings of an example non-limiting rotation lock mechanism that when displayed one after another provide a flip chart animation showing how a multi-sided cylinder can be protruded and retracted from a fixed surface area to lock the angular rotation of a pivoting support element which can be used not only prop practically any phone or computer tablet, or display device, to any desired viewing angle, but to also provide the necessary support to withstand the load and the pressure of hand writing at any desired writing angle with respect to a surface on which the device is seated.
Figure 23B:
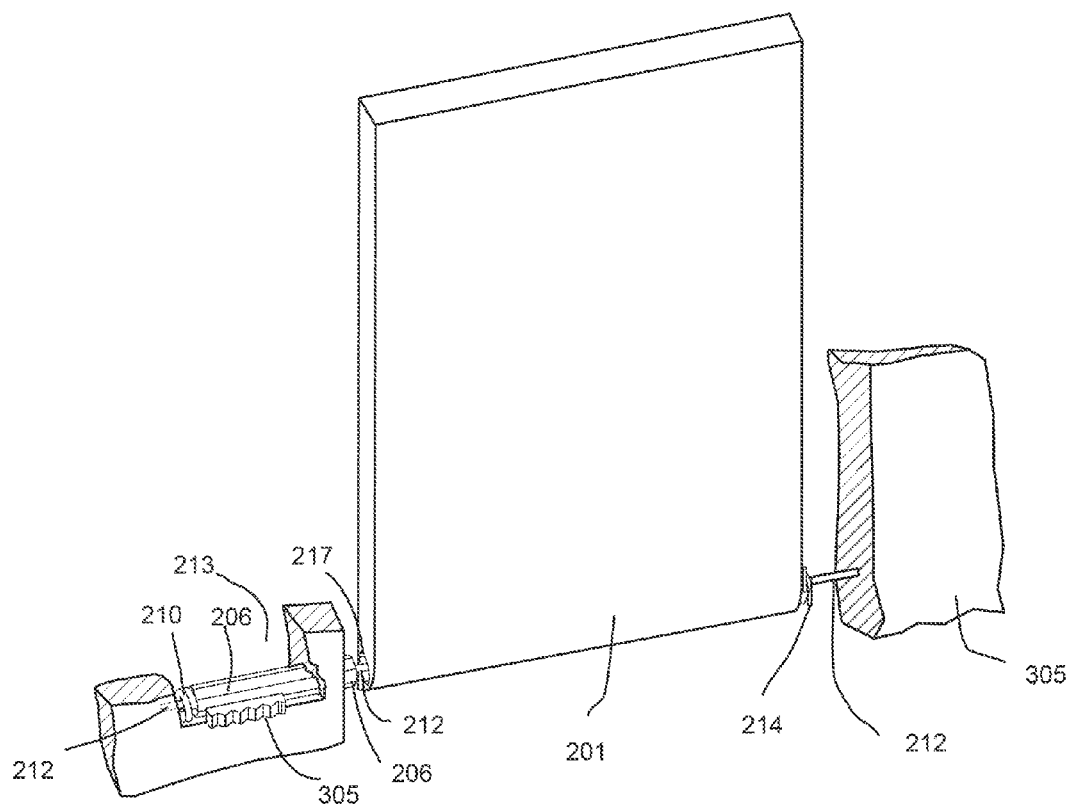
Figure 23C:
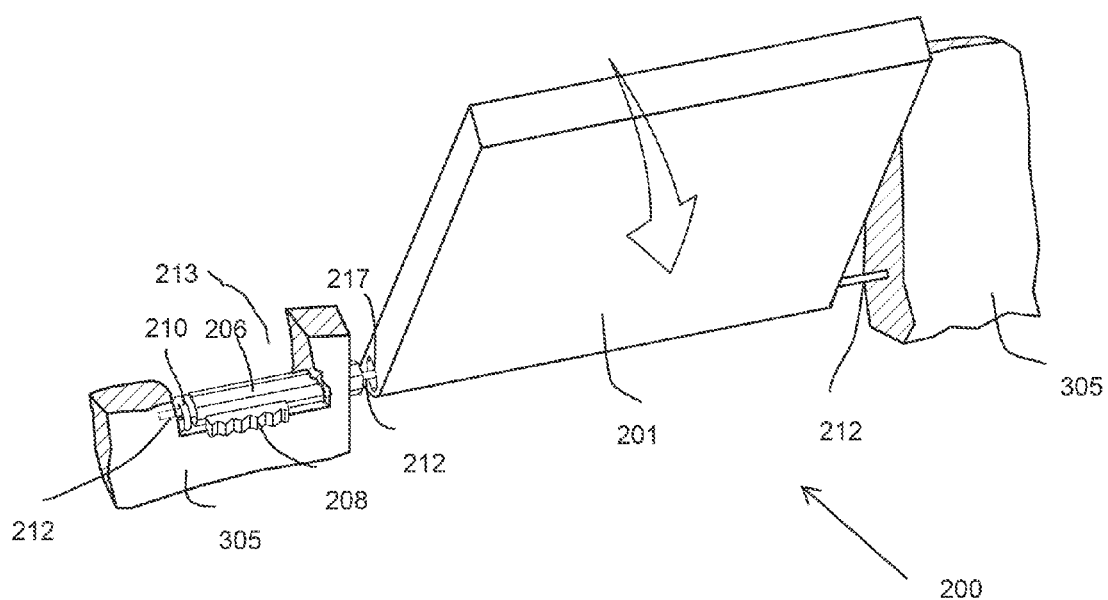
Figure 23D:
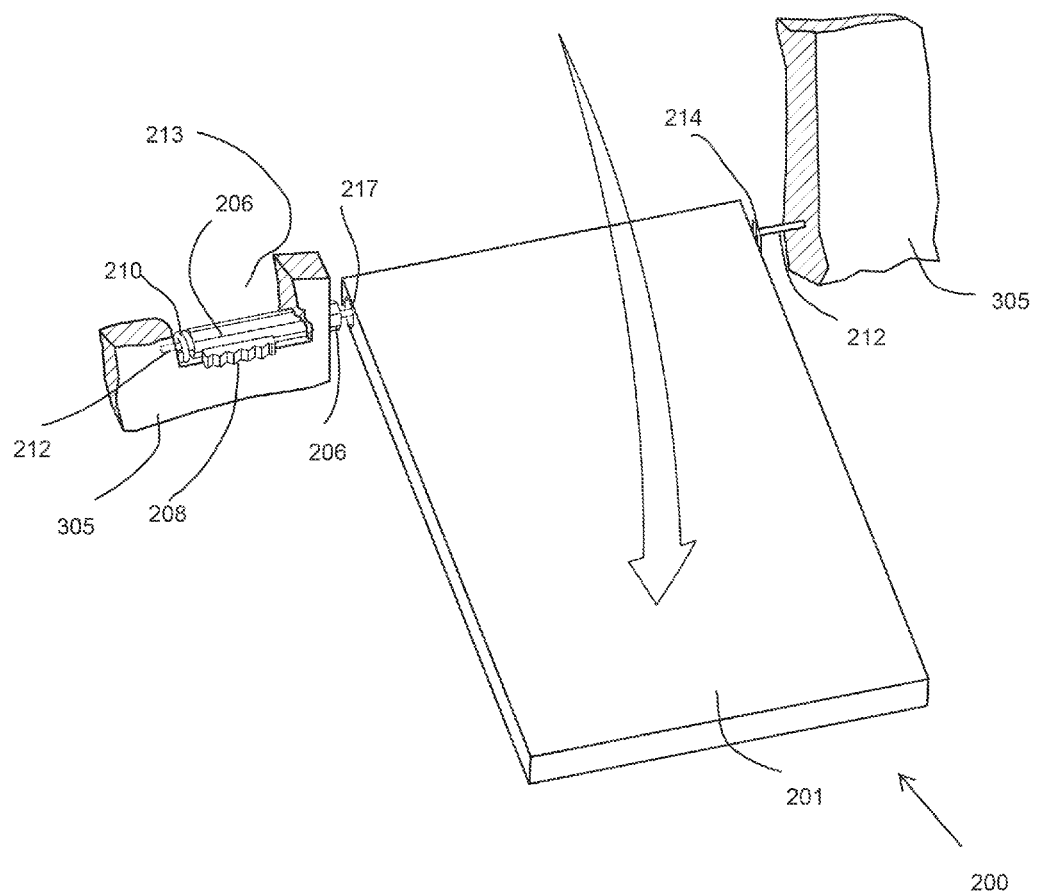
Figure 23E:
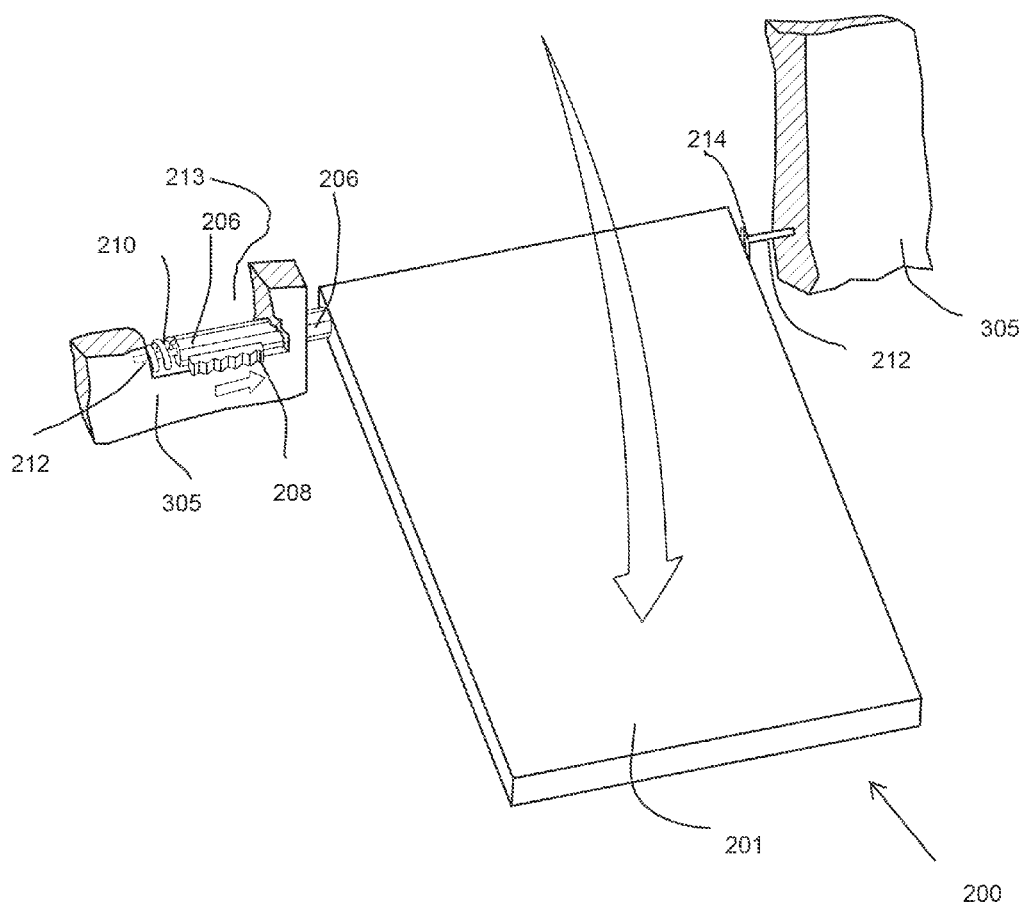
Figure 24A:
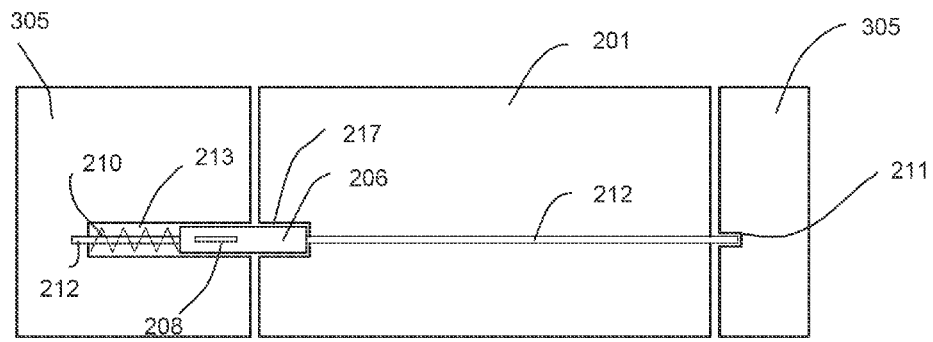
FIG. 24A to 24D together represent a sequence two dimensional drawings of an example non-limiting rotation lock mechanism showing how a multi-sided cylinder can be protruded and retracted from a fixed surface area to lock the angular rotation of a pivoting support element where the sliding cylinder interlocks with an inverse hollow cylinder by sliding over a common axis.
Figure 24B:
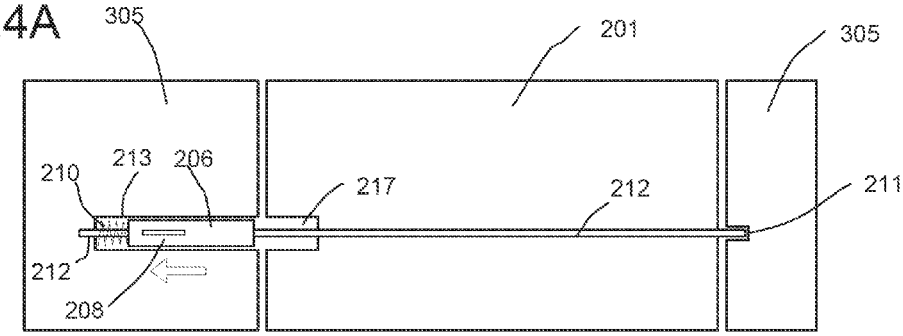
Figure 24C:
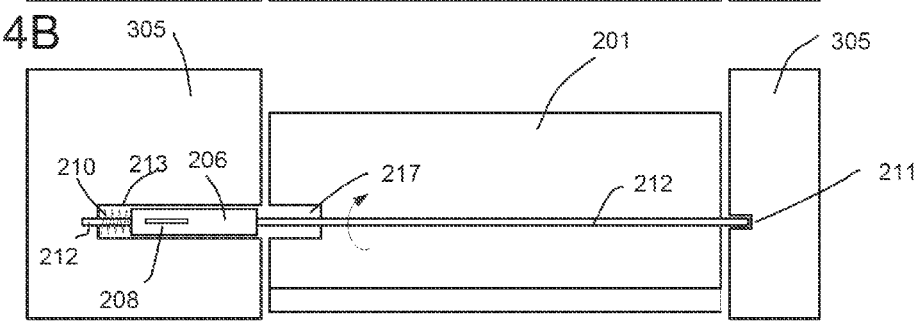
Figure 24D:
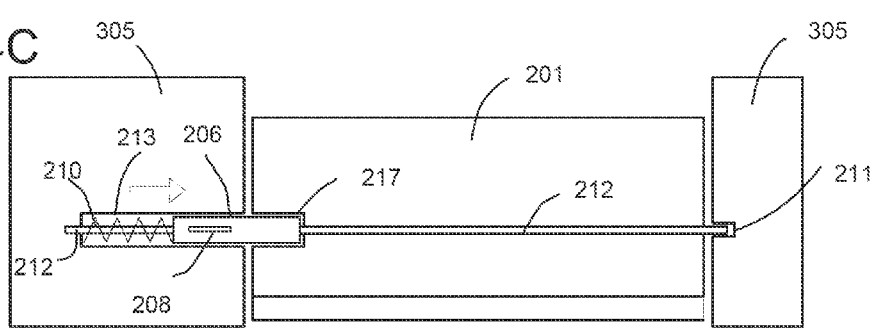
Figure 25A:
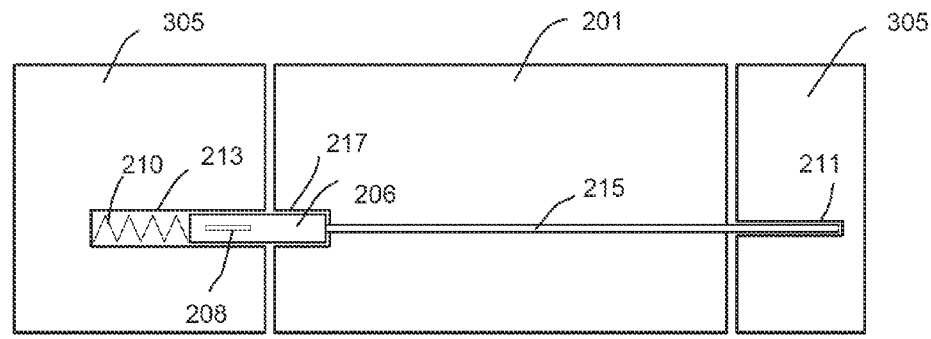
FIGS. 25A to 25D together represent a sequence two dimensional drawings of an example non-limiting rotation lock mechanism showing how a multi-sided cylinder can be protruded and retracted from a fixed surface area to lock the angular rotation of a pivoting support element where the sliding cylinder is rigidly attached to a shaft, and together act like a plunger as they slide along the cylinder's axis until the sliding cylinder straddles the inverse hollow cavities in the fixed surface area and the pivoting support element thereby freezing the angular position of the pivoting element with respect to the fixed surface area.
Figure 25B:
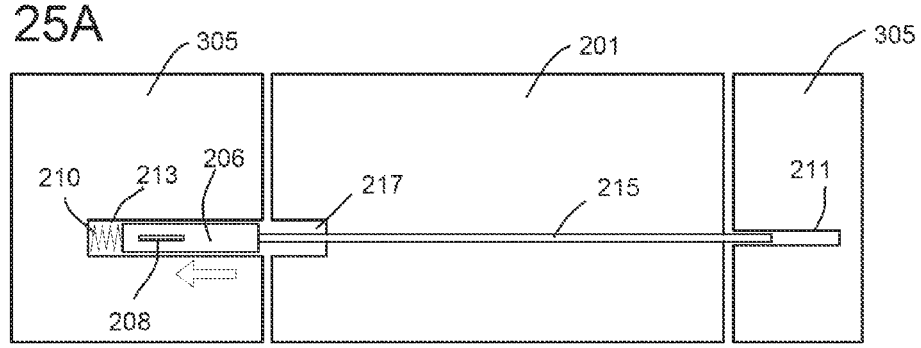
Figure 25C:
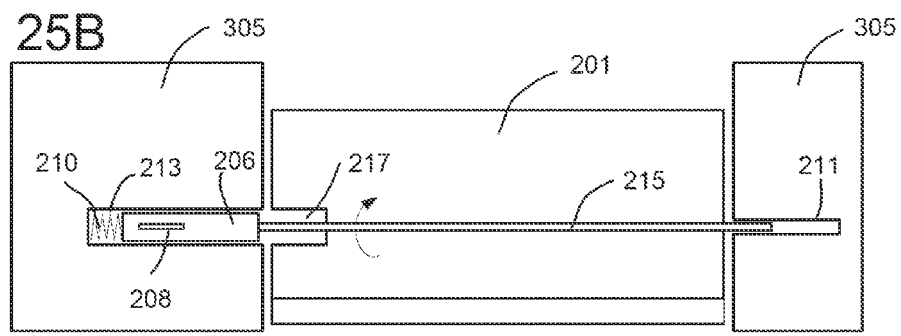
Figure 25D:
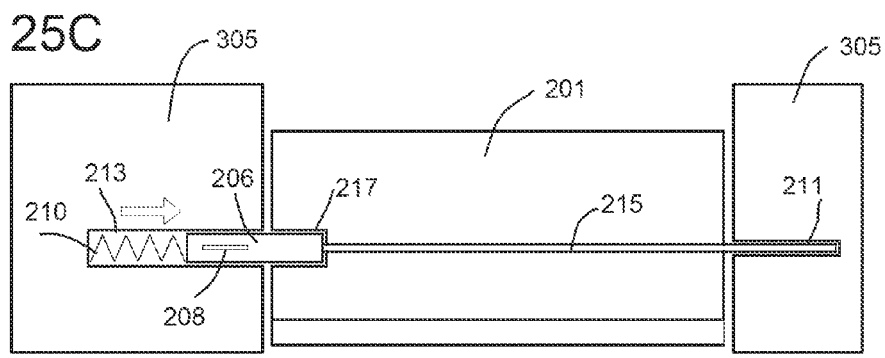

FIG. 23A illustrates an example non-limiting mechanism of the concept of this invention with a multi-sided cylinder 206 that is housed in a fixed surface 305 which protrudes into an inverse multi-sided cylinder or socket 217 that is attached to a pivoting element 201 in order to interlock and freeze the angular position of the pivoting element 201 at the time the multi-sided cylinder 206 was partially thrust into the socket 217 of the pivoting element 201. More specifically, the mechanism revolves around the pivoting support element 201 being seated in a recess of a back panel of a tablet or tablet support plate, wherein the supporting element 201 is movable between a retracted position and at least two extended positions relative to the body. The supporting element 201 being disposed in the flush position within the body in its retracted position and extending from the body to provide orientation and support in its extended positions, and wherein the pivoting support element 201 is traversed by a tube that rotates snugly around a shaft 212. At one end of the tube, the pivoting support element enlarges to incorporate a hollow multi-sided or toothed cylinder 217 that is configured to receive a multi-sided or toothed cylinder 206. At the opposing end of the tube with the hollow multi-sided or toothed cylinder 217, is another hollow multi-sided or toothed cylinder or cavity 213 that may be drilled into the back panel of a tablet or a tablet support plate 305 and that is also configured to receive a multi-sided or toothed cylinder 206. The axis of the pivoting support element 201 is aligned with the axis of the fixed opposing hollow multi-sided or toothed cylinder 213 that is drilled into the back panel of the tablet or tablet support plate 305, and both cylinders are traversed by a common shaft 212.

Straddling the opposing hollow cylinders is a multi-sided, or multi-toothed sliding cylinder 206 that is mounted on the opposing cavities' common shaft 212 and that can slide laterally over the shaft between the two cavities.

The multi-sided or multi-toothed sliding cylinder 206 is shaped at each end to be the inverse shape of the hollow cylinders into which it may engage, or key into, and may not necessarily be of a uniform diameter throughout its length.

When the multi-sided or multi-toothed sliding cylinder 206 is retracted into the fixed hollow cylinder or cavity 213 that is drilled into the back panel of a tablet or tablet support plate 305 and fully disengaged from the hollow cylinder 217 of the pivoting support element 201, the pivoting support element 201 is free to pivot around the cylinders' common axis.

When the multi-sided or multi-toothed sliding cylinder 206 is partially thrust into the opposing hollow cylinder 217 of the pivoting support element 201 through the push of compression spring 210 and straddles both cavities, the multi-sided or multi-toothed sliding cylinder 206 interlocks with the hollow cylinder 217 of the pivoting support element 201, and the pivoting support element 201 locks into whatever angular position the pivoting support element was in at the time the multi-sided or multi-toothed sliding cylinder 206 was thrust into the hollow cylinder 217 of the pivoting support element. Multi-sided or multi-toothed sliding cylinder 206 may be disengaged from hollow cylinder 217 thought the pull of sliding button 208.

FIGS. 23A-23E together represent a sequence three dimensional drawings of an example non-limiting rotation lock mechanism based on the concept explained above that when displayed one after another provide a flip chart animation showing how the multi-sided cylinder 206 can be protruded and retracted from a fixed surface area 305 to lock the angular rotation of a pivoting element 201 which can be used not only prop practically any phone, phablet, or computer tablet, or display device, to any desired viewing angle, but to also provide the necessary support to withstand the load and the pressure of hand writing at any desired writing angle with respect to a surface on which the device is seated.

FIG. 24A-24D together represent a sequence two dimensional drawings of an example non-limiting rotation lock mechanism showing how a multi-sided cylinder 206 can be protruded and retracted from a fixed surface area 305 to lock the angular rotation of a pivoting support element 201 based on the concept explained above where the sliding cylinder 206 interlocks with the hollow cylinder 217 by sliding over common axis 212.

FIGS. 25A-25D together represent a sequence two dimensional drawings of an example non-limiting rotation lock mechanism showing how a multi-sided cylinder 206 can be protruded and retracted from a fixed surface area 305 to lock the angular rotation of a pivoting support element 201 based on the concept explained above where sliding cylinder 206 is rigidly attached to shaft 215 and together act like a plunger as they slide along the cylinders' common axis until sliding cylinder 206 straddles hollow cylinder 2013 and hollow cylinder 217 thereby freezing the angular position of pivoting element 201 with respect to fixed surface 305.

Figure 26A:
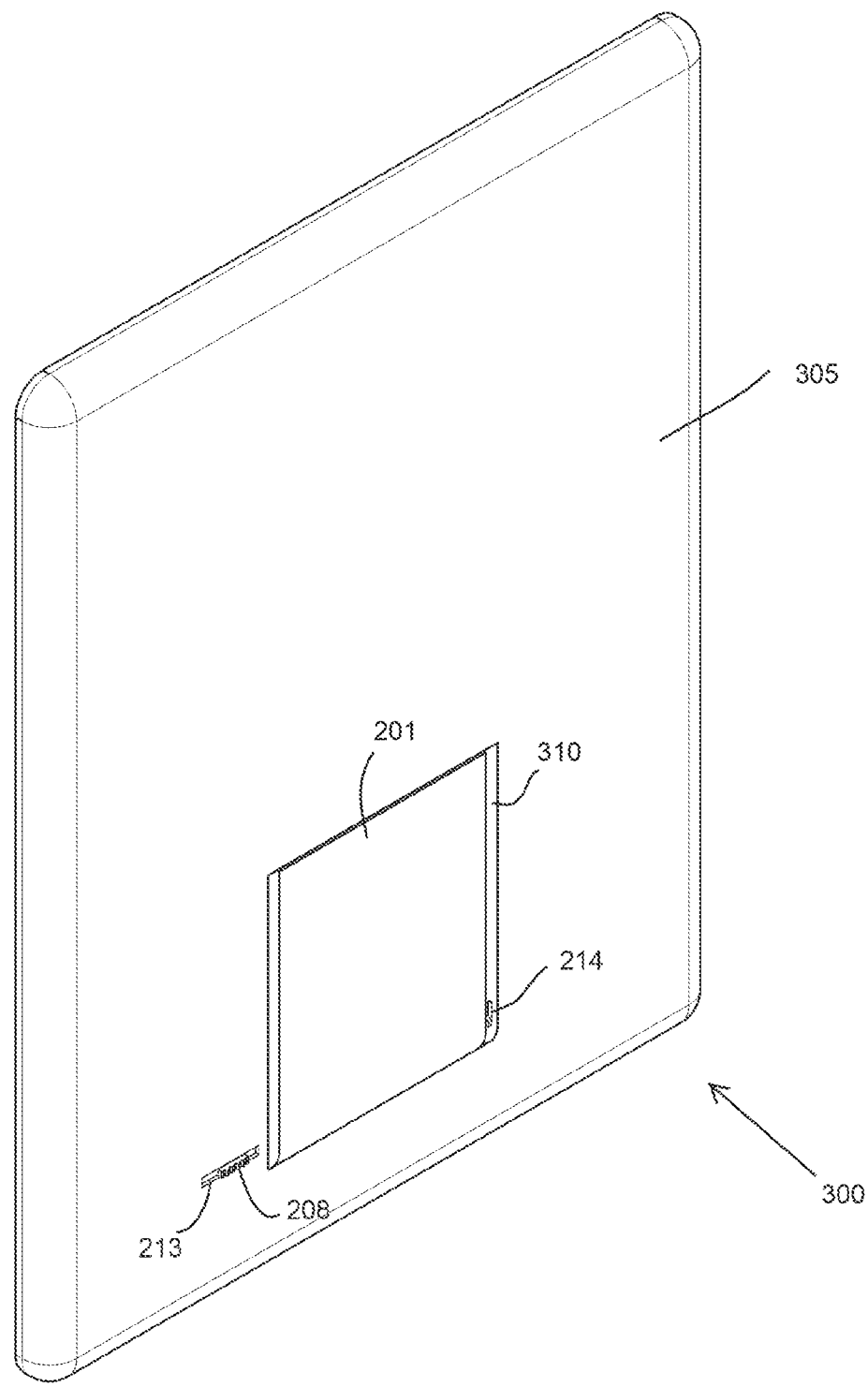
FIG. 26A illustrates the use of a non-limiting example of a sliding cylinder load-bearing rotation lock mechanism situated in the back of a tablet, "phablet", or smart phone, wherein the supporting element is disposed in the flush position within the body, in a retracted position and the sliding button is in the locked position.

FIG. 26A Illustrates the use of a non-limiting example of a sliding cylinder load-bearing rotation lock mechanism situated in the back of a tablet, "phablet", or smart phone 300, wherein the supporting element 201 is disposed in the flush position within the body, in a retracted position, and the sliding button 208 is in the locked position inside hollow cylinder 213.

Figure 26B:
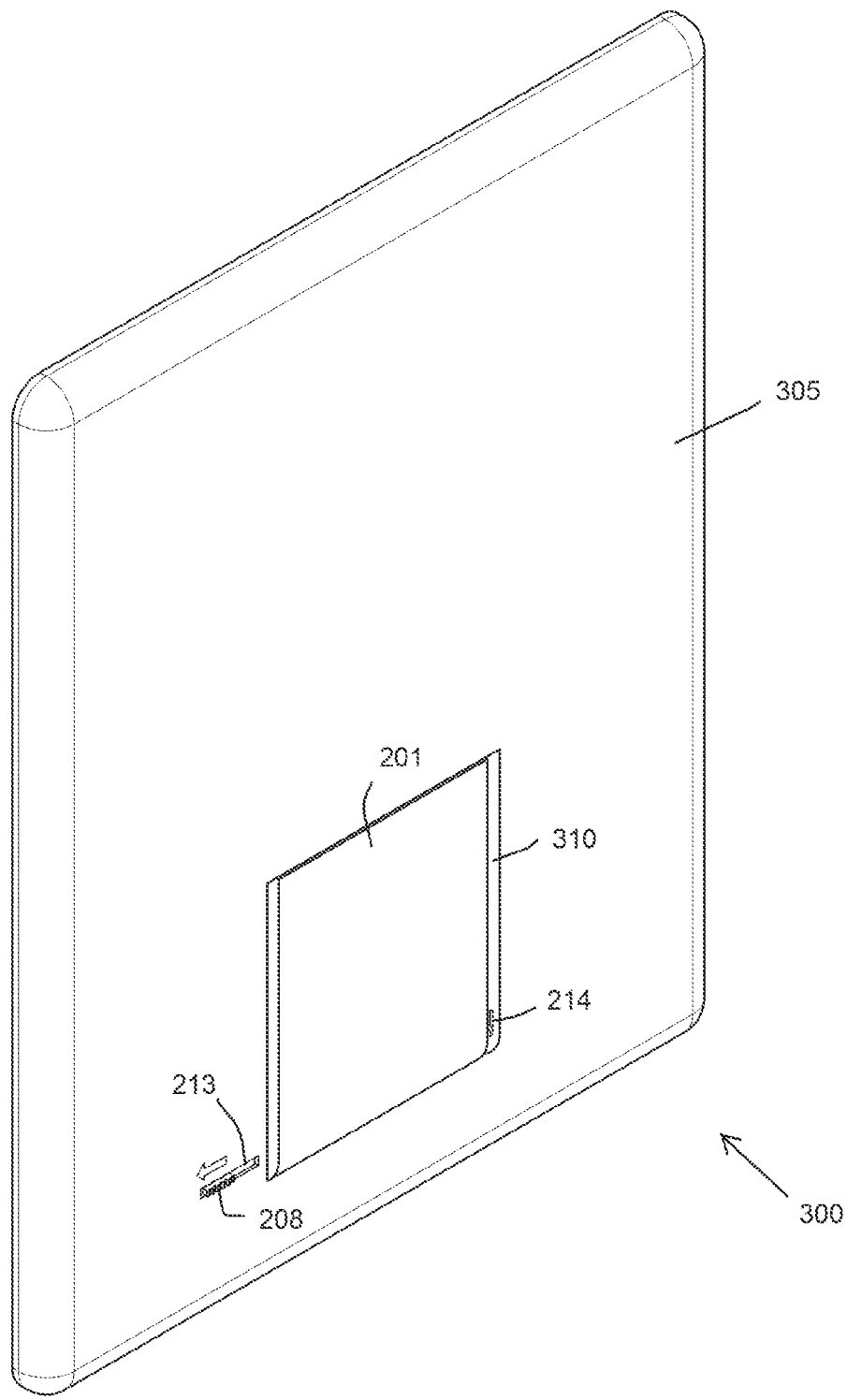
FIG. 26B illustrates the use of a non-limiting example of a sliding cylinder load-bearing rotation lock mechanism situated in the back of a tablet, "phablet", or smart phone, wherein the supporting element is disposed in the flush position within the body, in a retracted position and the sliding button is in the unlocked position, pulling the multi-sided or multi-toothed sliding cylinder out of the cavity of the pivoting support element and freeing the pivoting support element to pivot around its axis.

FIG. 26B Illustrates the use of a non-limiting example of a sliding cylinder load-bearing rotation lock mechanism situated in the back of a tablet, "phablet", or smart phone 300, wherein the supporting element 201 is disposed in the flush position within the body, in a retracted position and the sliding button 208 is in the unlocked position, pulling the multi-sided or multi-toothed sliding cylinder 206 out of hollow cylinder or cavity 217 of the pivoting support element 201 and freeing the pivoting support element 201 to pivot around its axis.

FIG. 26C Illustrates the use of a non-limiting example of a sliding cylinder load-bearing rotation lock mechanism situated in the back of a tablet, "phablet", or smart phone 300, wherein the supporting element 201 is disposed in a position extending from the body of the tablet in order to provide orientation and support for the tablet 300.

FIG. 26D, is a close up of an optional spring 214 at one edge of support element 201 that sets a default angular position for support element 201 where sliding button 208 had been pulled and the multi-sided or multi-toothed sliding cylinder 206 had been disengaged from hollow cylinder 217 of pivoting support element 201.

Figure 27:
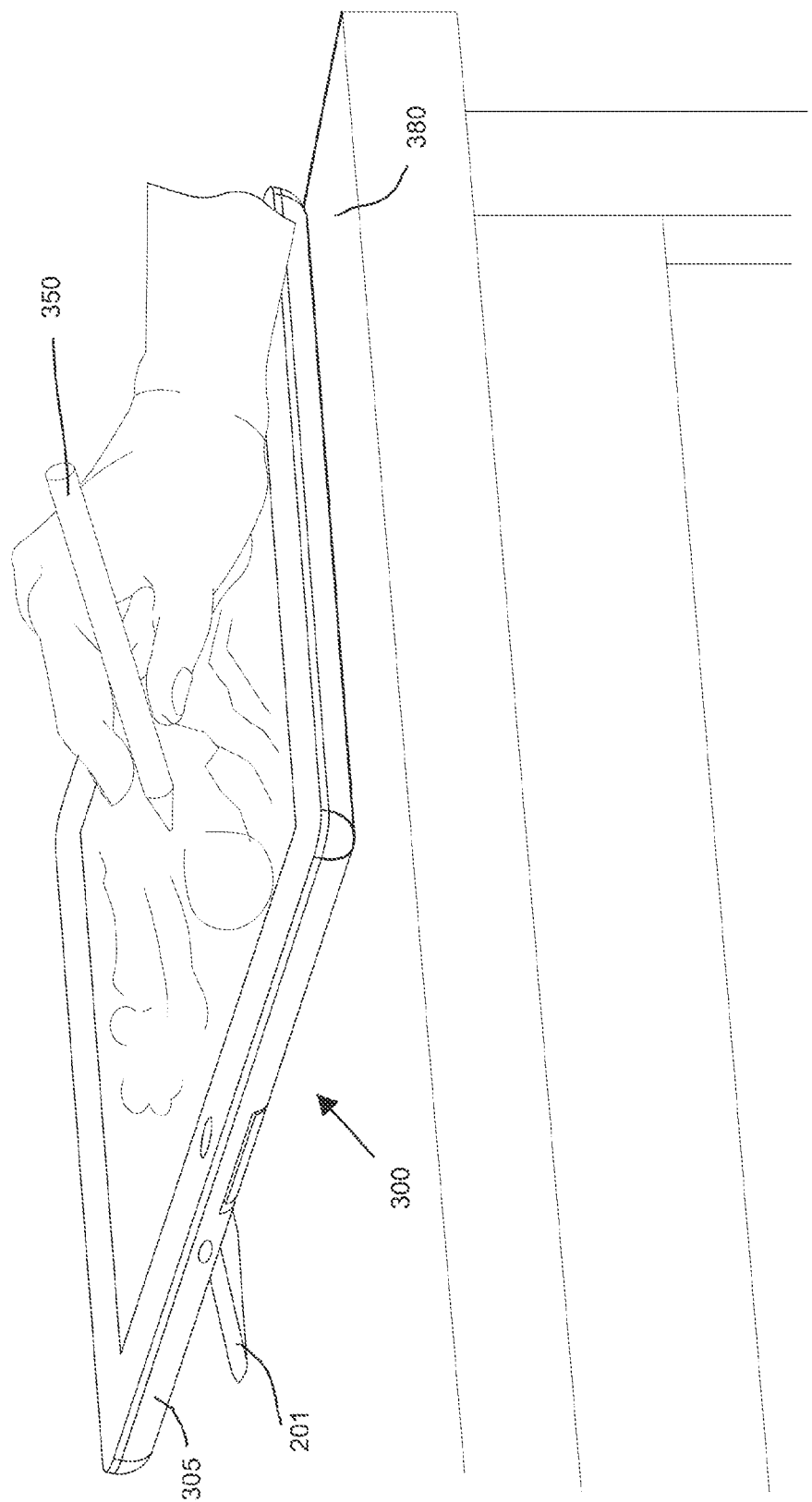
FIG. 27 illustrates a perspective view of a tablet against a fixed surface with its supporting element in a deployed configuration.

FIG. 27 illustrates a three-dimensional perspective view of a tablet 300 against a fixed surface 380 with its supporting element 201 in a deployed configuration. Such a configuration is useful for example where one wants to draw or to handwrite on the tablet.

Sliding Shaft Rotation Lock Mechanism

Figure 28:
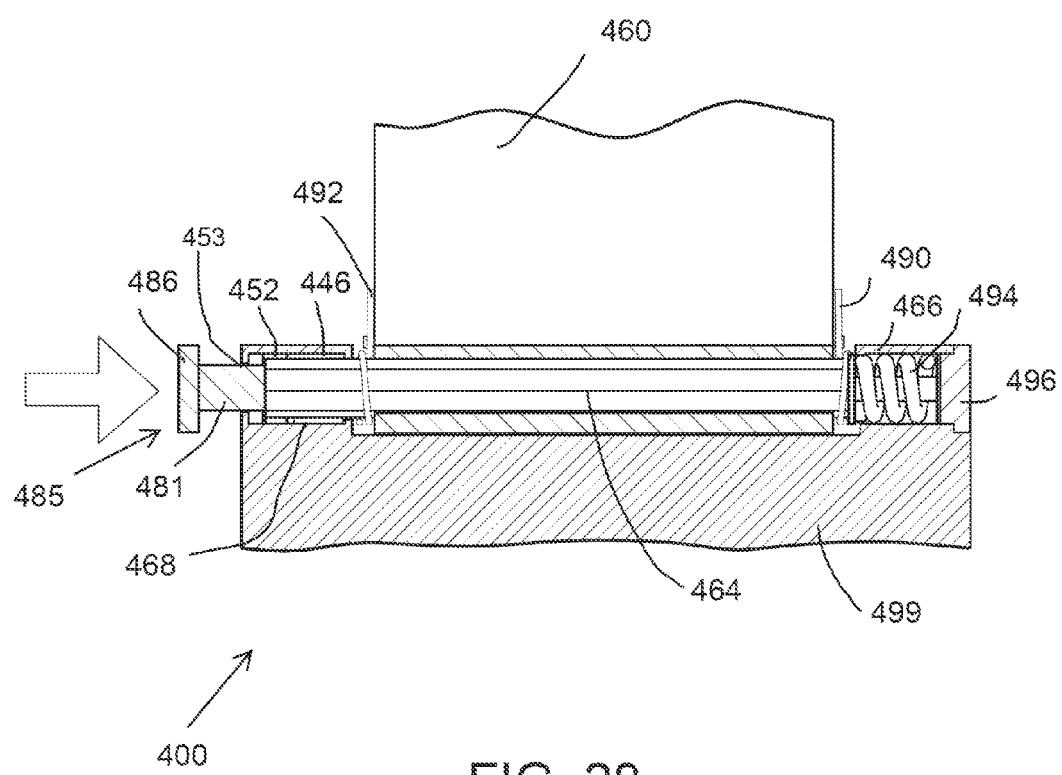
FIG. 28 illustrates a cross sectional view of an exemplary embodiment of a sliding shaft rotation lock mechanism that can fix the angular rotation of a load bearing hinge to multiple angles with respect to a fixed base with the press and release of its button.

FIG. 28 illustrates an example non-limiting mechanism of the concept of this invention with a sliding shaft rotation lock mechanism. The mechanism is based on the illustrated exemplary concept manifestation of FIGS. 18A-18C where an exemplary multi-sided cylinder or shaft 464 is keyed into a pivoting element 460 which is thrust into a cylindrical chamber or socket 468 that is assumed to be attached to a fixed surface 499. The cylindrical chamber 468 is divided into a first chamber 452 and a second chamber 446. The second chamber 446 is positioned at the wide open end of the cylindrical chamber 468 and is round, smooth, and tubular so that when the multi-sided cylinder or shaft 464 that is keyed into the pivoting element 460 is positioned in the second chamber 446, the pivoting element 460 is allowed to pivot freely around the axis of the cylindrical chamber or socket 468. The first chamber 452 that is adjacent to second chamber 446 is a hollow multi-sided cylinder that is shaped like the inverse of the multi-sided cylinder or shaft 464 that is keyed into pivoting element 460, so that when the multi-sided cylinder or shaft 464 that is keyed into the pivoting element 460 comes in contact with the first chamber 452 they interlock and freeze the rotational position of the pivoting element 460 with respect to the fixed surface 499 at whatever angular position the pivoting element 460 was in at the time the multi-sided cylinder or shaft 464 that is keyed into the pivoting element 460 was thrust into the first chamber 452 of cylindrical chamber 468. A spring 494 disposed in a chamber 466 in the right side of the rotation lock mechanism 400 may be used to push multi-sided cylinder or shaft 464 into a default position in chamber 452 of cylindrical chamber or socket 468. Furthermore, the figure also shows a circular opening 453 at the left edge of the two-chambered cylinder 468 into which a structure such as a push button can be inserted. The push button 485 consisting of a button cap 486 and a plunger 481 can be used to disengage the multi-sided cylinder or shaft 464 out of first chamber 452 and into second chamber 446 by compressing the spring 494 and freeing pivoting element 460 to freely pivot around its axis. Another feature of the sliding shaft rotation lock mechanism is the pair of default position springs 490 and 492. The optional springs 490 and 492 provide the sliding shaft rotation lock mechanism with a default position when the button cap 485 is pressed. The optional springs 490 and 492, which may consist of one or more loops, loop around the shaft 464 and attach from one side to pin fasteners located on either side of the pivoting element 460, and from the other side, they can attach into holes drilled into the middle of the side of fixed surface 499.

FIG. 29A illustrates a cross section of another non-limiting embodiment of a sliding shaft rotation lock mechanism hinge showing a spring 494 disposed in a chamber in the right side cylinder of the hinge 466 pushing a spur gear 448 into an internal gear 452 on the left side cylinder 468 through a shaft 464, locking a hinge plate 460 in its current angular position. The force exerted by spring 494 also pushes button 485 outwardly to a protruding, locked position.

FIG. 29B illustrates a cross section of the non-limiting embodiment of FIG. 29A showing the button 485 being pressed into the left side cylinder of the hinge 468 against the force of spring 494, pushing a spur gear 448 out of engagement with internal gear 452, compressing the spring 494, and freeing the hinge plate 460 to pivot around the axis of the hinge. Button 485 can be pressed by a finger or thumb (see for example FIG. 31).

FIG. 29C illustrates a cross section of the non-limiting embodiment of FIG. 29B showing a spring 494 in the right side cylinder of the hinge 466 upon release of button 485 pushing a spur gear 448 back into internal gear 452 of the left side cylinder 468 through the shaft 464, locking the hinge plate 460 in whatever angular position it was in at the time of the release of the button 485.

FIG. 30 illustrates a three-dimensional exploded view representation of an example non-limiting sliding shaft rotation lock mechanism 400 showing how the individual components fit together to make the device work. In particular, this illustration displays optional additional springs 490 and 492, and associated restraining pin fasteners 463 and 469, and holes, 465 and 467. The optional springs 490 and 492 provide the rotation lock mechanism with a default position when the button 485 is pressed, which can be useful in some applications.

The optional springs 490 and 492, which may consist of one or more loops, loop around the shaft 464 and attach, from one side, to pin fasteners 463 and 469, located on either side of the center hinge plate 460, and from the other side, they can attach either to corresponding pin fasteners on the left and right side cylinders 466 and 468, or they can be snugly secured into the base plate 499 by being inserted into holes 465 and 467 drilled into the middle of the side of the base plate 499. These springs provide a default angular position for the central hinge plate 460 when the button 485 is pushed and its plunger 481 disengages the spur gear from the internal gear. It also prevents the center hinge plate 460 from collapsing into the base plate 499 when the button is pressed.

This illustration also shows how the threaded cap 496 provides support for the spring 494 and caps one side of the hinge. A similar threaded cap 488 with a drilled eyelet 489 is placed on the other side of the hinge to cap the other end of the hinge while allowing the threaded plunger 481 to pass through the threaded cap 488 and attach to the push-button top 486 through the threaded cavity 487 to form a full button 485.

Figure 31:
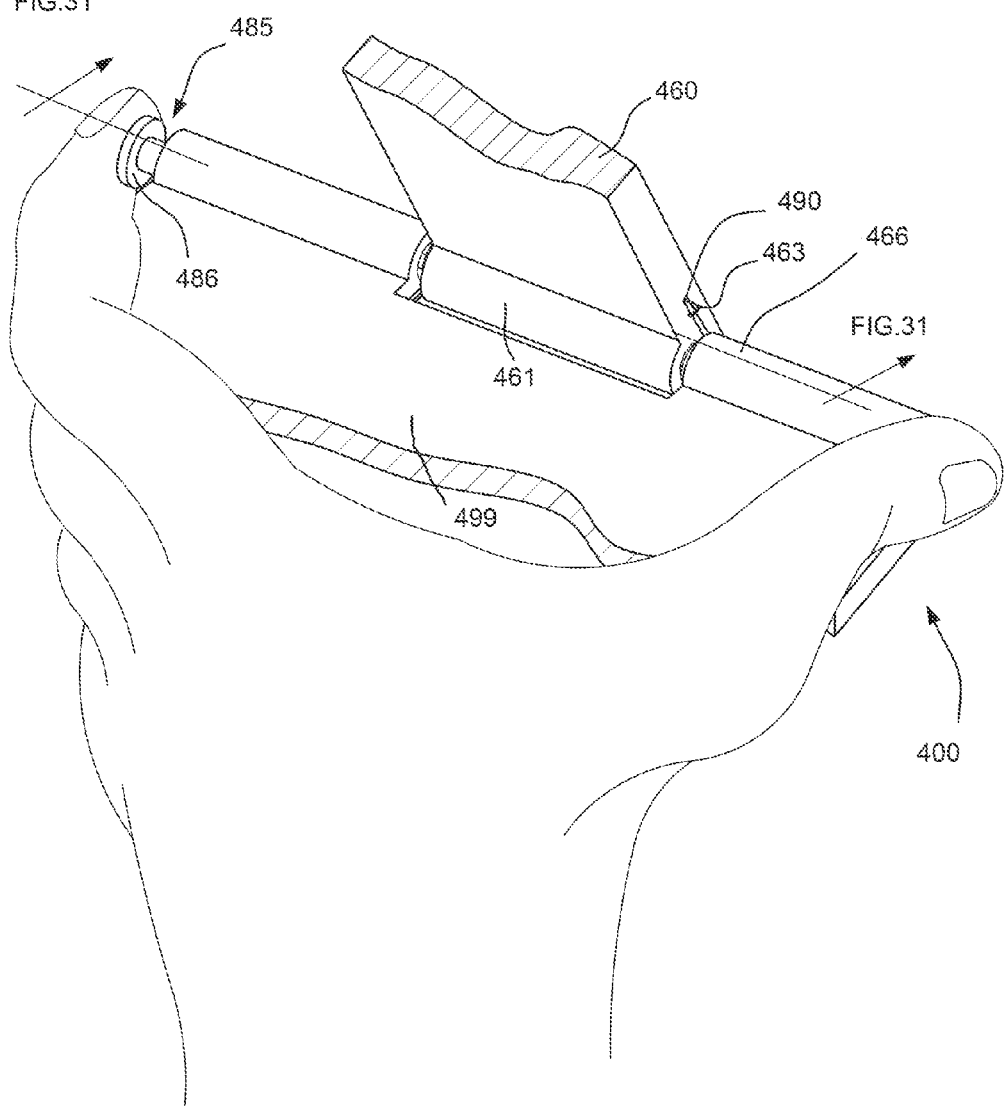
FIG. 31 is a three-dimensional representation in partial cross-section of a sliding shaft rotation lock mechanism in the "locked" position (button un-pressed) with the hinge's mid-section in the forward leaning position and a user depressing the button to allow the hinge to rotate.

FIG. 31 shows a 3D representation of the initial fixed angular position of a center hinge plate 460 of a hinge 400.

Example Flip Chart Animation

FIG. 32A-43A show how a load bearing rotation lock mechanism 400 can move a hinge plate 460 from one fixed angular position to another fixed angular position through the press of a button 485. These figures are structured as a flip chart style animation, so that repeated use of a down page key of a pdf or other viewer for viewing this patent can allow you to see how the structure works and rotates.

Figure 33A:
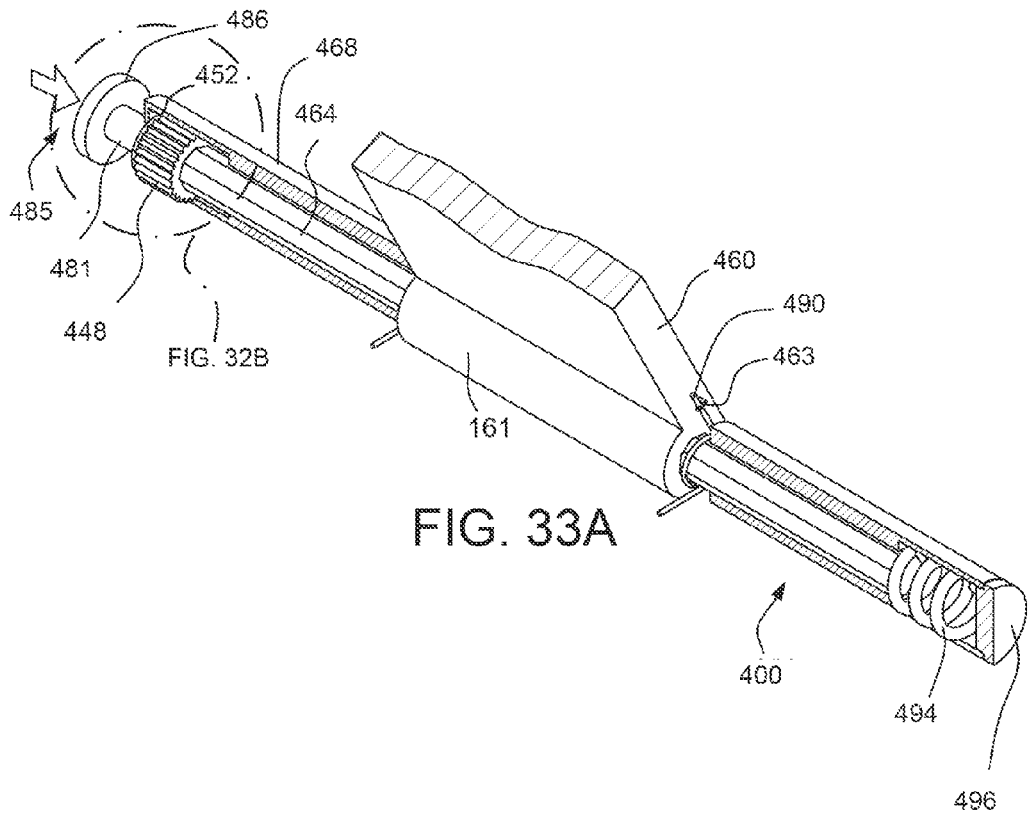
Figure 33B:
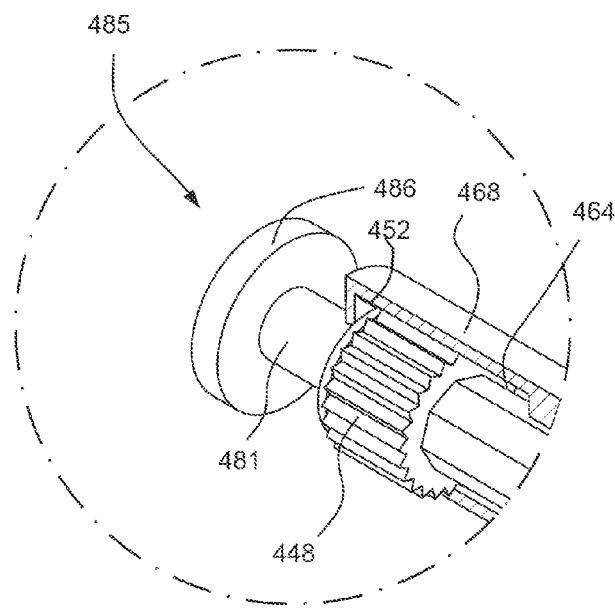
Figure 34A:
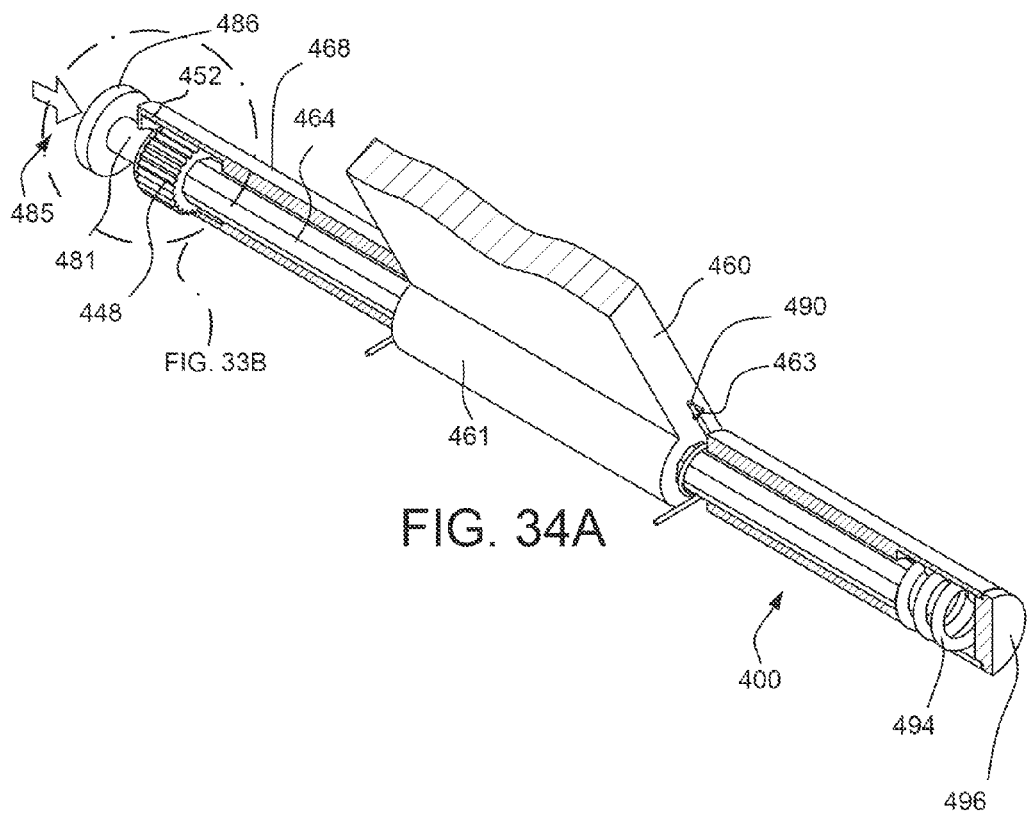
Figure 34B:
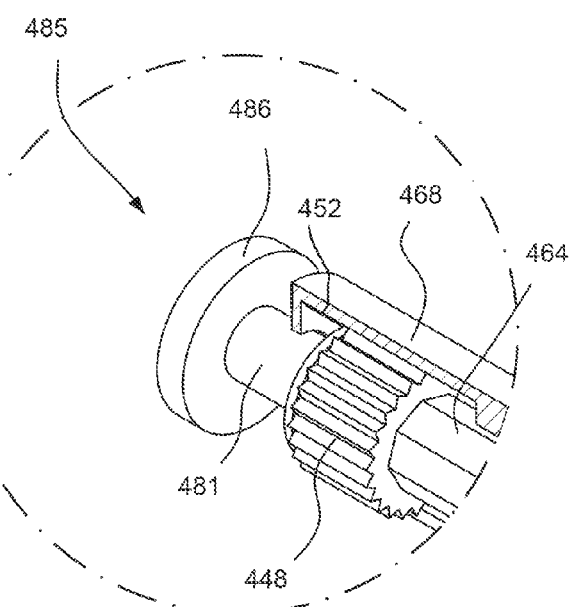

FIGS. 32A and 32B show the initial, un-pressed, position of a push-button 485, with the spur gear 448 snugly inside internal gear 452 and the corresponding fixed angular position of hinge plate 460 with force just beginning to be applied. FIGS. 33A/33B and 34A/34B show the button 485 being pushed in this embodiment such that spur gear 448 begins disengaging from internal gear 452.

Figure 35A:
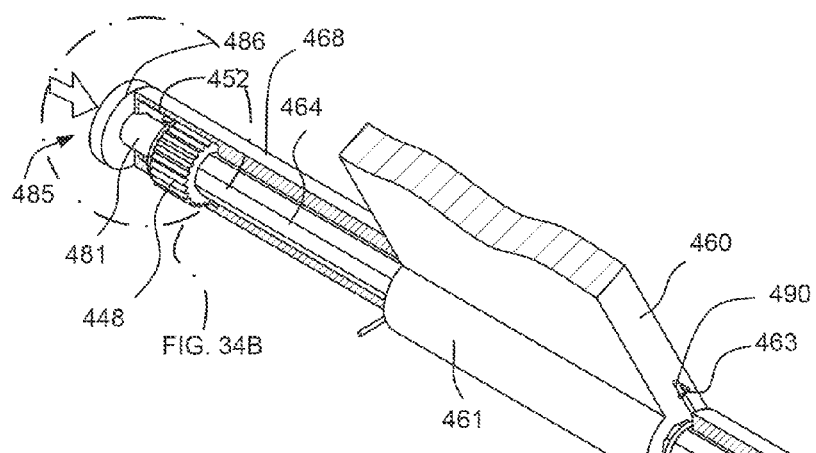
Figure 35B:
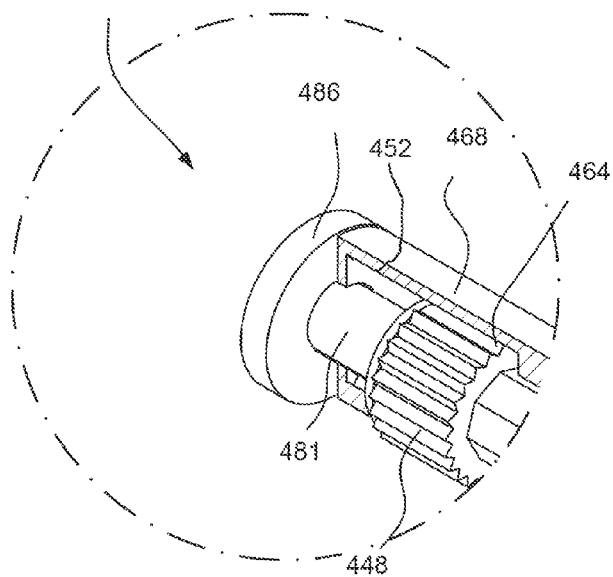

FIGS. 35A/35B show button 485 fully depressed so that spur gear 448 is completely disengaged from internal gear 452, thereby permitting hinge 461 and shaft 464 to rotate together relative to the base. Thus, FIGS. 35A and 35B show button 485 in the pressed position causing the push-button's plunger 481 to push the spur gear 448 out of the internal gear 452.

Figures 36A, 36B:
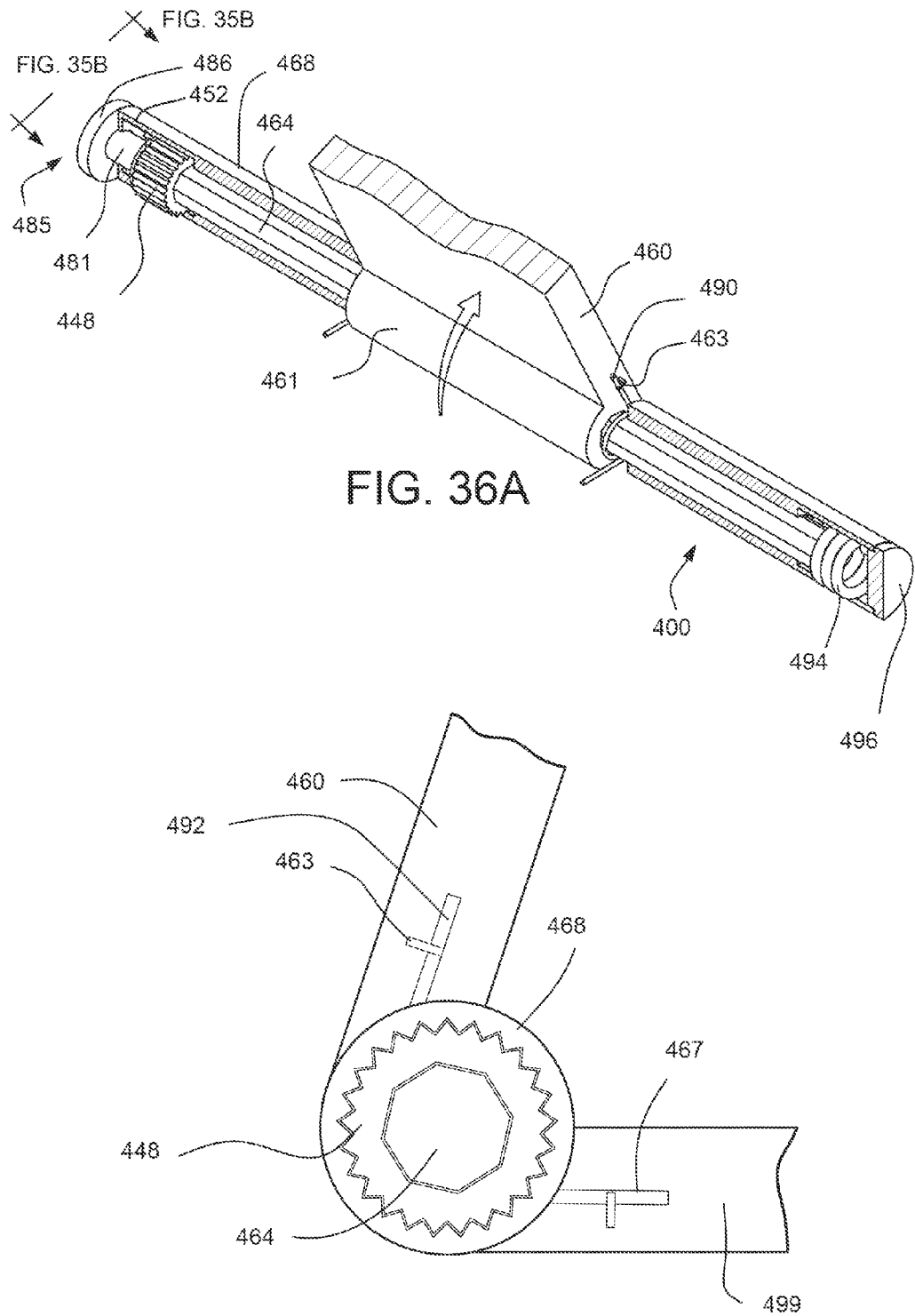
Figure 38A:
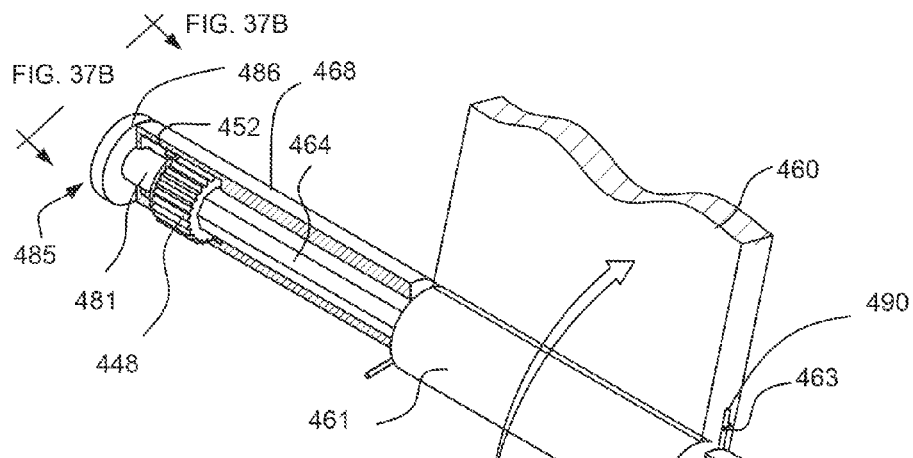
Figure 38B:
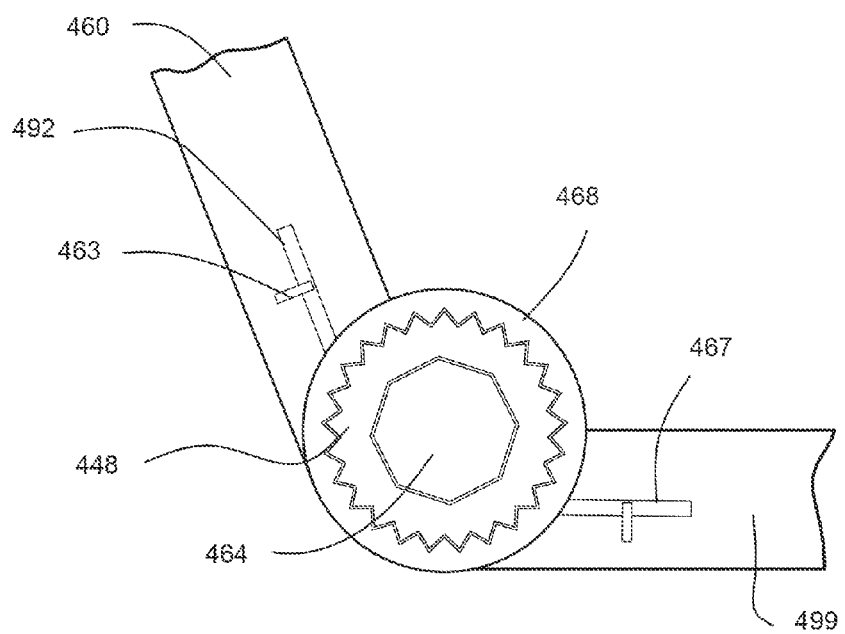
Figure 39A:
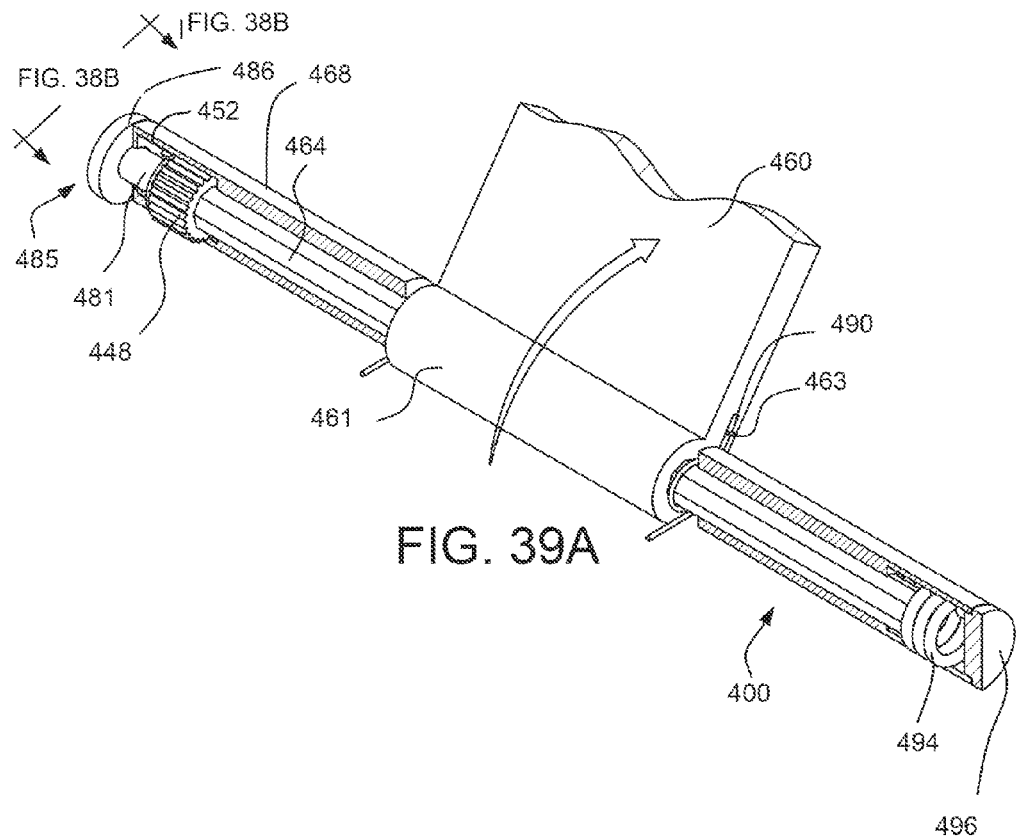
Figure 39B:
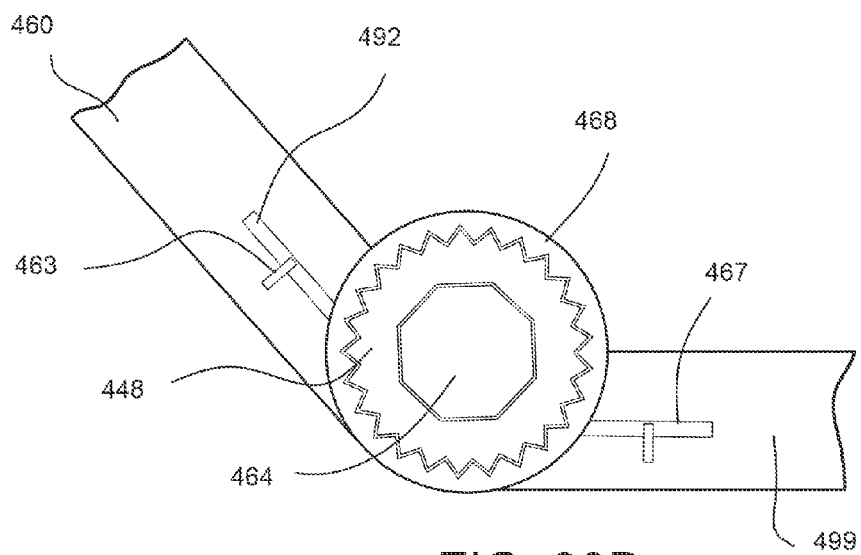

FIGS. 36A/36B, 37A/37B, 38A/38B and 39A/39B show the example non-limiting structure in a different view as the hinge 461 continues to rotate with button 485 remaining depressed. Thus, FIGS. 36A, 37A, and 38A and 39A show the new angular position of center plate 460 after it has been pushed back while button 485 was pressed and spur gear 448 was disengaged from internal gear 452. As discussed above, default angular position of the rotation lock mechanism 400 can be set by springs 490 and 492 so that if the user simply releases the structure while continuing to depress button 485, the structure will assume this default position.

Figure 40A:
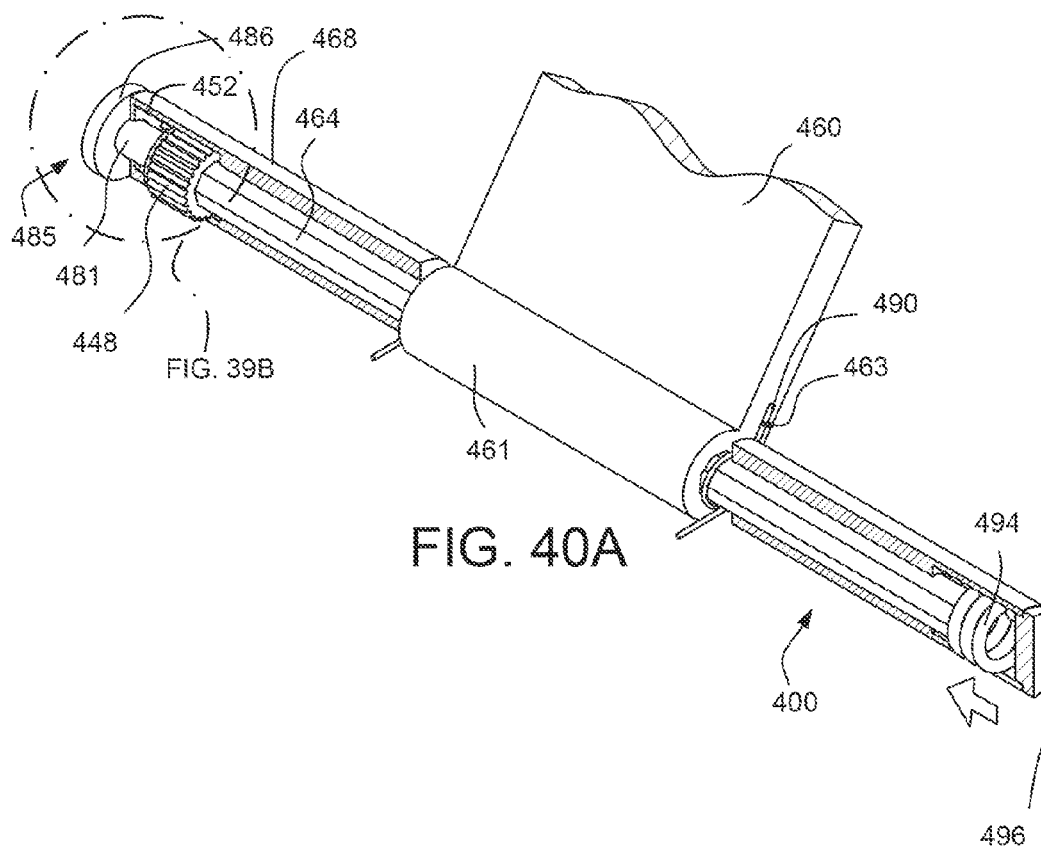
Figure 40B:
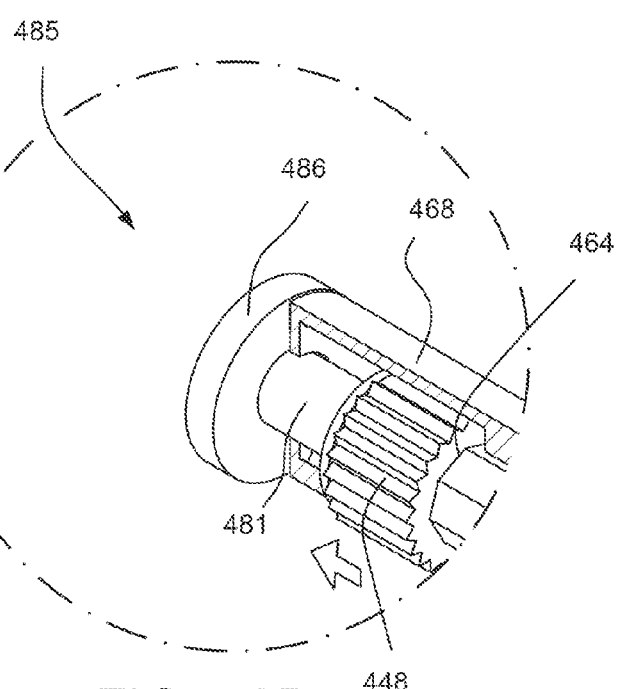
Figure 42A:
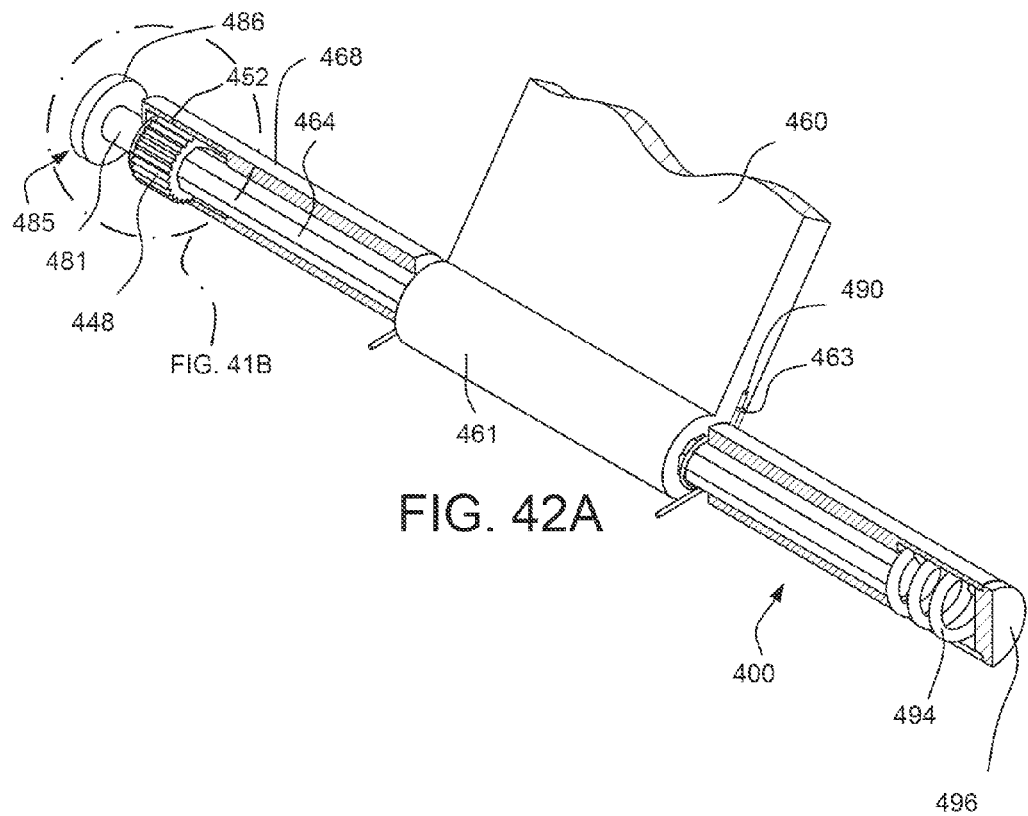
Figure 42B:
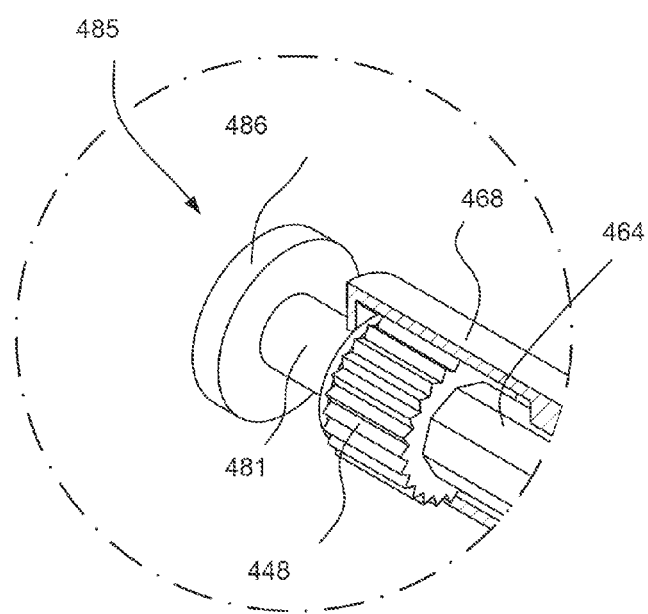

Once the user rotates the structure to the desired orientation, the user may release the button 485 to lock the structure in the new desired orientation. FIGS. 40A/40B, 41A/41B, 42A/42B and 43A/43B show spring 494 acting against the temporarily-displaced shaft 464 to cause spur gear 448 to reengage internal gear 452 and thereby lock the rotational position of hinge 461. The hinge once locked can withstand and resist further rotating under at least typical maximum force pressure (e.g., at least 50 Newtons for men and 40 Newtons for women) humans can apply by poking or pressing a touch screen surface with their finger or by pressing or writing with a stylus (typically at least 85-100 grams). See e.g., Astin, "Finger force capability: measurement and prediction using anthropometric and myoelectric measures" (MSISE Virginia Tech 1999); and Schomaker et al., "The Relation between Pen Force and Pen Point Kinematics in Handwriting," Biological Cybernetics 63:277-285 (1990), both incorporated herein by reference.

Figure 43A:
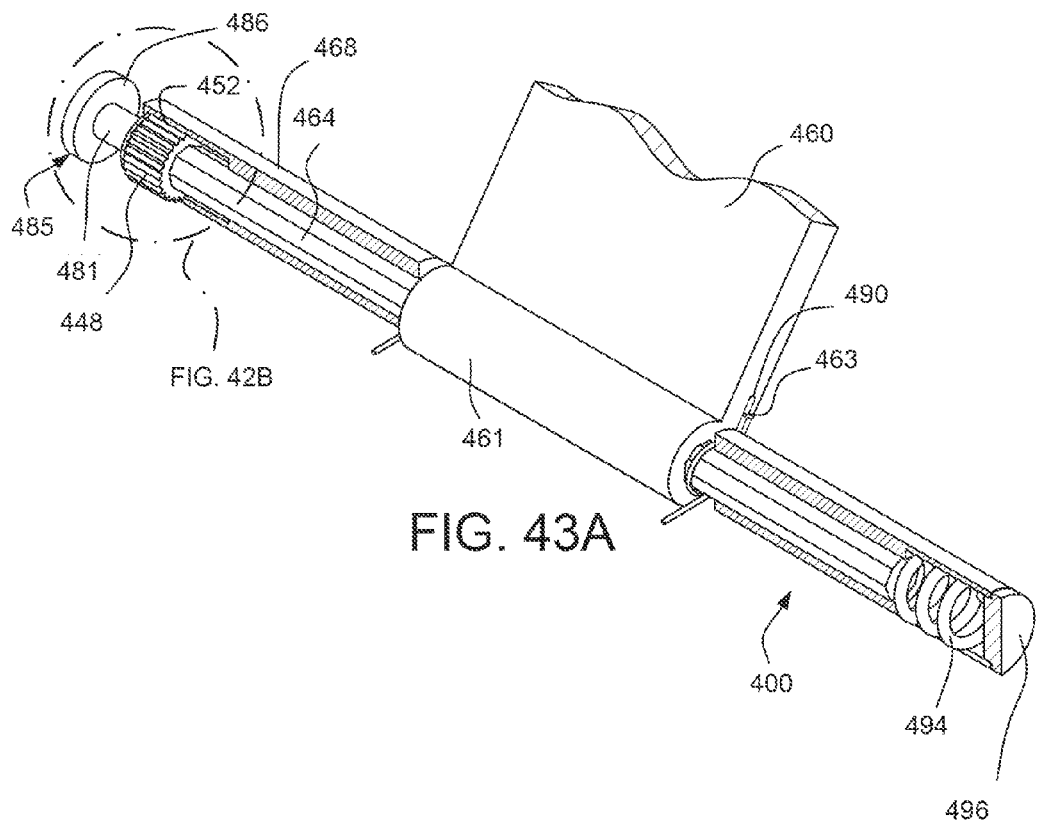
Figure 43B:
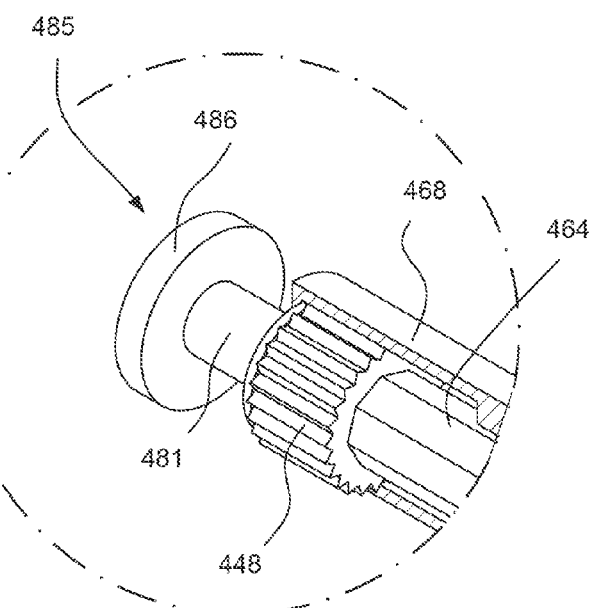

FIG. 43A and the 43B show the new fixed angular position of hinge plate 460 after push-button 485 was released and the spring 494 pushed the spur gear 448 into the internal gear 452 in chamber 446 of hinge cylinder 468.

Figure 44:
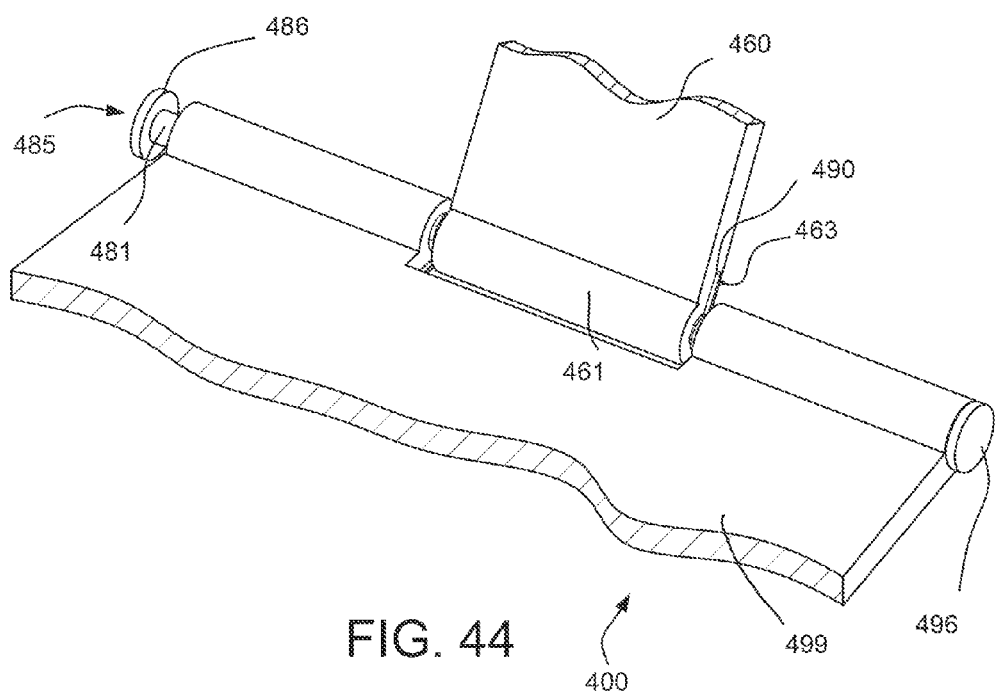
FIG. 44 illustrates an example partial cross-sectional perspective three-dimensional representation of a sliding shaft rotation lock mechanism in the "locked" position (after the angular position of the mid-section had been adjusted and the button had been released) with the hinge's mid-section in the new backward leaning position.

FIG. 44 shows a 3D perspective view of the new fixed angular position of the center hinge plate 460 of hinge 400.

Figure 45:
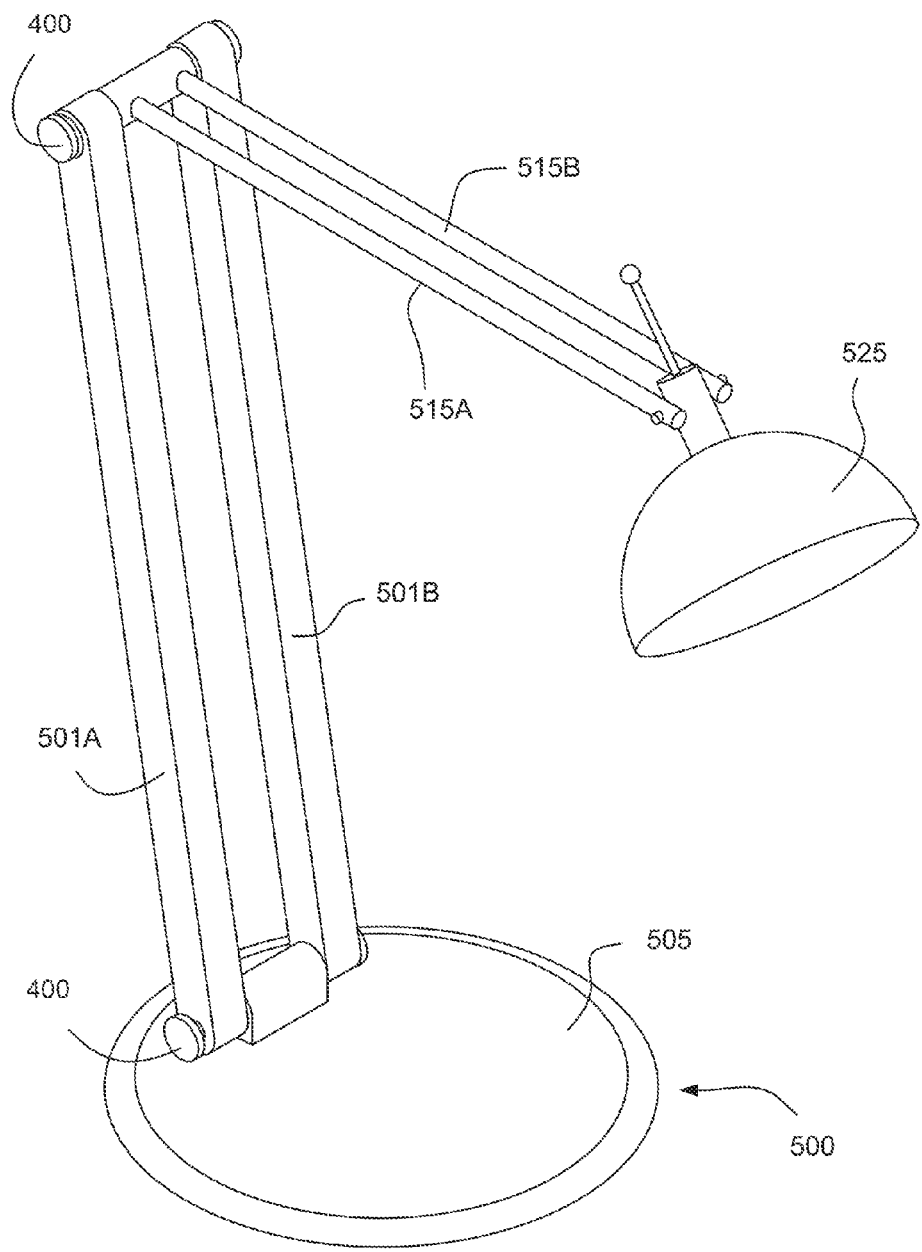
FIG. 45 is an elevated perspective view of a lamp including a pivoting stand having hinged connections between a base and a first leg of the lamp, and between the first leg and a second leg, wherein the hinged connections each include a sliding shaft rotation lock mechanism that provides adjustments of the angles between the first leg and base, and between the first and second legs, and push-buttons that actuate the lock mechanisms.

FIG. 45 illustrates an elevated perspective view of a lamp 500 including a pivoting stand having a hinged connection between a base 505 and a first leg of the lamp 501A and 501B, and between the first leg 501A and 501B and a second leg 515A and 515B, wherein the hinged connections each include a sliding shaft rotating lock mechanism 400 that provides adjustments of the angles between the first leg 501A and 501B and base 505, and between the first 510 and second 515 legs, and push-buttons that actuate the sliding shaft rotation lock mechanisms 400.

Figure 46:
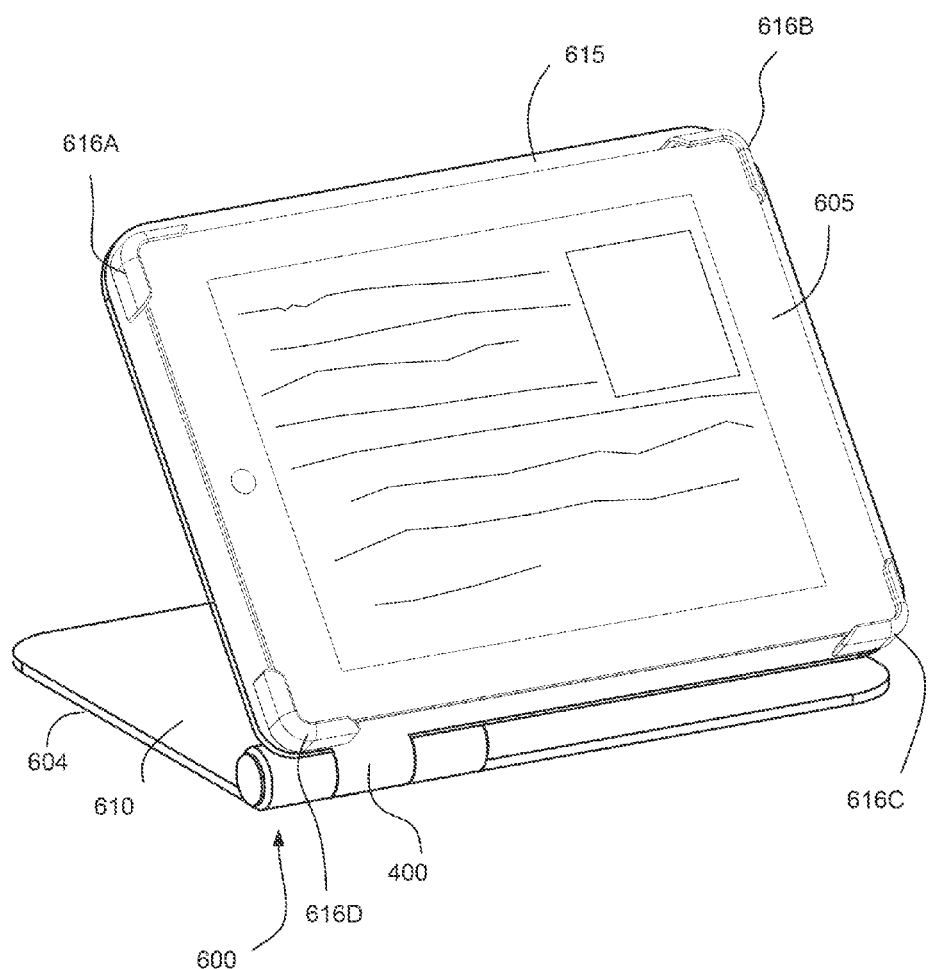
FIG. 46 is a perspective view of a tablet computing device and associated hinged tablet stand including a tablet display panel connected by a hinge to a support panel, wherein a sliding shaft rotation lock mechanism associated with the hinge holds the tablet computing device at a selectable angular orientation with respect to the support panel.

FIG. 46 illustrates a perspective view of a display stand 600 that accepts a display device 605. The display device 605 can be any kind of device such as an iPad tablet, iPad mini tablet, a Nexus 7 tablet, a smart phone, any device including a display having a touch screen, any display device, any computing device, a variety of non-active devices, etc.

The example non-limiting tablet stand 600 includes a base 610, a rotation lock mechanism 400, and a mounting plate 615. In the example shown, the rotation lock mechanism 400 hingably attaches mounting plate 615 to base 610. In this way, mounting plate 615 can assume a variety of different user-settable orientations relative to base 610 while still being attached to the base.

The mounting plate 615 is in one example embodiment with perforated holes located at the four edges of the plate. The holes enable four rubberized holding brackets 616A, 616B, 616C, 616D, each with three rhomboid tipped rubber legs located at every corner of the bracket to be secured to the mounting plate by inserting the rhomboid tipped rubber legs tightly through holes of the perforated mounting plate 615.

The example non-limiting rotation lock mechanism 400 provides a locking function that allows a user to change or set the rotational orientation of mounting plate 615 relative to base 610.

Retracting Cylinders Rotation Lock Mechanism

Figure 47:
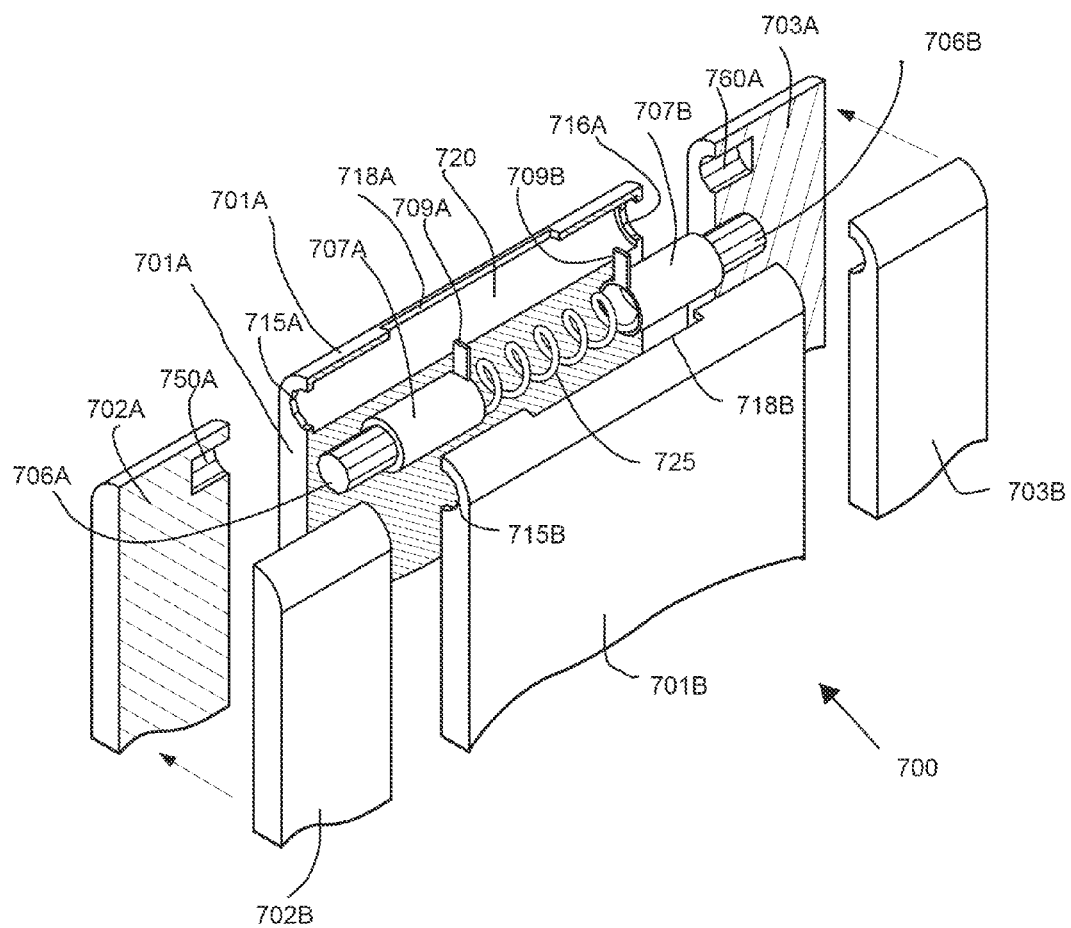
FIG. 47 is a partial cross sectional perspective three-dimensional representation of an example non-limiting three-dimensional representation of a retracting cylinders rotation lock mechanism FIGS. 48A to 51A together represent a sequence partial cross sectional perspective three-dimensional representation drawings of an example non-limiting retracting cylinders rotation lock mechanism that when displayed one after another provide a flip chart animation showing how a pair of stepped multi-sided retracting cylinders that are inversely aligned at either side of a biasing spring inside a channel can be protruded and retracted from a pivoting support panel and into inverse multi-sided sockets attached to adjacent surface areas to lock the angular rotation of a pivoting support element to a fixed surface area.
Figure 48A:
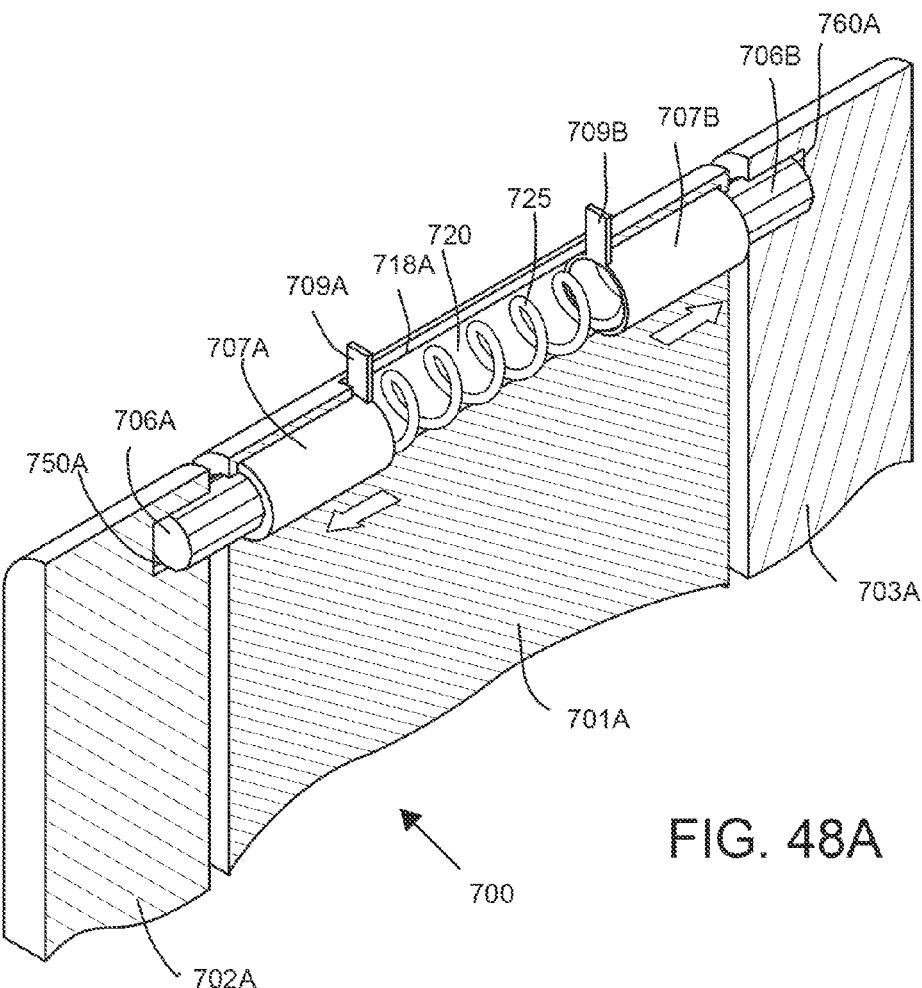
Figure 48B:
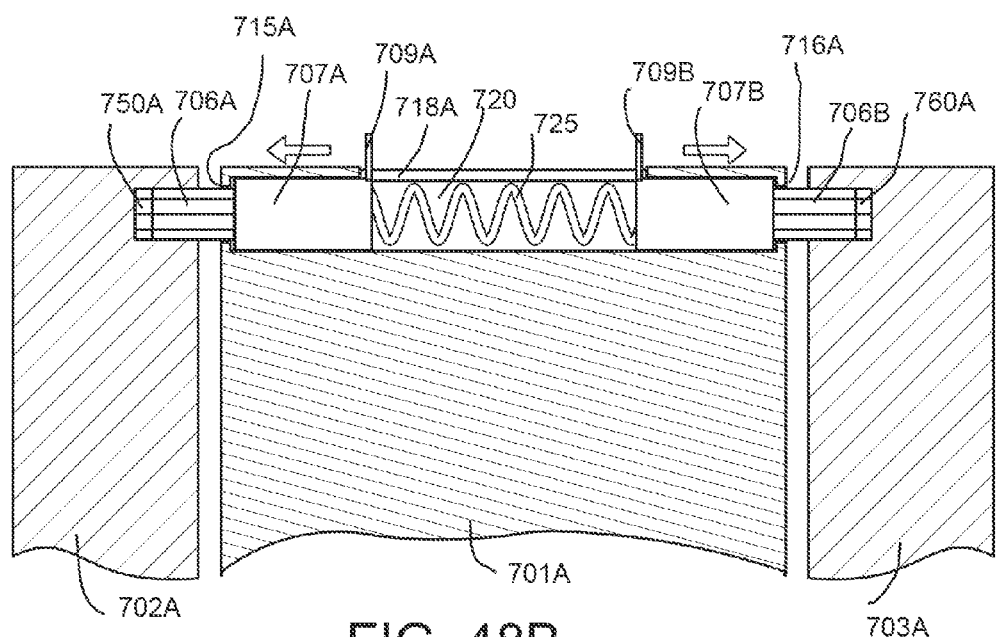
Figure 50A:
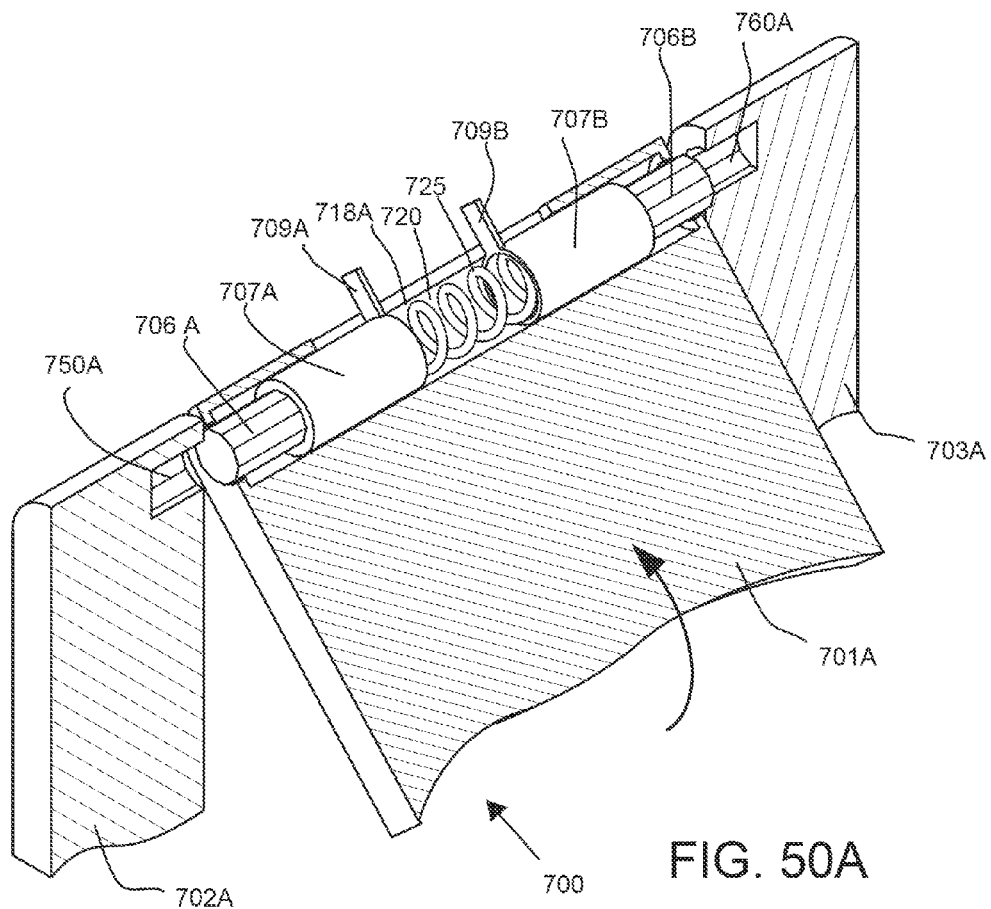
Figure 50B:
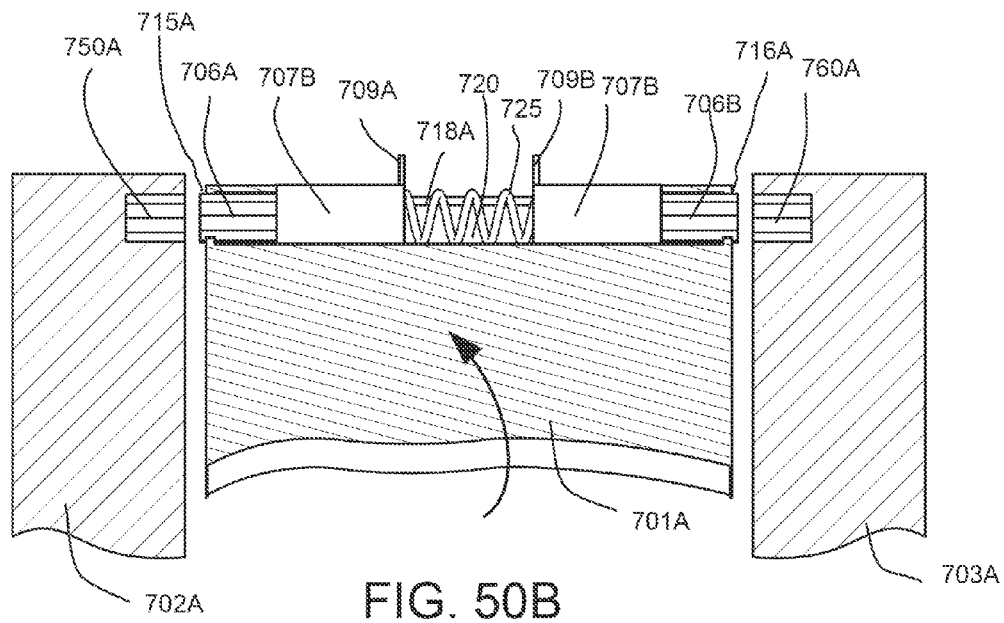
Figure 51A:
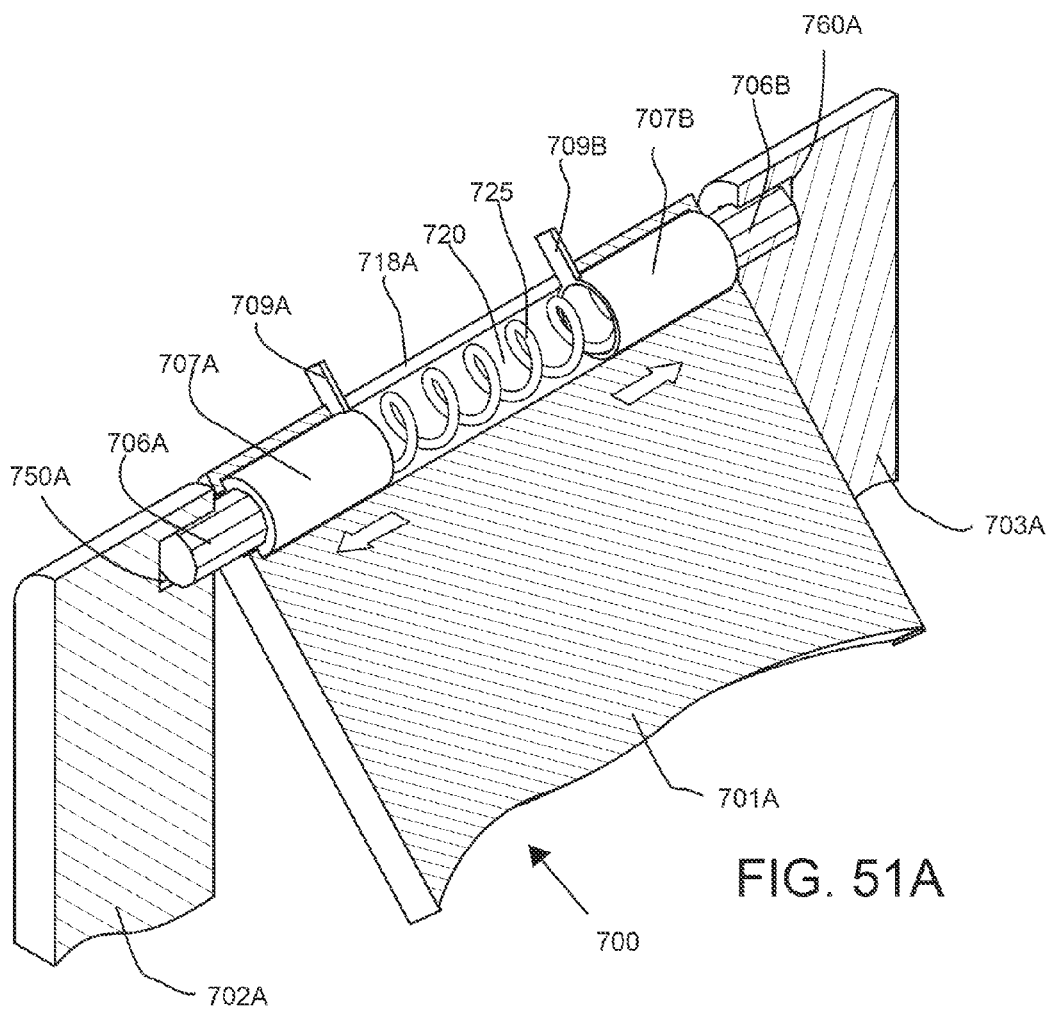
Figure 51B:
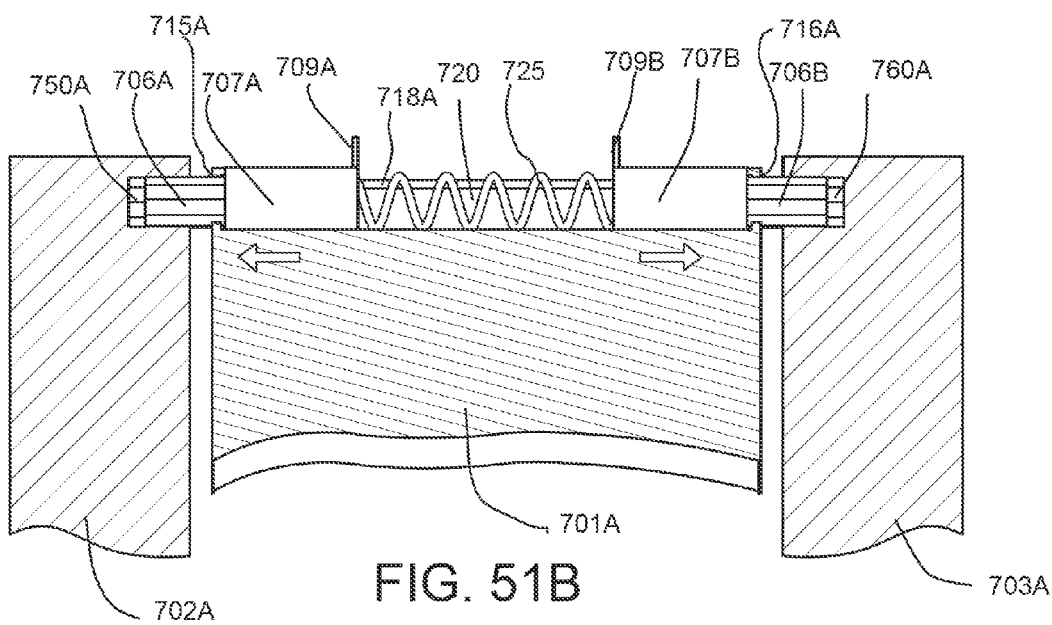

FIG. 47 illustrates yet another non-limiting exemplary embodiment; Retracting Cylinders Rotation Lock Mechanism. This mechanism is also based on the illustrated exemplary concept manifestation of FIGS. 17A-17C where a multi-sided cylinder that is attached to a pivoting element is thrust into an inverse multi-sided cylinder or socket that is attached to a fixed surface in order to interlock and freeze the rotational position of the pivoting element with respect to the fixed surface at the time the multi-sided cylinder was thrust into the socket—but whereas the exemplary concept manifestations of FIGS. 17A-17C are based on one multi-sided cylinder interlocking with one hollow inverse multi-sided cylinder or socket, the non-limiting exemplary embodiment of the Retracting Cylinders Rotation Lock Mechanism employs a pivoting element 701A,B that is traversed by a channel 720 that encloses a pair of retractable stepped multi-sided cylinders 706A and 706B that are inversely aligned at either side of a biasing spring 725 inside the channel 720. The spring 725 biases the retractable stepped multi-sided cylinders 706A and 706B that are connected to retracting cups 707A and 707B into protruding outside the channel 720 to interlock with a pair of inverse multi-sided cylinders or sockets 750A,B and 760A,B that are aligned to fixed surfaces 702A,B and 703A,B on either side of the channel 720 in order to lock the angular position of the attached pivoting element 701A,B while the stepped multi-sided cylinders 706A and 706B are thrust into the opposing sockets 750A,B and 760A,B that are attached to fixed surfaces 702A,B and 703A,B. These fixed surfaces 702A,B and 703A,B are an integral unit, such as a back panel of an electronic device.

Furthermore, the design of the Retracting Cylinders Rotation Lock Mechanism provides that multiple opposing sockets may be aligned vertically along the edges of the pivoting element 701A,B in order to enable the pivoting element 701A,B to attach and detach from a fixed surface at multiple locations along the length of the pivoting element in order to enable height adjustment as well as angular adjustment for the pivoting support element.

FIGS. 48A to 51A together represent a sequence partial cross sectional perspective three-dimensional representation drawings of an example non-limiting retracting cylinders rotation lock mechanism 700 that when displayed one after another provide a flip chart animation showing how a pair of stepped multi-sided retracting cylinders that are inversely aligned at either side of a biasing spring inside a channel can be protruded and retracted from a pivoting support panel and into inverse multi-sided sockets attached to adjacent surface areas to lock the angular rotation of a pivoting support element to a fixed surface area.

FIGS. 48B to 51B together represent a sequence partial cross sectional two-dimensional representation drawings of an example non-limiting retracting cylinders rotation lock mechanism 700 that when displayed one after another provide a flip chart animation showing how a pair of stepped multi-sided retracting cylinders that are inversely aligned at either side of a biasing spring inside a channel can be protruded and retracted from a pivoting support panel and into inverse multi-sided sockets attached to adjacent surface areas to lock the angular rotation of a pivoting support element to a fixed surface area.

The Retracting Cylinders Rotation Lock Mechanism has a biased, default position in which the multi-sided cylinders 706A and 706B are seated in the cylinders or sockets 750A,B and 760A,B. While seated in the cylinders or sockets, the engagement between the cylinders 706A,B and cylinders or sockets 750A,B and 760A,B fixes the angular position of the pivoting element 701A,B with respect to the fixed surfaces 702A,B and 703A,B. The spring 725 is compressed by an operator squeezing together the tabs 709A,B which retracts the cylinders 706A,B from the cylinders or sockets 750A,B and 760A,B. Retraction allows the pivoting element 701A,B to pivot, slide and otherwise move with respect to the fixed surfaces 702A,B and 703A,B. The tabs 709A,B slide in a slot 718A,B which forms an opening in the channel 720. The tabs 709A,B in the slot 718A,B may be used to prevent rotation of the multi-sided cylinders 706A,B within the channel. Rotation in the channel may also be prevented by multi-sided openings 715A,B and 716A,B at either end of the channel, wherein each multi-sided opening (715A,B and 716A,B) matches the sides of the corresponding multi-sided cylinder 706A and 706B.

Figure 52:
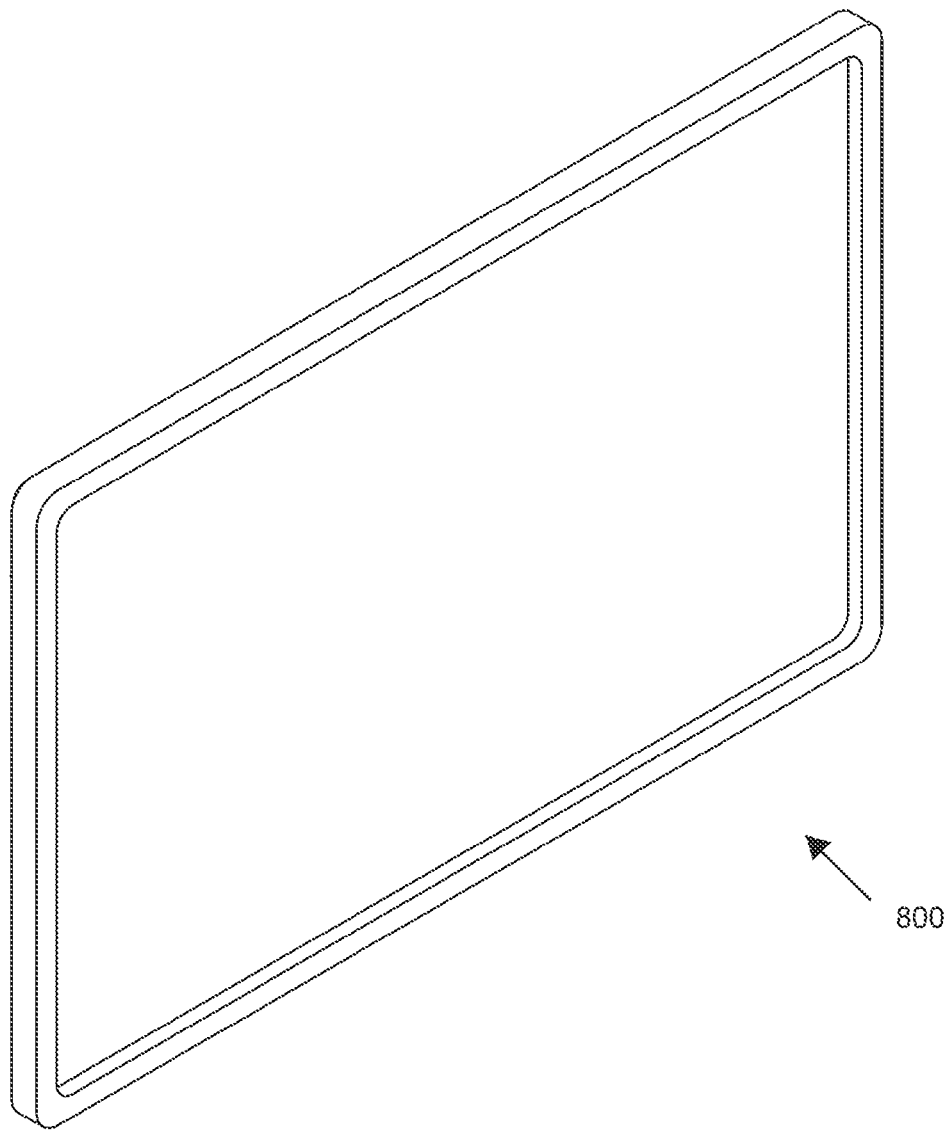
FIG. 52 shows a three dimensional perspective view of an exemplary personal information display and input panel.

FIG. 52 shows a three dimensional perspective view of an exemplary personal information display and input panel 800, such as a tablet computer having a front surface with a display and a back panel.

Figure 53:
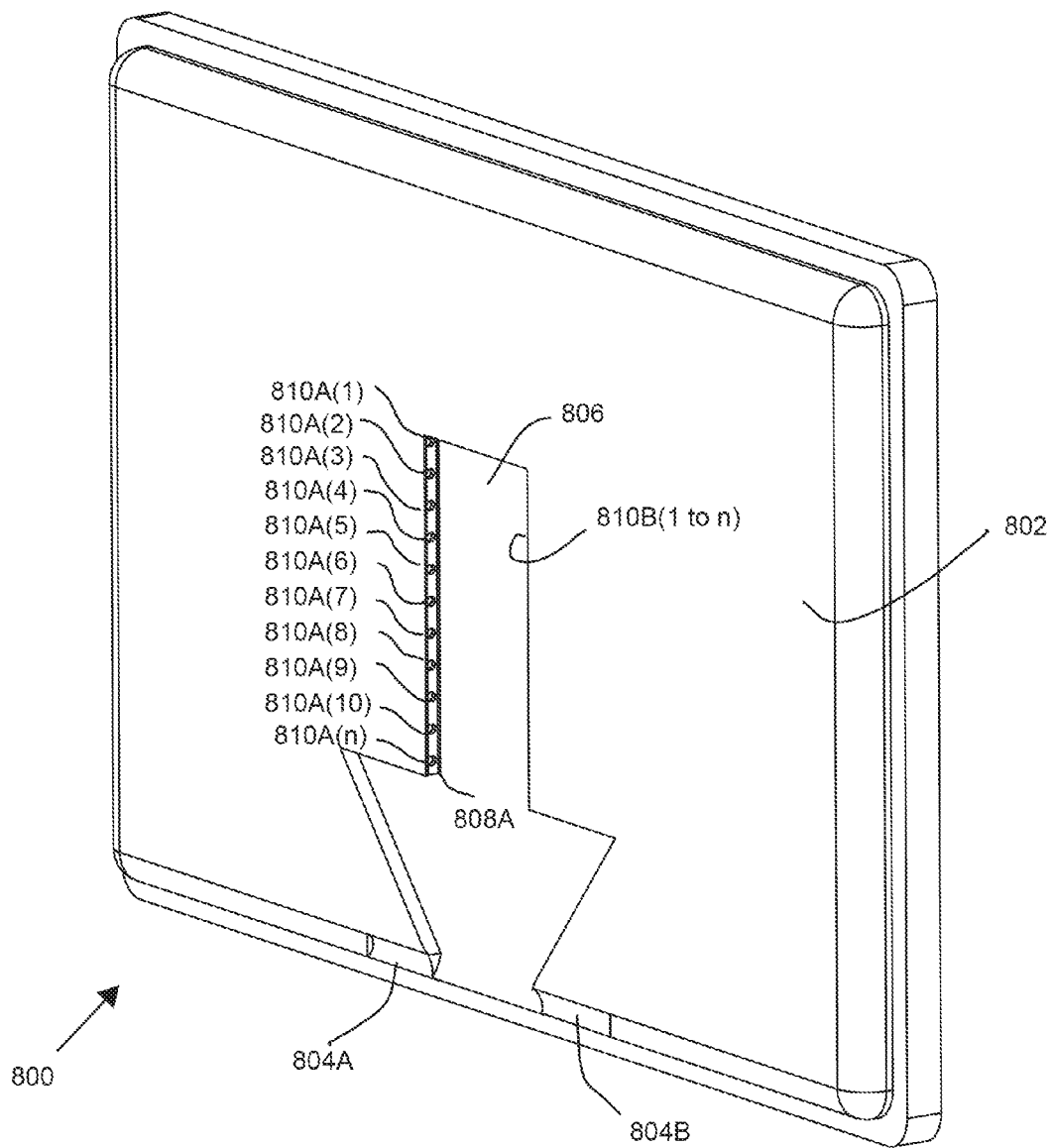
FIG. 53 illustrates a three dimensional perspective view of a non-limiting exemplary embodiment of a back panel for a personal information display and input device that can house a collapsible detachable retracting cylinders rotation lock mechanism that can prop up a display panel to various heights and angular positions.

FIG. 53 illustrates a three dimensional perspective view of a non-limiting exemplary embodiment of a back panel 802 for a personal information display and input device 800 that can house a collapsible and detachable retracting cylinders rotation lock mechanism 700 that can prop up a display and input panel to various heights and angular positions. The back panel includes a recess 806 that receives a pivotable plate (not shown). A retracting cylinders rotation lock mechanism 700 secures the plate to locking holes 810A(1) to 810A(n) and 810B(1) to 810B(n) in the back plate.

FIGS. 54A and 54B illustrate a three dimensional perspective view of a non-limiting exemplary embodiment of a back panel 802 for a retracting cylinders rotation lock mechanism 700 that can prop the display panel to various angular positions and a corresponding close-up view (FIG. 54B) of a railing mechanism that can glidingly attach a retracting cylinders rotation lock mechanism 700 to the back panel 802 of an exemplary personal information display and input panel 800.

Figure 55B:
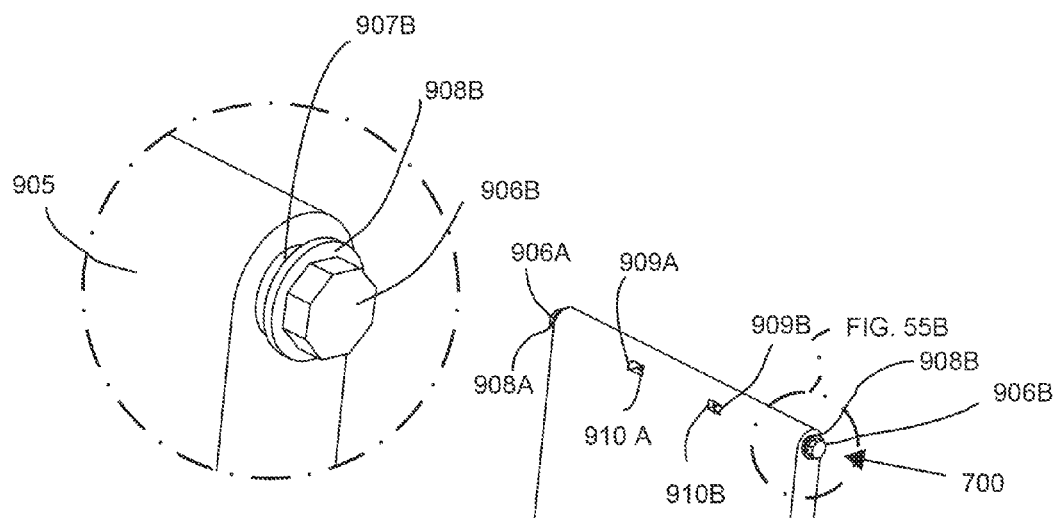
FIG. 55B illustrates a three dimensional perspective close-up view of a non-limiting exemplary embodiment of an attachment mechanism that can glidingly bind the foldable detachable retracting cylinders rotation lock mechanism stand to the back panel of a personal information display and input device.
Figure 55A:
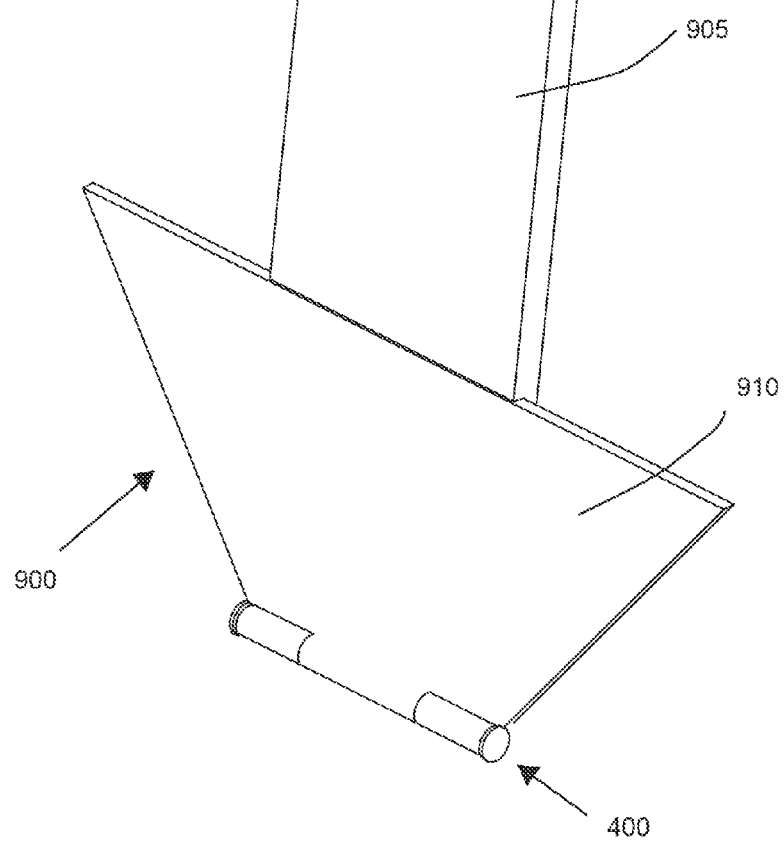
FIG. 55A illustrates a three dimensional perspective view of a non-limiting exemplary embodiment of a foldable detachable retracting cylinders rotation lock mechanism stand that can be stowed snugly in the back panel of a personal information display and input device.

FIG. 55A illustrates a three dimensional perspective view of a non-limiting exemplary embodiment of a foldable detachable retracting cylinders rotation lock mechanism stand 900 that can be stowed snugly in the recess 806 of the back panel 802 of a personal information display and input device 800.

FIG. 55B illustrates a three dimensional perspective close-up view of a non-limiting exemplary embodiment of an attachment mechanism that can glidingly bind the foldable detachable retracting cylinders rotation lock mechanism stand 900 to the back panel 802 of a personal information display and input device 800. The multi-sided holes 810A(1 to n) and 810B(1 to n) on either side of recess 806 engage the multi-sided posts or cylinders 906A and 906B. Annular flanges 908A and 908B rest against the sidewalls 808A and 808B of the recess 806. Tabs 909A and 909B retract the posts or cylinders 906A and 906B to allow the support panel 905 to be moved to another set of opposing holes 810A(1) to 810A(n) and 810B(1) to 810B(n) in the back plate 802.

Figure 56B:
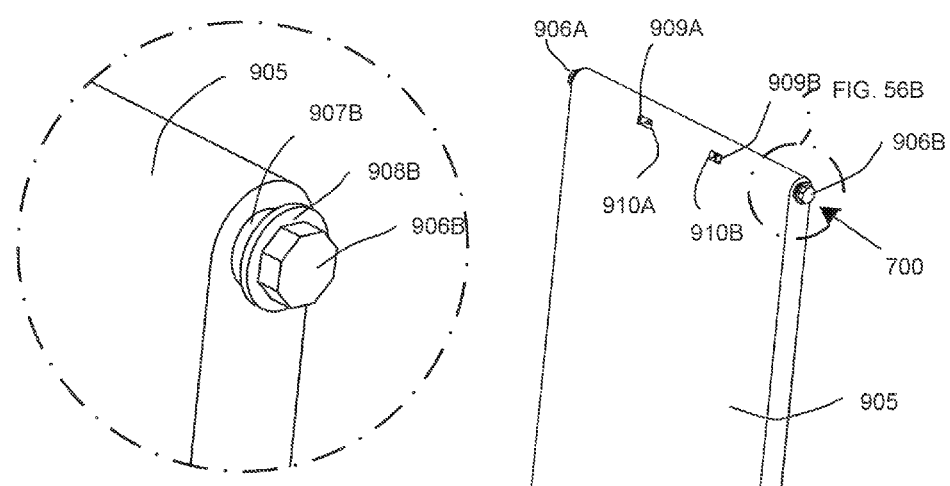
FIG. 56B illustrates a three dimensional perspective close-up view of a non-limiting exemplary embodiment of an attachment mechanism that can glidingly bind the foldable detachable retracting cylinders rotation lock mechanism stand to the back panel of a personal information display and input device.
Figure 56A:
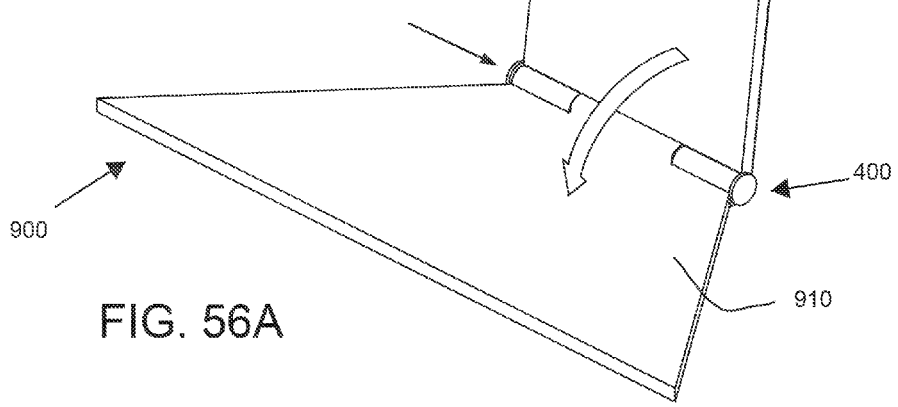
FIG. 56A illustrates a three dimensional perspective view of an unfolding non-limiting exemplary embodiment of a foldable detachable retracting cylinders rotation lock mechanism stand that can be stowed snugly in the back panel of a personal information display and input device.

FIG. 56A illustrates a three dimensional perspective view of an unfolding non-limiting exemplary embodiment of a foldable detachable retracting cylinders rotation lock mechanism stand 900 that can be stowed snugly in the back panel of a personal information display and input device.

FIG. 56B illustrates a three dimensional perspective close-up view of a non-limiting exemplary embodiment of an attachment mechanism that can glidingly bind the foldable detachable retracting cylinders rotation lock mechanism stand 900 to the back panel 802 of a personal information display and input device 800. The support panel 905 may include a pivoting foot 910 that is hinged to the panel by a rotational lock mechanism 400.

FIGS. 57A, 57B, and 57C provide three dimensional perspective views of how an unfolding exemplary embodiment of a foldable detachable retracting cylinders rotation lock mechanism stand 900 can glidingly attach to the back panel 802 of a personal information display and input device 800.

FIG. 58A illustrates a three dimensional perspective view of a non-limiting exemplary embodiment of a foldable detachable retracting cylinders rotation lock mechanism stand 900 stowed neatly in the flush position in the back panel 802 of a personal information display and input device 800.

FIG. 58B illustrates a close up of the retracting handles 909A and 909B in the support panel 905 of the exemplary foldable detachable retracting cylinders rotation lock mechanism stand 900.

Figure 59:
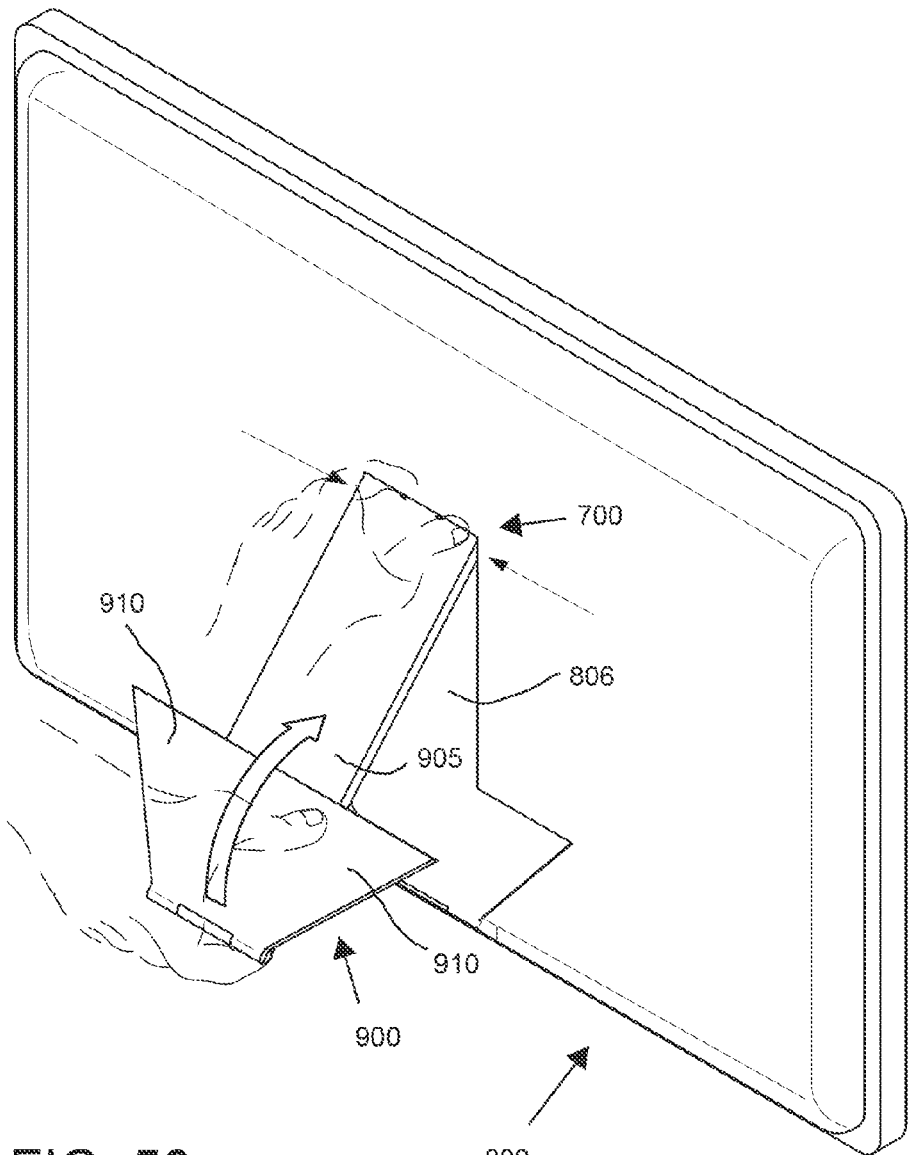
FIG. 59 illustrates how a person can free the exemplary foldable detachable retracting cylinders rotation lock mechanism stand from the back panel of the personal information display and input device by simultaneously compressing the retracting handles in the back of the foldable detachable retracting cylinders rotation lock mechanism stand while swinging its base out of the display's back panel.

FIG. 59 illustrates how a person can free the exemplary foldable detachable retracting cylinders rotation lock mechanism stand 900 from the back panel 802 of the personal information display and input device 800 by simultaneously compressing the retracting handles 909A and 909B in the back of the foldable detachable retracting cylinders rotation lock mechanism stand 900 while swinging its base 910 out of the display's back panel.

Figure 60:
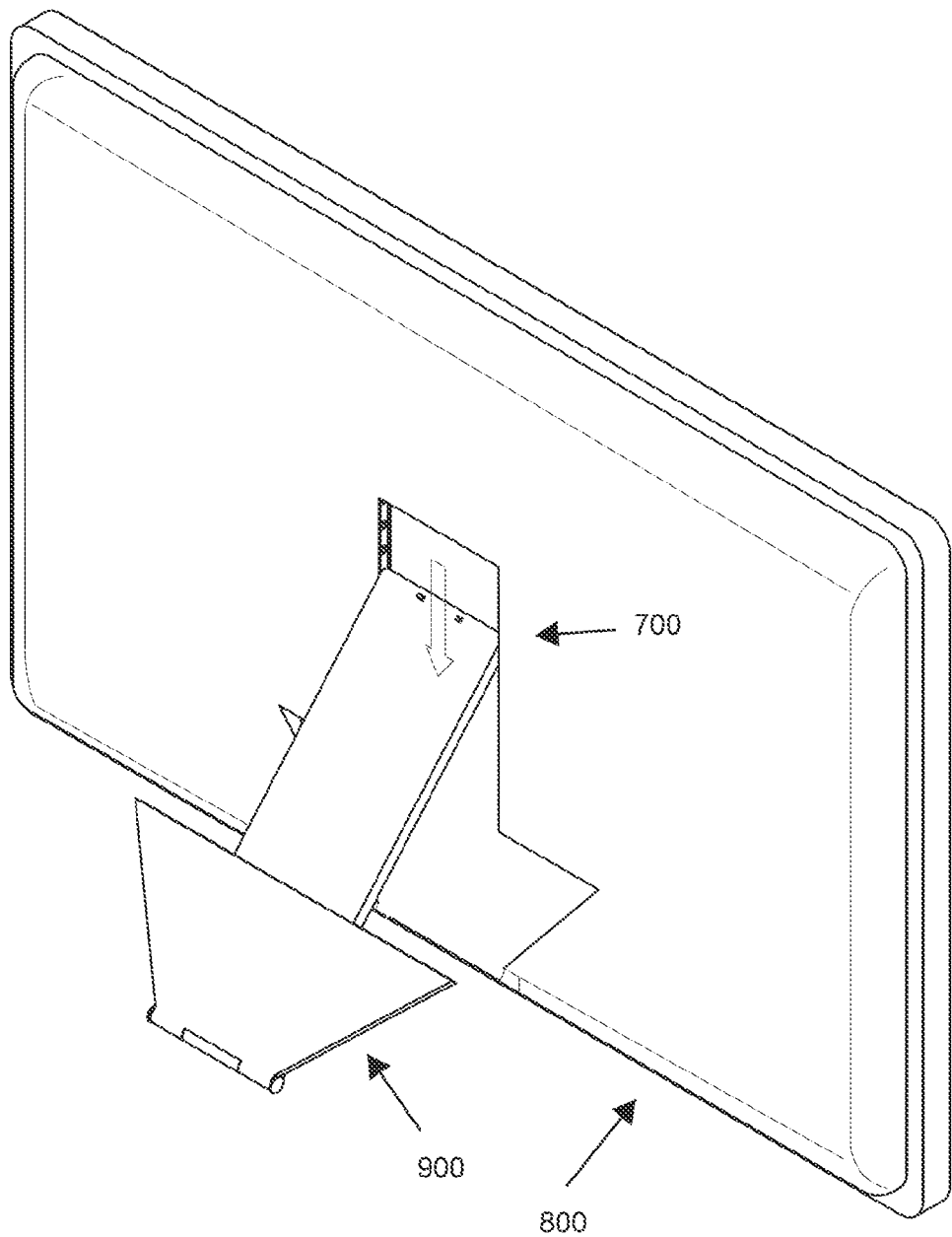
FIG. 60 illustrates the initial step for deploying the foldable detachable retracting cylinders rotation lock mechanism stand.

FIG. 60 illustrates the initial step for deploying the foldable detachable retracting cylinders rotation lock mechanism stand 900.

Figure 61:
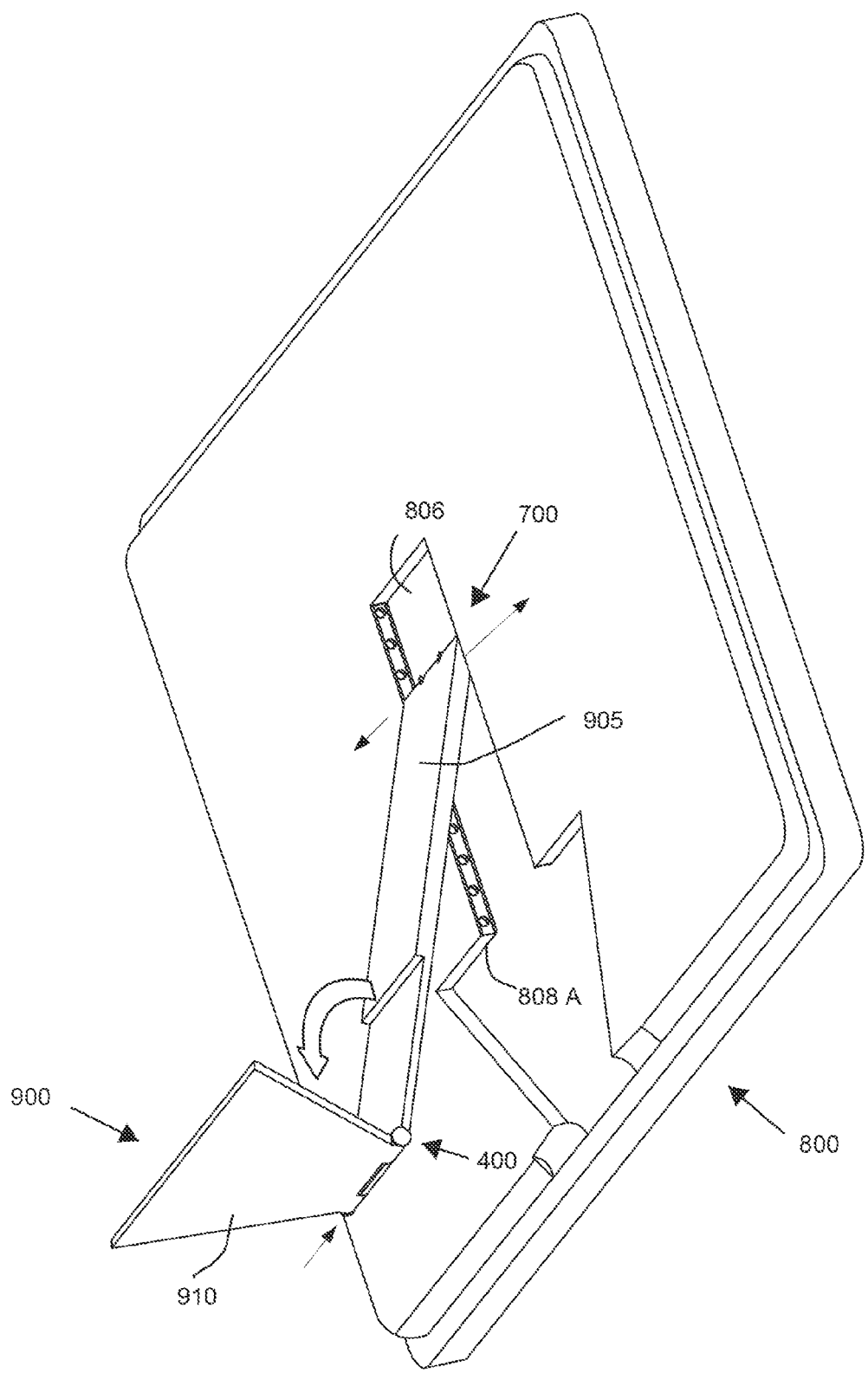
FIG. 61 illustrates how to further deploy the foldable detachable retracting cylinders rotation lock mechanism stand by unfolding its base.

FIG. 61 illustrates how to further deploy the foldable detachable retracting cylinders rotation lock mechanism stand 900 by unfolding its base 910 from the support panel 905.

Figure 62:
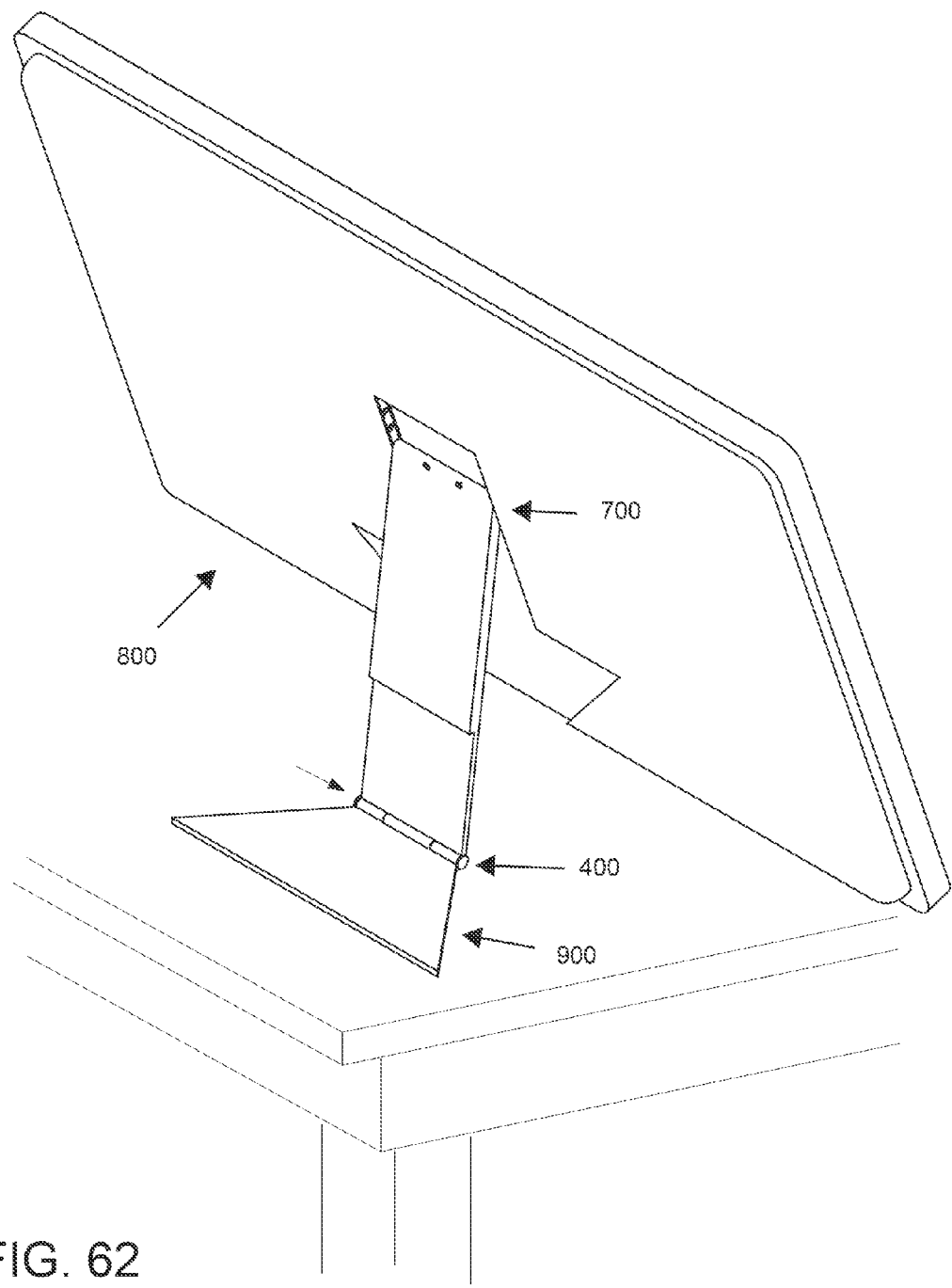
FIG. 62 illustrates one example of how the foldable detachable retracting cylinders rotation lock mechanism stand can be deployed for one exemplary viewing configuration.

FIG. 62 illustrates one example of how the foldable detachable retracting cylinders rotation lock mechanism stand 900 can be deployed for one exemplary viewing configuration.

Figure 63:
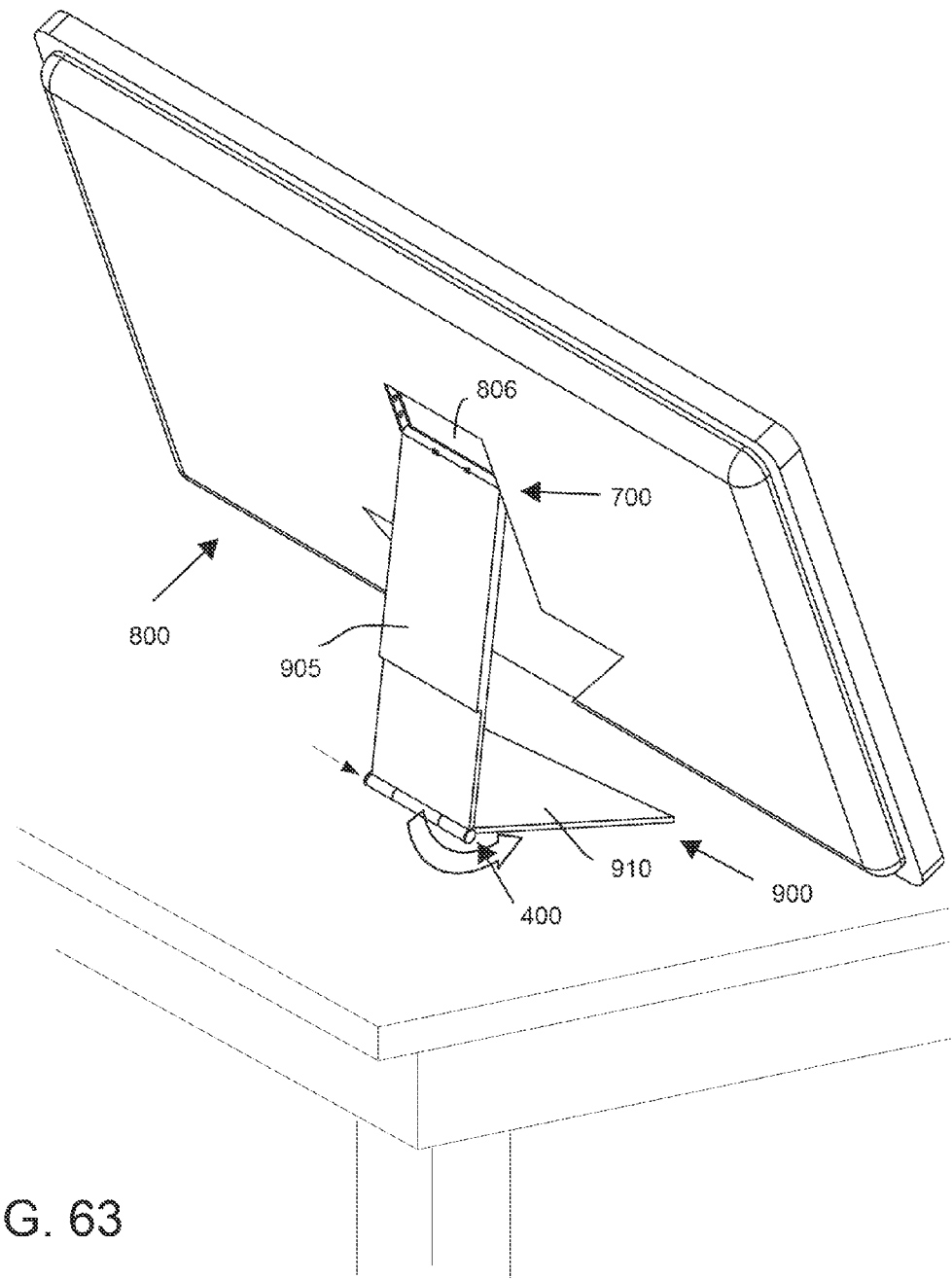
FIG. 63 illustrates another example of how the foldable detachable retracting cylinders rotation lock mechanism stand can be deployed in a different exemplary viewing configuration.

FIG. 63 illustrates another example of how the foldable detachable retracting cylinders rotation lock mechanism stand 900 can be deployed in a different exemplary viewing configuration by folding its base 910 in a forward position.

Figure 64:
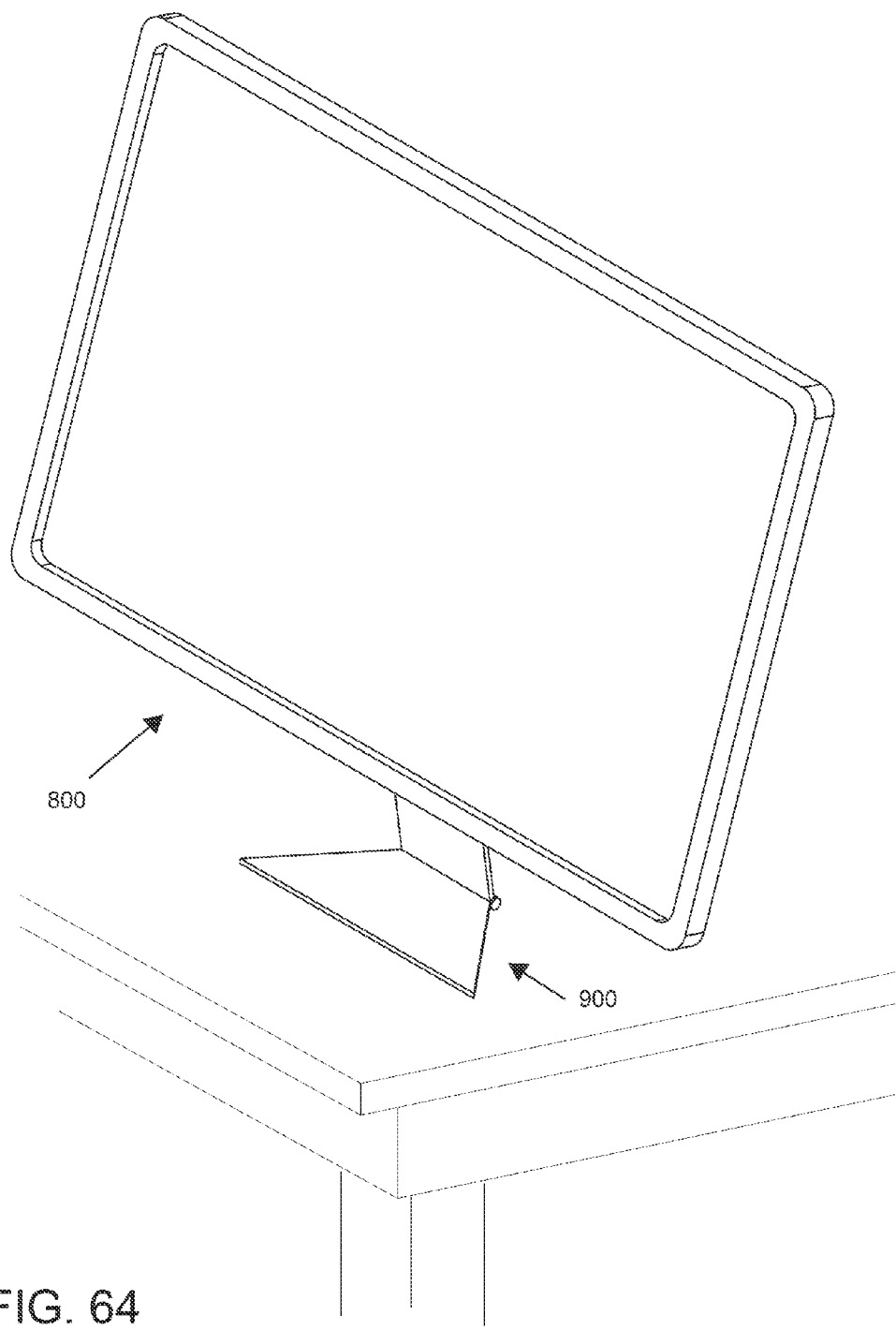
FIG. 64 provides a frontal three dimensional perspective view of the viewing configuration of FIG. 63.

FIG. 64 provides a frontal three dimensional perspective view of the viewing configuration of FIG. 63.

Figure 65:
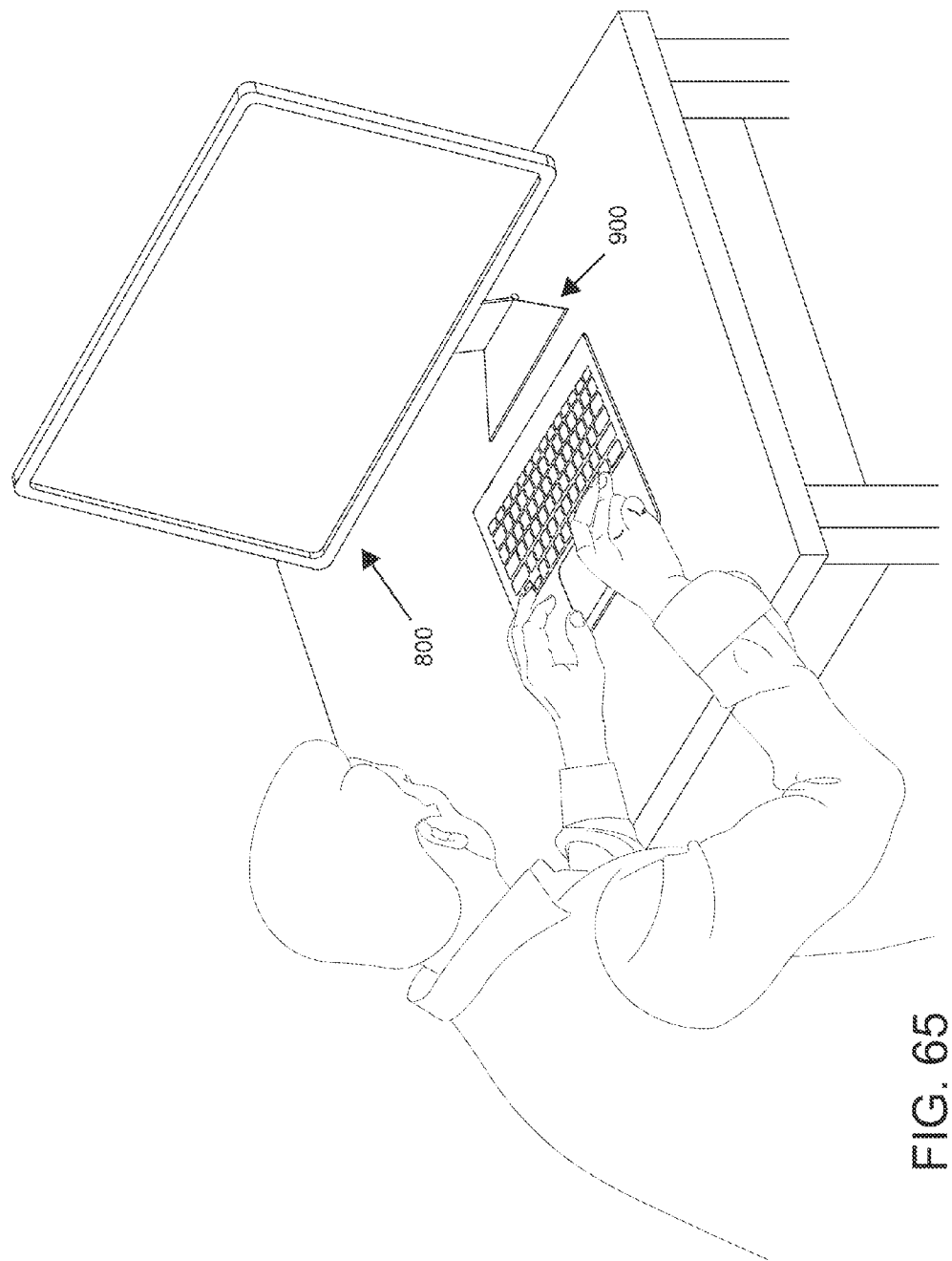
FIG. 65 illustrates a three dimensional perspective view of a person using a personal information display and input device propped up on a foldable detachable retracting cylinders rotation lock mechanism stand.

FIG. 65 illustrates a three dimensional perspective view of a person using a personal information display and input device 800 propped up on a foldable detachable retracting cylinders rotation lock mechanism stand 900.

Figure 66:
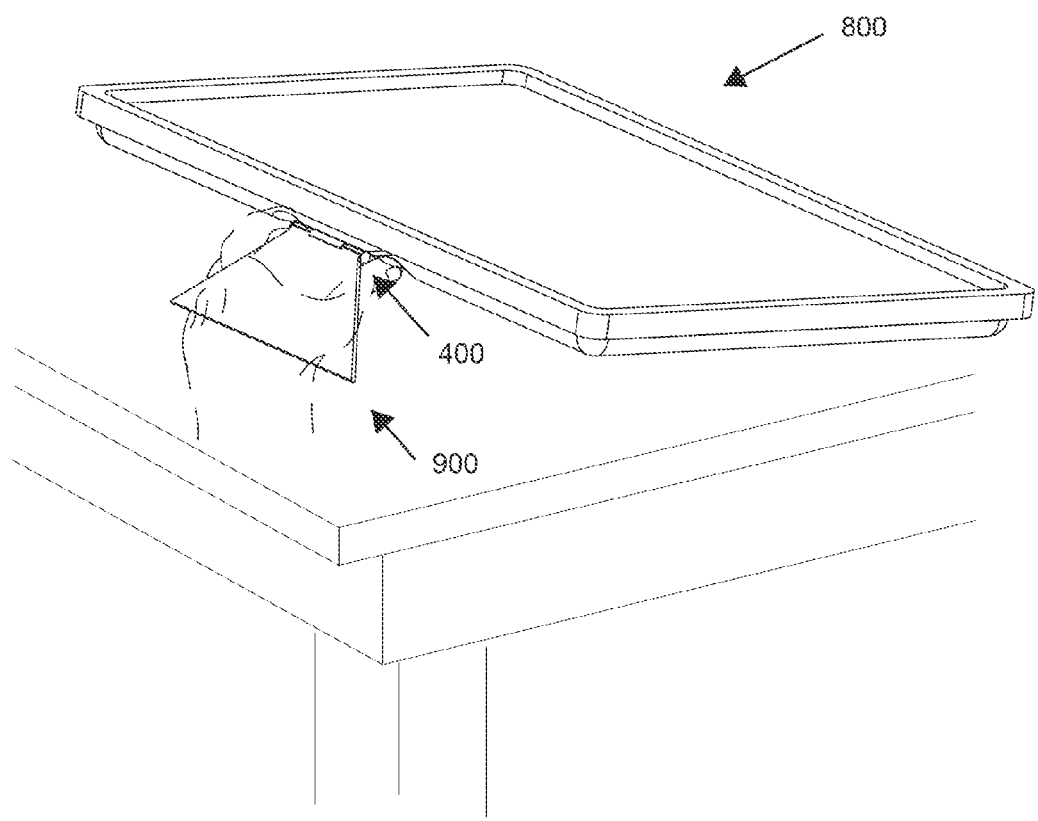
FIG. 66 illustrates a three dimensional perspective view of how the foldable detachable retracting cylinders rotation lock mechanism stand can be manipulated to adjust the viewing experience of a person using the personal information display and input device.

FIG. 66 illustrates a three dimensional perspective view of how the foldable detachable retracting cylinders rotation lock mechanism stand 900 can be manipulated to adjust the viewing experience of a person using the personal information display and input device 800.

Figure 67:
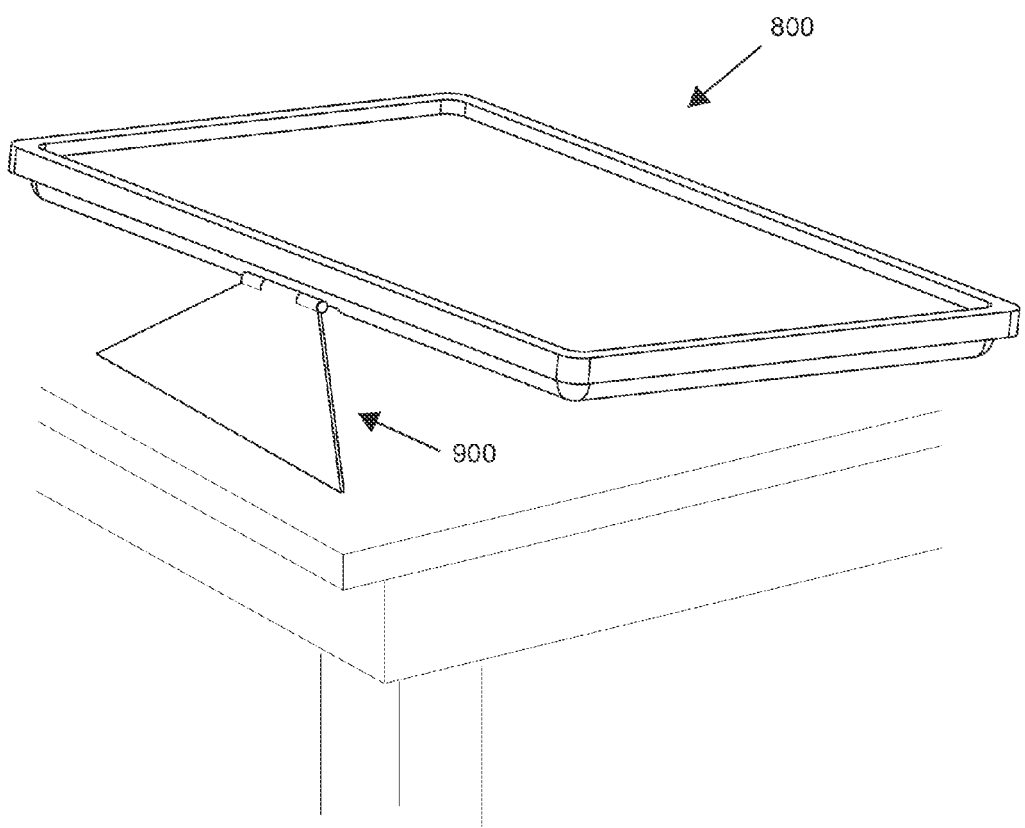
FIG. 67 illustrates a three dimensional perspective view of how the foldable detachable retracting cylinders rotation lock mechanism stand can be redeployed for a radically different viewing experience.

FIG. 67 illustrates a three dimensional perspective view of how the foldable detachable retracting cylinders rotation lock mechanism stand 900 can be redeployed for a radically different viewing experience.

Figure 68:
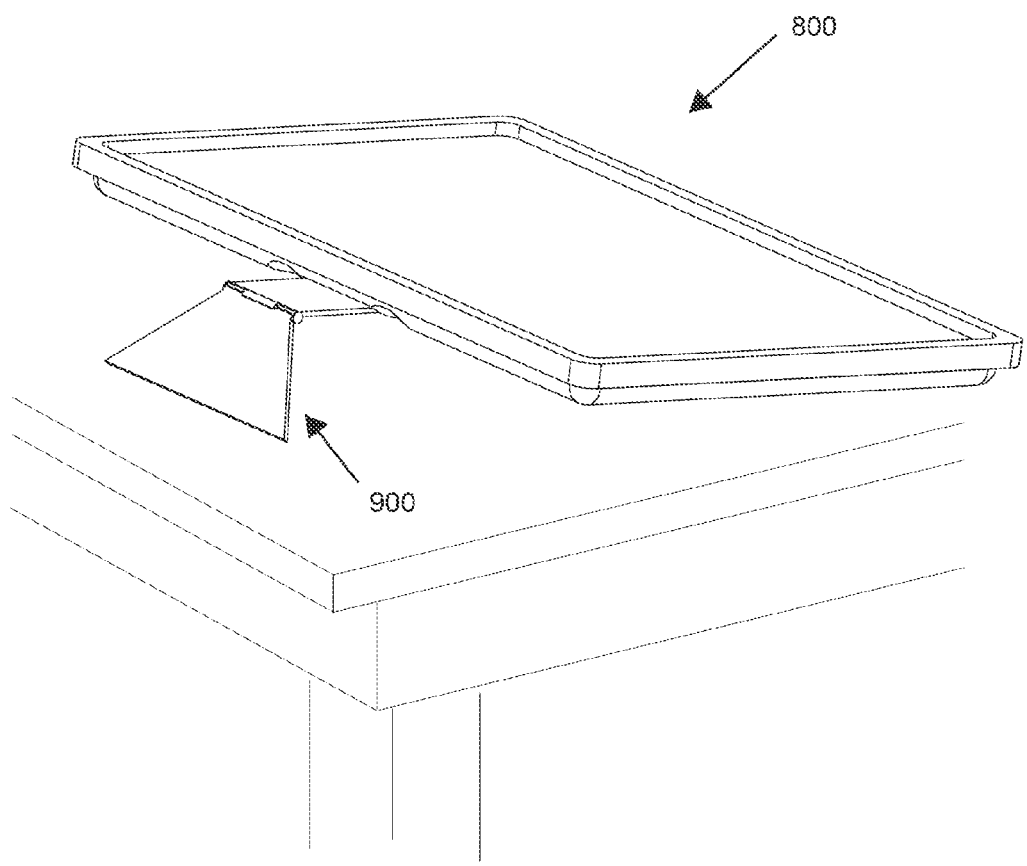
FIG. 68 illustrates a three dimensional perspective view of how the foldable detachable retracting cylinders rotation lock mechanism stand can be redeployed for yet another viewing experience.

FIG. 68 illustrates a three dimensional perspective view of how the foldable detachable retracting cylinders rotation lock mechanism stand 900 can be redeployed for yet another viewing experience.

Figure 69:
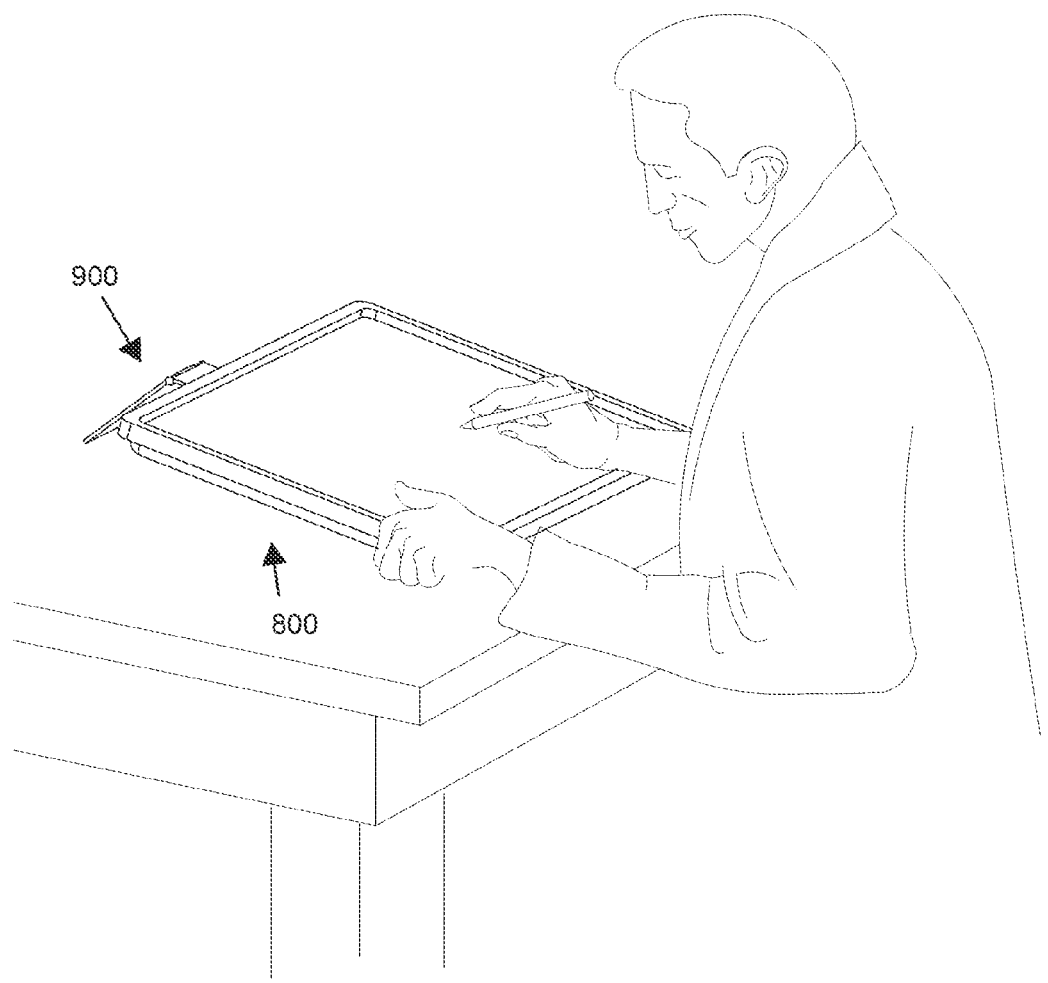
FIG. 69 show a three dimensional perspective view of a person using the deployment configuration of FIG. 68 to draw on the personal information display and input device.

FIG. 69 shows a three dimensional perspective view of a person using the deployment configuration of FIG. 68 to draw on the personal information display and input device 900.

Figure 70:
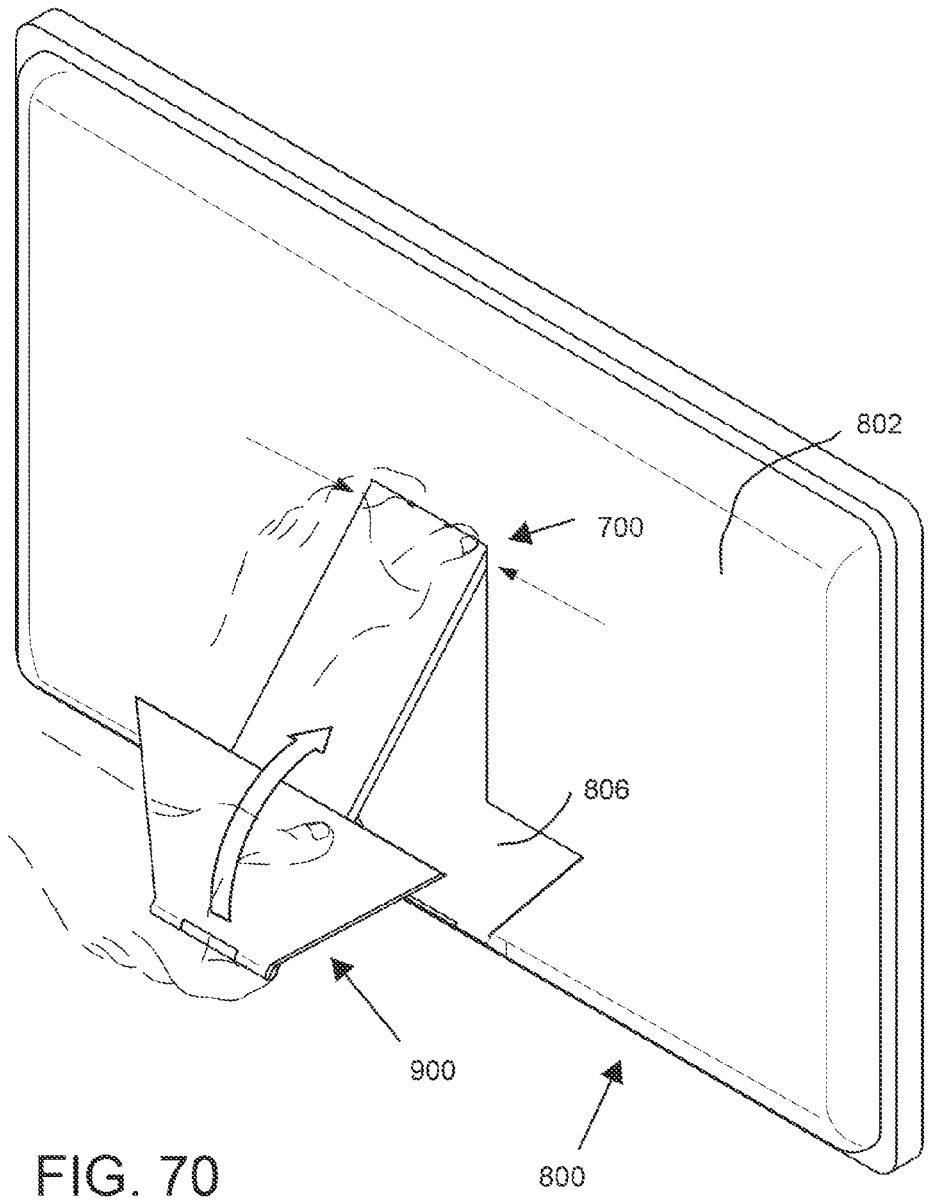
FIG. 70 illustrates a three dimensional perspective view of how the foldable detachable retracting cylinders rotation lock mechanism stand can be stowed back in the back panel of the personal information display and input device.

FIG. 70 illustrates a three dimensional perspective view of how the foldable detachable retracting cylinders rotation lock mechanism stand 900 can be stowed back in the back panel 802 of the personal information display and input device 800.

Figure 71B:
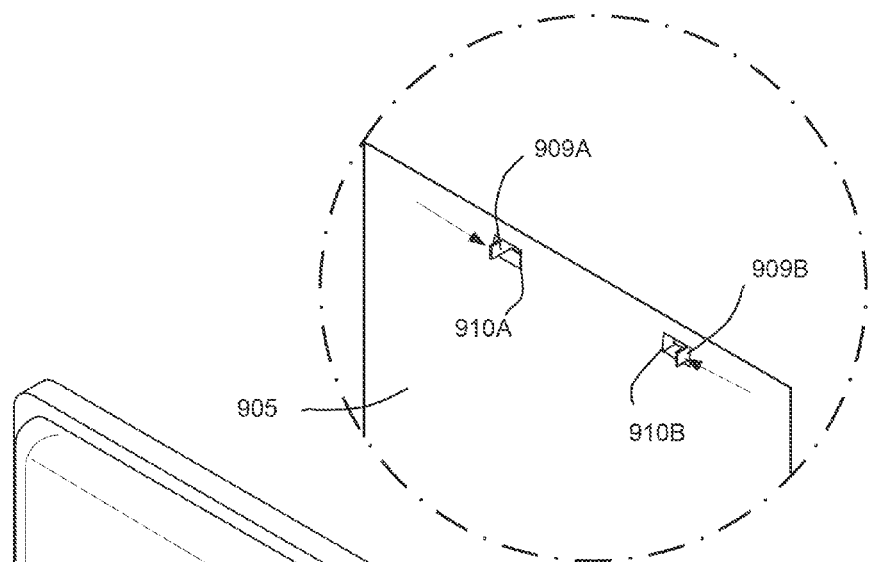
FIGS. 71A and 71B illustrate a three dimensional perspective view of how the foldable detachable retracting cylinders rotation lock mechanism stand can be fastened in the flush position in back panel of the personal information display and input device.
Figure 71A:
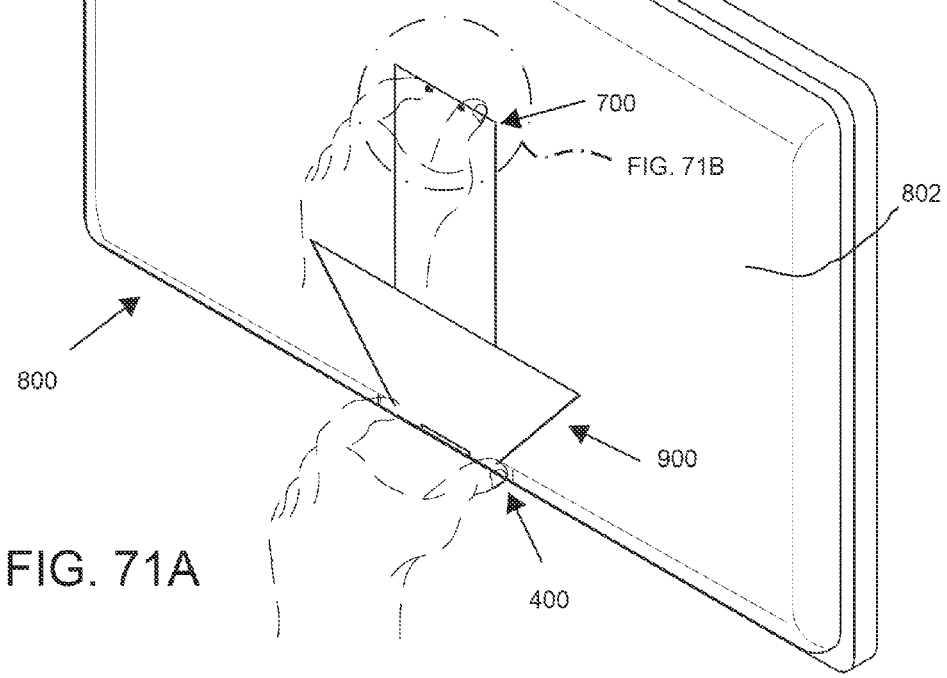

FIGS. 71A and 71B illustrate a three dimensional perspective view of how the foldable detachable retracting cylinders rotation lock mechanism stand 900 can be fastened in the flush position in back panel 802 of the personal information display and input device 800.

Figure 72:
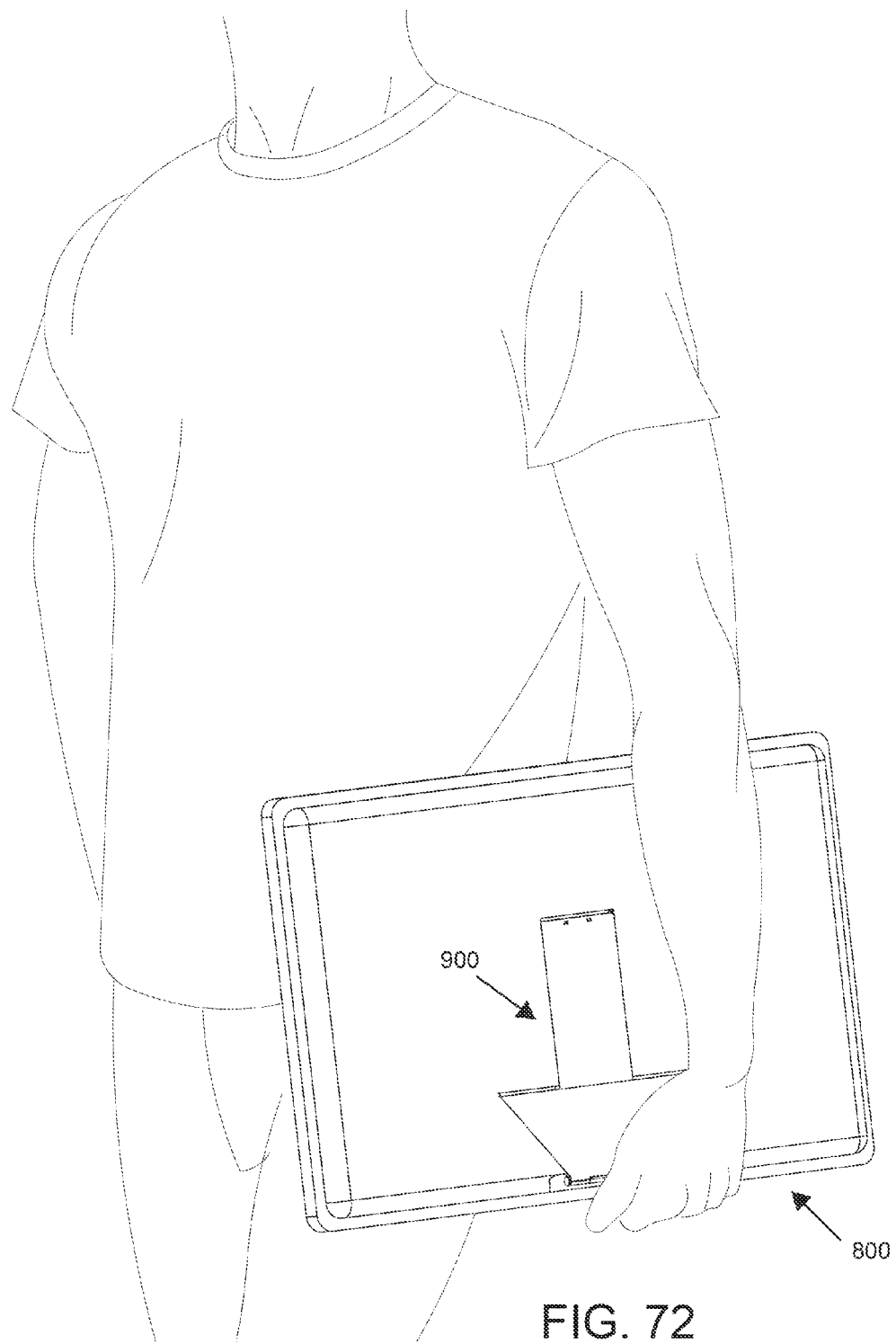
FIG. 72 show a three dimensional perspective view of a person transporting the personal information display and input device with the foldable detachable retracting cylinders rotation lock mechanism stand fully secured in the flush position in the back of the personal information display and input device.

FIG. 72 show a three dimensional perspective view of a person transporting the personal information display and input device 800 with the foldable detachable retracting cylinders rotation lock mechanism stand 900 fully secured in the flush position in the back of the personal information display and input device.

Interlocking Cylinders Rotation Lock Mechanism

Figure 73:
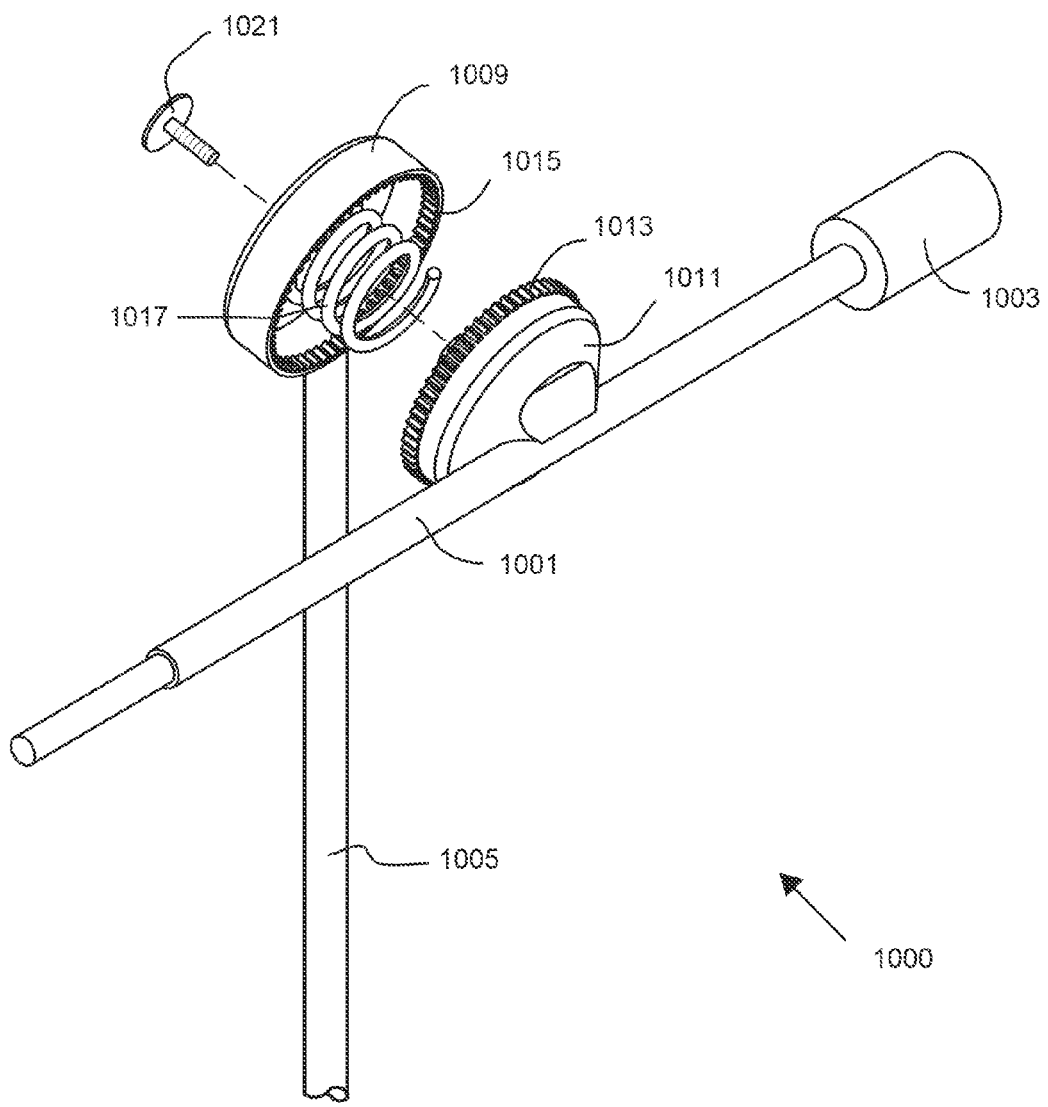
FIG. 73 illustrates a non-limiting three dimensional perspective view of an exemplary embodiment of how a non-limiting exemplary interlocking cylinders rotation lock mechanism can be used to fix the angular position of a pivoting boom which can be used to prop up a microphone, camera, flash, or personal information display and input device to various discrete angular positions.

FIG. 73 illustrates yet another example non-limiting mechanism of the concept of this invention; Interlocking Cylinders Rotation Lock Mechanism. This mechanism is based on the illustrated exemplary concept manifestation of FIGS. 21A-21C but instead of a multi-sided cylinder that is attached to a pivoting element through a connecting shaft meshing with a hollow cylindrical chamber with two chambers attached to a fixed surface where the interlocking between the multi-sided cylinder and the cylindrical chamber occurs upon first contact between the opposing cylinders and further trust of the pivoting element into the cylindrical chamber results in allowing the pivoting element to rotate freely around the axis of the cylindrical chamber; two radially concentric hollow cylinders 1009 and 1011 that can mesh radially along a narrow portion of their inner and outer surface areas 1013 and 1015 closest to the wide open end of their cylindrical chambers are positioned inversely along a common shaft and separated with a biasing spring 1017 that keeps them separated but partially overlapping and interlocked along the narrow portion of their edges 1013 and 1015. One cylinder 1009 is fastened to a fixed pole 1005 and a pivoting element 1001 is attached to the other cylinder 1011. When the cylinder 1011 that is attached to the pivoting element 1001 is thrust into cylinder 1009 which is fastened into fixed pole 1005, the interlocking cylinders further overlap and their narrow interlocking edges 1013 and 1015 disengage enabling the pivoting element 1001 to rotate freely around their common axis, but as soon as the cylinder 1011 that is attached to the pivoting element 1001 is released, the biasing spring 1017 thrusts cylinder 1011 back to its default locking position and freezes the angular position of the pivoting element 1001 with respect to the fixed pole 1005 at whatever angular position the pivoting element 1001 was in at the time the cylinder 1011 that is attached to the pivoting element 1001 was released.

The illustration of FIG. 73 also represents a non-limiting three dimensional perspective view of an exemplary embodiment of how an exemplary interlocking cylinders rotation lock mechanism floor stand 1000 can be used to fix the angular position of a pivoting boom 1001 that is connected to a counter-weight 1003 to prop up a microphone, camera, flash, or personal information display device to various discrete angular positions.

Figure 74:
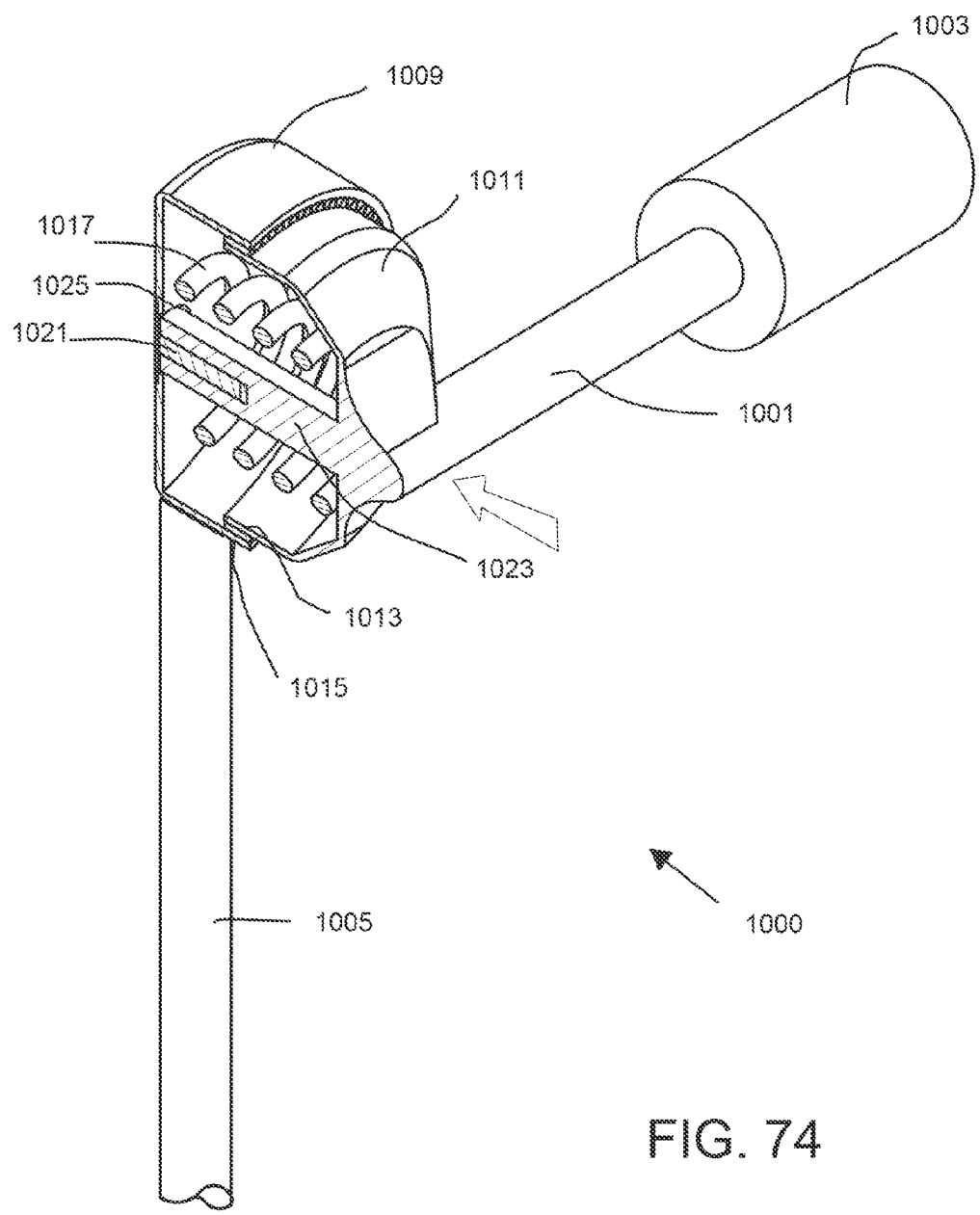
FIG. 74 illustrates a cross sectional three dimensional perspective view of a non-limiting exemplary design for an interlocking cylinders rotation lock mechanism.

FIG. 74 illustrates a cross sectional three dimensional perspective view of a non-limiting exemplary design for an interlocking cylinders rotation lock mechanism floor stand 1000 where fastening pin 1021 is inserted through hole 1025 that is drilled in the back of cylinder 1009 which is attached to fixed stand 1005 and threads into pivoting shaft 1023 which is connected to pivoting cylinder 1011 to which boom 1001 is attached in order to allow pivoting cylinder 1011 to be thrust into and to slide in and out of cylinder 1009 in order to engage and disengage interlocking edges 1013 and 1015 thereby either freezing the angular position of pivoting boom 1001 with respect to fixed stand 1005 at the time the cylinders interlock with each other or unfreezing the boom 1001 to pivot freely with respect to fixed stand 1005 when cylinders 1009 and 1011 disengage from one another.

Figure 75:
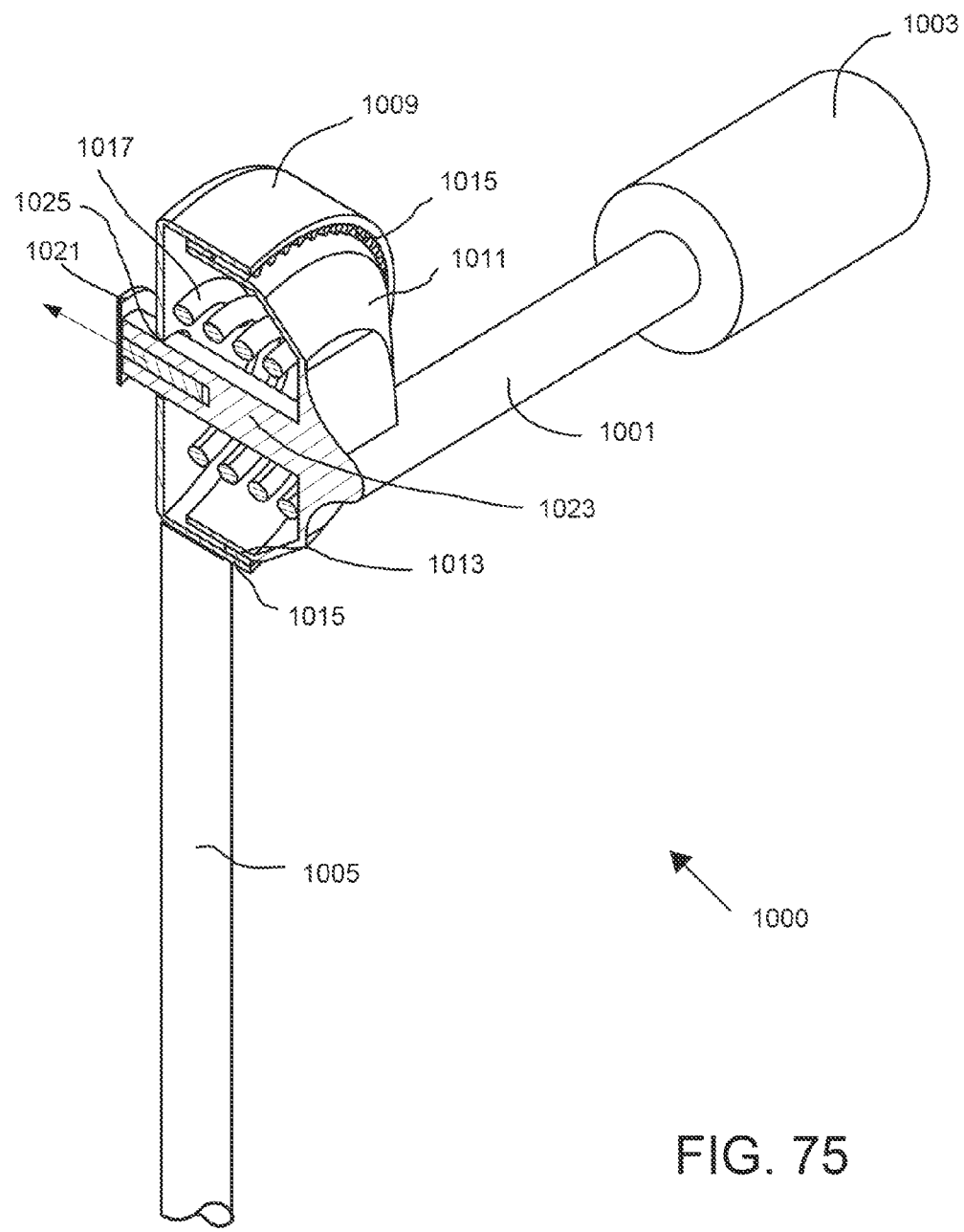
FIG. 75 illustrates a cross sectional three dimensional perspective view of how pressing one of the interlocking cylinders of FIG. 74 towards the other can disengage the cylinders from one another and allow the pressed cylinder to pivot freely around the corresponding stationary cylinder.

FIG. 75 illustrates a cross sectional three dimensional perspective view of how pressing pivoting cylinder 1011 into fixed cylinder 1009 thrusts shaft 1023 partially out of fixed cylinder 1009 allowing interlocking edges 1013 and 1015 of cylinders 1011 and 1009 to disengage from one another thereby freeing cylinder 1011 and its attached boom 1001 to rotate freely around fixed cylinder 1009.

Figure 76:
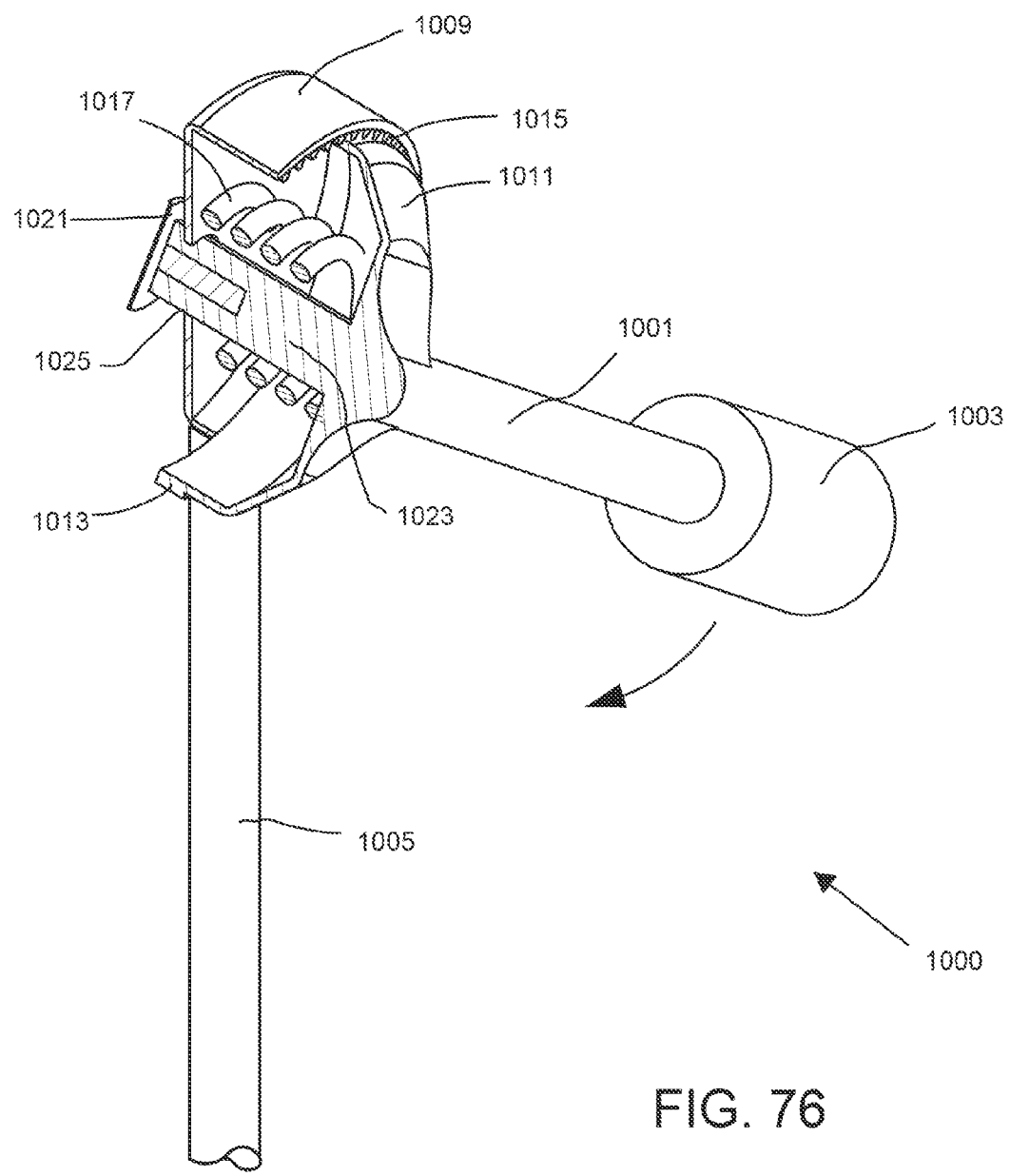
FIG. 76 illustrates a cross sectional three dimensional perspective view of the interlocking cylinders rotation lock mechanism with the boom being set to a new angular position while the pivoting cylinder in being pressed against the corresponding stationary cylinder.

FIG. 76 illustrates a cross sectional three dimensional perspective view of pivoting boom 1001 having rotated to a new angular position while pivoting cylinder 1011 is being pressed against fixed cylinder 1009 and locking edges 1013 and 1015 disengaged from one another while shaft 1023 is partially thrust out of cylinder 1009.

Figure 77:
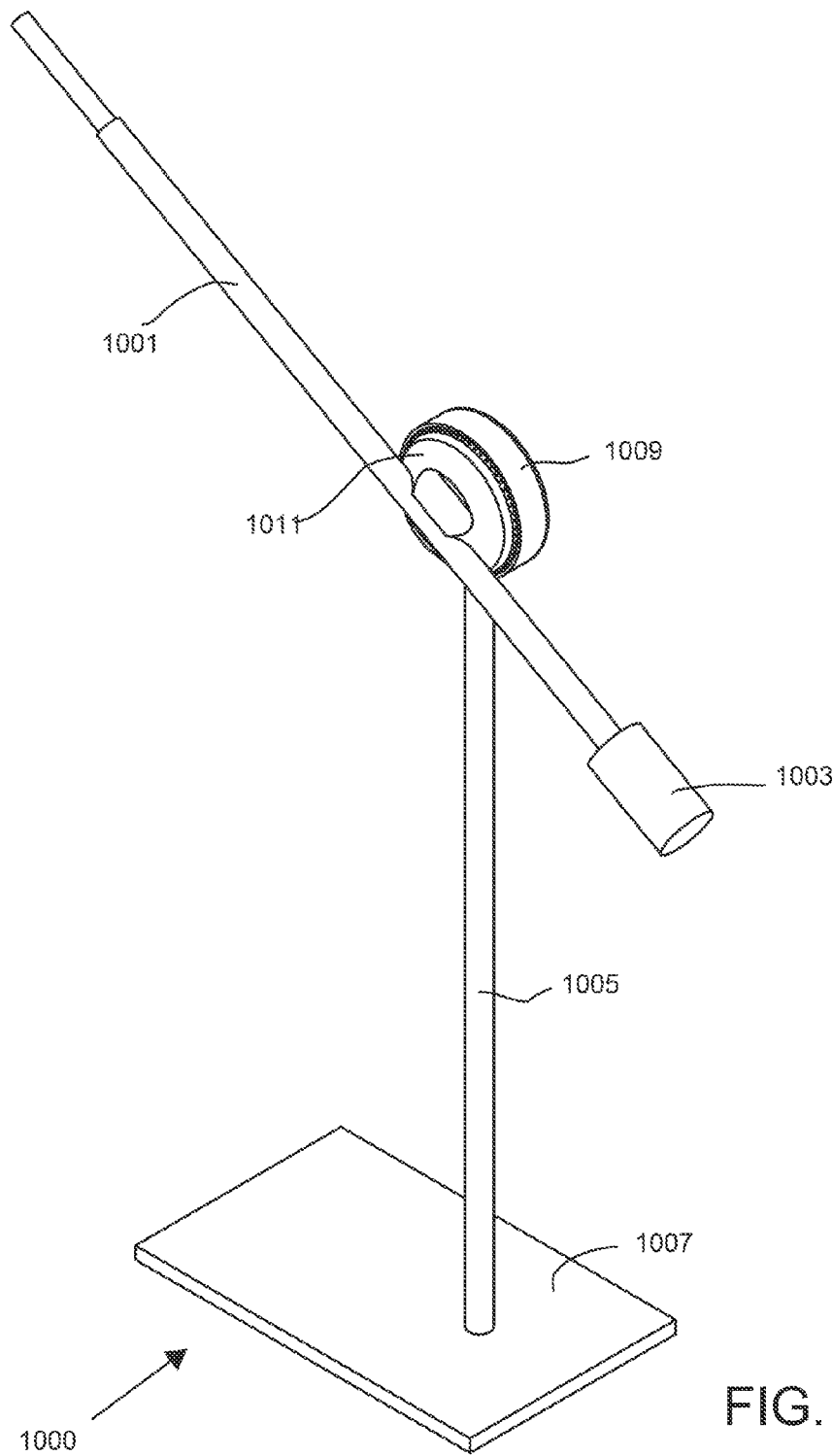
FIG. 77 illustrates a three dimensional perspective view of the boom in a new angular position after the pivoting cylinder has been released and the cylinders re-engaged (interlocked) with one another.

FIG. 77 illustrates a three dimensional perspective view of the boom 1001 in a new angular position after pivoting cylinder 1011 has been released and biasing spring 1017 had thrust cylinder 1011 back to its default locking position which froze the angular position of pivoting boom 1001 with respect to fixed pole 1005 at whatever angular position pivoting element 1001 was in at the time cylinder 1011 that is attached to pivoting boom 1001 was released.

While exemplary embodiments of the present inventions are disclosed herein, it should be understood that modifications, substitutions and alternatives may be apparent to one of ordinary skill in the art and can be made without departing from the scope of this disclosure. This disclosure is intended to cover any adaptations or variations of the exemplary embodiments. In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise.

I claim:

1. A hinge or clamp assembly comprising:
   a first plate or arm including a slot and outer cylindrical bores on opposite sides of the slot, wherein the outer cylindrical bores are coaxial;
   a second plate or arm seated in the slot of the first plate or arm and the second plate or arm comprising a middle cylindrical bore coaxial with the outer cylindrical bores, wherein the middle cylindrical bore has a first end facing an end of one of the outer cylindrical bores and an opposite end facing another end of the outer cylindrical bores such that the middle cylindrical bore does not extend into the outer cylindrical bores, and wherein the second plate or arm moves rotationally relative to the first plate or arm about a longitudinal axis defined by the outer and middle cylindrical bores;

a hinge shaft comprising a locking region with faceted sides, ridges, or teeth on an outer circumference of one end of the hinge shaft and a contiguous non-locking region that is smooth and cylindrical in shape spanning the remainder of the hinge shaft, wherein the hinge shaft is shorter in length than the combined length of the outer and middle cylindrical bores, is seated inside the outer and middle cylindrical bores, extends through the outer and middle cylindrical bores, and moves axially along the longitudinal axis of the outer and middle cylindrical bores;

a first engagement cylindrical cavity with faceted, ridged, or toothed internal side walls located within one of the outer cylindrical bores, wherein the faceted, ridged, or toothed internal side walls of the first engagement cylindrical cavity are configured to receive and interlock with the faceted sides, ridges, or teeth of the locking region of the hinge shaft;

a second engagement cylindrical cavity located within the middle cylindrical bore and adjacent the first engagement cylindrical cavity, wherein the complementary second engagement cylindrical cavity includes faceted, ridged, or toothed internal side walls and is configured to receive and interlock with the faceted sides, ridges, or teeth of the locking region of the hinge shaft;

wherein the hinge shaft has an unlocked position where the locking region of the hinge shaft is positioned entirely inside the first engagement cylindrical cavity and does not extend into the second engagement cylindrical cavity, wherein, while the hinge shaft is in the unlocked position, the middle cylindrical bore and the second plate or arm are free to rotate relative to the outer cylindrical bores and the first plate or arm, and wherein the hinge shaft has a locked position where the locking region of the hinge shaft extends into both the first and second engagement cylindrical cavities and, while the hinge shaft is in the locked position, the middle cylindrical bore and the second plate or arm are prevented by the hinge shaft from rotation relative to the outer cylindrical bores and the first plate or arm, and a release post is coupled to the hinge shaft and is configured to be pushed or pulled to axially displace the hinge shaft between the locked and unlocked axial positions.

2. The hinge or clamp assembly of claim 1 further comprising a biasing mechanism that urges the hinge shaft axially along the longitudinal axis of the bores and into the locked position.

3. The hinge or clamp of claim 2 further comprising a second biasing mechanism that urges the first plate or arm and the second plate or arm to move away from each other into a default angular position.

4. The hinge or clamp assembly of claim 3, wherein the second biasing mechanism is a spring.

5. The hinge or clamp assembly of claim 3, wherein the second biasing mechanism is a coil spring.

6. The hinge or clamp of claim 1 wherein the locking region includes a locking segment fixed to the shaft.

7. A casing for an electronic device comprising:
a back wall including a slot and outer bores on opposite sides of the slot, wherein the outer cylindrical bores are coaxial;
a plate or arm seated in the slot of the back wall, wherein the plate or arm includes side edges each facing a respective wall of the slot;
a middle bore extending through the plate or arm and having end openings in each of the side edges of the plate or arm, wherein the middle bore is coaxial with the outer cylindrical bores along an axis and does not extend into either of the outer cylindrical bores;
a first locking cavity within one of the outer cylindrical bore and having an open end at one of the walls of the slot, wherein the first locking cavity has sidewalls with facets, ridges or teeth;
a second locking cavity in the middle bore and having an open end at one of the side edges of the plate or arm, wherein the second locking cavity has facets, ridges or teeth, wherein the second locking cavity is adjacent to the first locking cavity along the axis;
a shaft within and coaxial with the outer and middle bores, wherein a length of the shaft is less than a combined length of the outer and middle bores such that the shaft may be displaced along the axis while within the outer and middle bores;
a locking segment fixed to the shaft wherein an outer surface of the locking segment includes facets, ridges or teeth which are complementary to the facets, ridges or teeth of the first and second locking cavities;
wherein the shaft has an unlocked position in which the locking segment is within the first locking cavity and does not extend into the second locking cavity, and while the shaft is in the unlocked position the plate or arm is free to pivot with respect to the back wall;
wherein the shaft has a locked position in which the locking segment extends into the first and second locking cavities and the facets, ridges or teeth of the locking segment engage the facets, ridges or teeth of the first and second locking cavities, and
a release post coupled to the shaft and configured to be manually displaced to move the shaft between the locked and unlocked positions.

* * * * *